United States Patent [19]

Binoeder et al.

[11] Patent Number: 4,620,302

[45] Date of Patent: Oct. 28, 1986

[54] PROGRAMMABLE DIGITAL SIGNAL TESTING SYSTEM

[75] Inventors: Peter P. Binoeder, Tustin; James B. Whitacre, Westminster; Don Kunker, San Juan Capistrano, all of Calif.

[73] Assignee: Burroughs Corporation, Detroit, Mich.

[21] Appl. No.: 568,834

[22] Filed: Jan. 6, 1984

[51] Int. Cl.$^4$ ............................................. G06F 11/00
[52] U.S. Cl. ............................................. 371/1; 371/25; 324/73 R
[58] Field of Search ............................... 371/1, 20, 25; 324/73 R, 73 AT; 364/900, 200

[56] References Cited

U.S. PATENT DOCUMENTS

| | | | |
|---|---|---|---|
| Re. 31,056 | 10/1982 | Chau et al. | 371/1 |
| 3,976,940 | 8/1976 | Chau et al. | 371/1 |
| 4,092,589 | 5/1978 | Chau et al. | 371/1 |
| 4,122,995 | 10/1978 | Franke | 371/1 |
| 4,139,147 | 2/1979 | Franke | 371/1 |
| 4,347,608 | 8/1982 | Appiano et al. | 371/25 |
| 4,369,511 | 1/1983 | Kimura et al. | 371/25 |
| 4,488,297 | 12/1984 | Vaid | 371/1 |
| 4,490,821 | 12/1984 | Lacher | 371/1 |
| 4,503,536 | 3/1985 | Panzer | 371/25 |
| 4,519,077 | 5/1985 | Amin | 371/25 |

*Primary Examiner*—Michael R. Fleming
*Attorney, Agent, or Firm*—Alfred W. Kozak; Nathan Cass; Kevin R. Peterson

[57] ABSTRACT

A programmatic comparator digital testing system is disclosed which cooperates with a host computer driver system and output display panel in order to permit the testing of any given type of standard reference digital electronic module with another electronic module to be tested. Multiple numbers of output signals from the standard reference module can be compared to their analogous output signals from the module to be tested in order to find out of tolerance differences between comparable digital signals which can then be flagged as errors and analyzed by the driver host computer 100 through its display terminal 7.

3 Claims, 32 Drawing Figures

DATA COMPARATOR 500

ADJUSTABLE SKEW COMPARE CIRCUIT

0 = ALLOWABLE SKEW
1 = NON-ALLOWABLE = (ERROR SIGNAL)

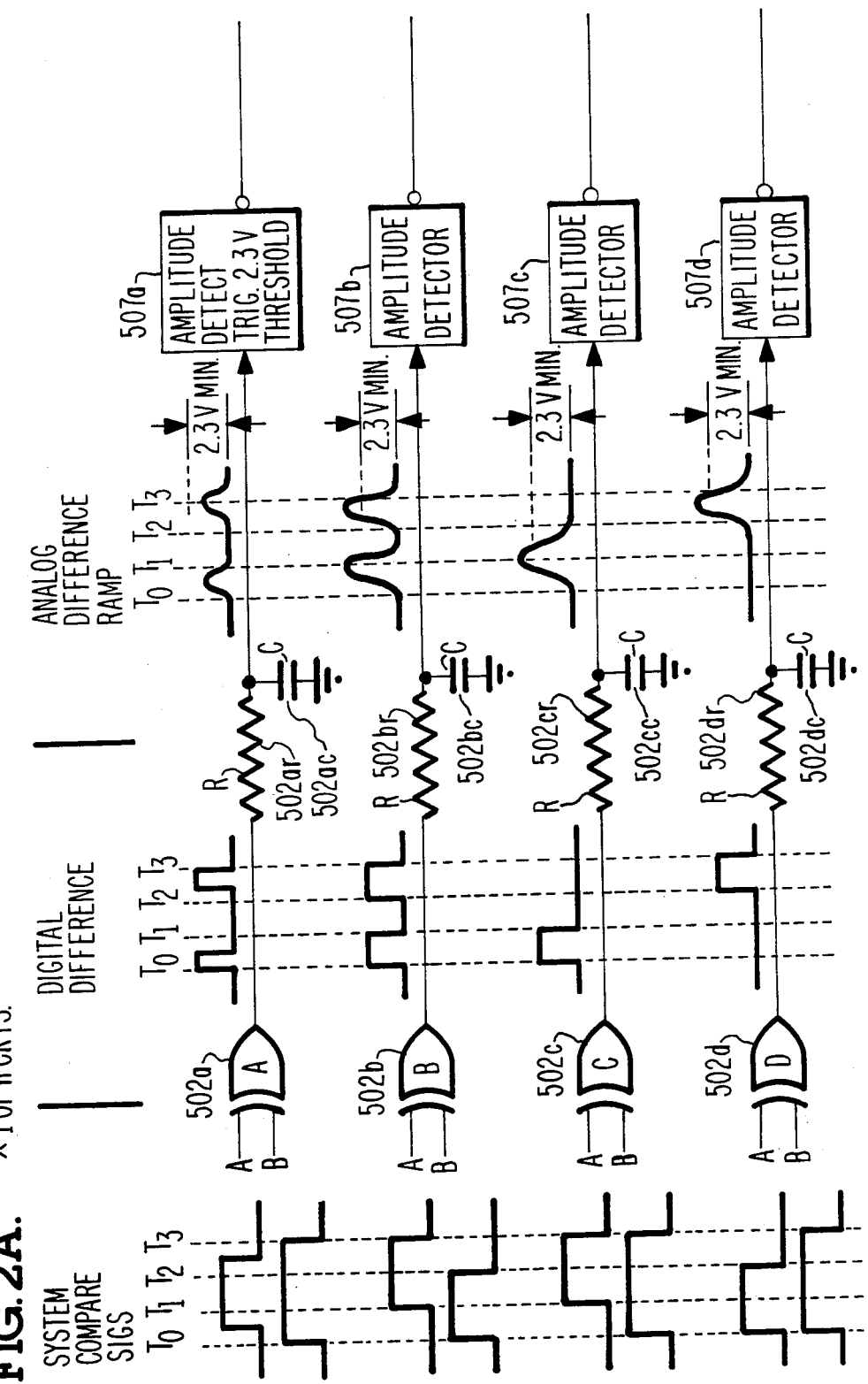

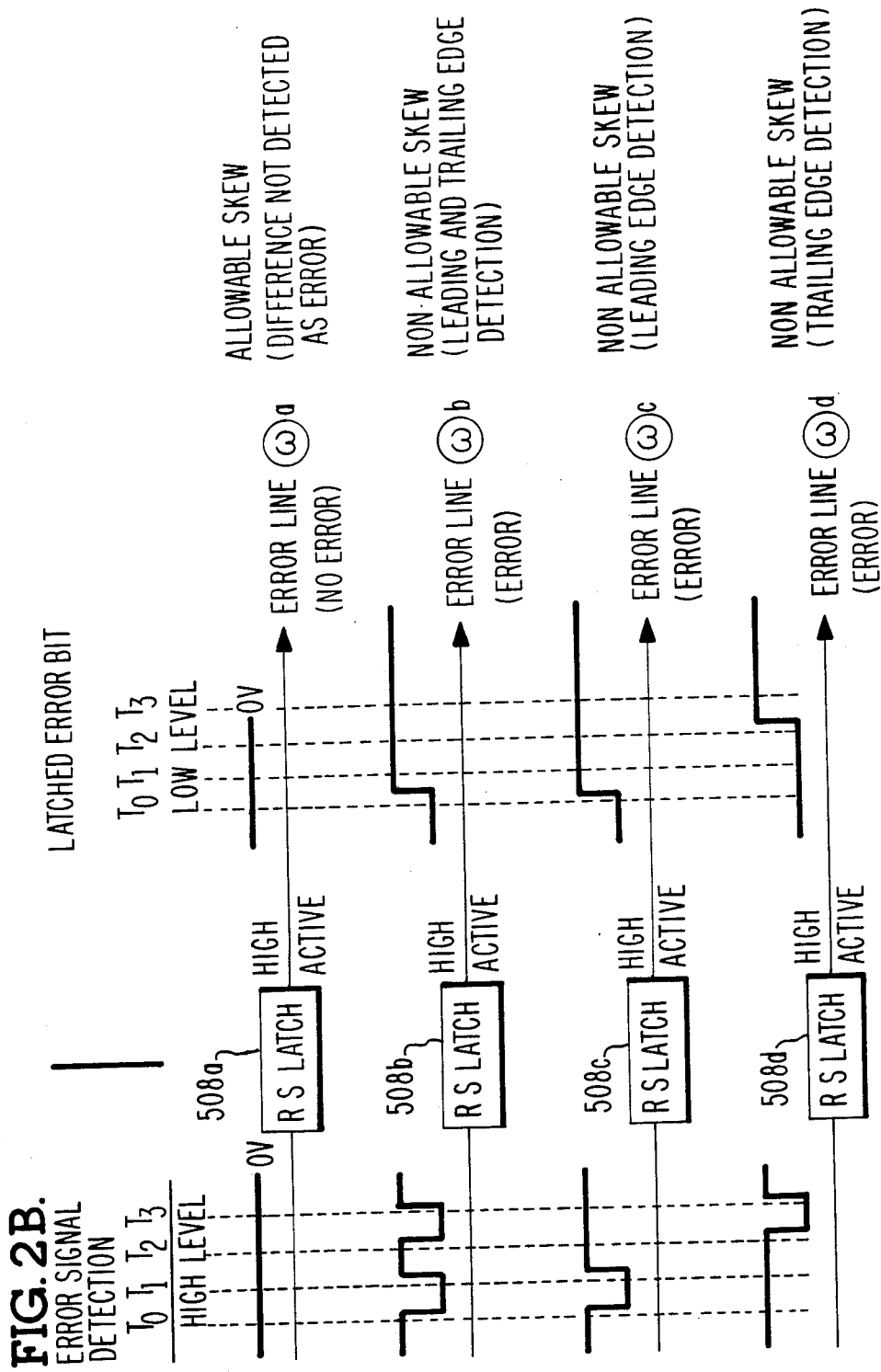

FIG. 4. COMPARE CARD SELECTION (IS IBUS 19:4 DECODED)

FIG. 5. PROGRAMMABLE COMPARATOR SYSTEM.

BASIC BLOCK DIAGRAM TEST SYSTEM.

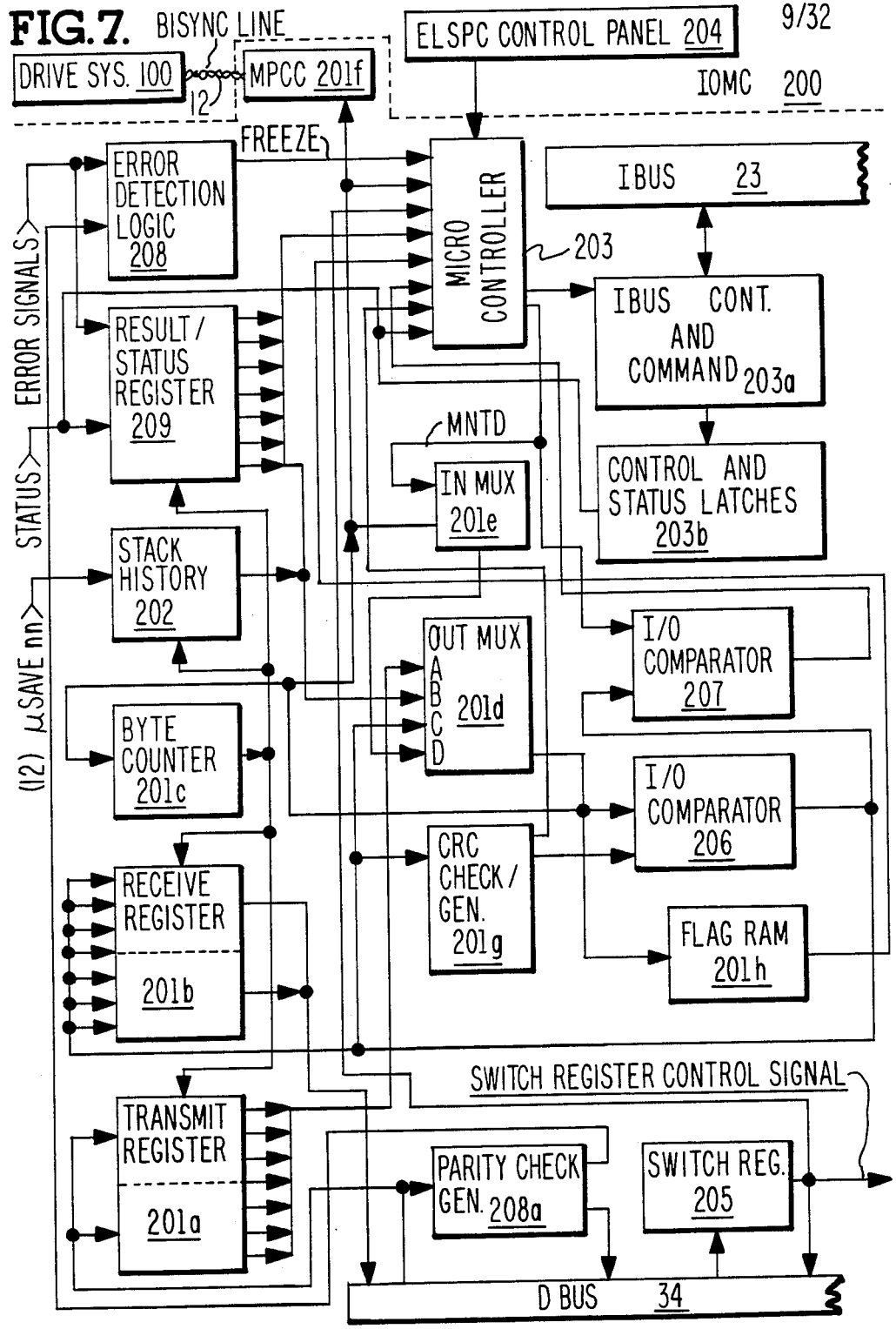

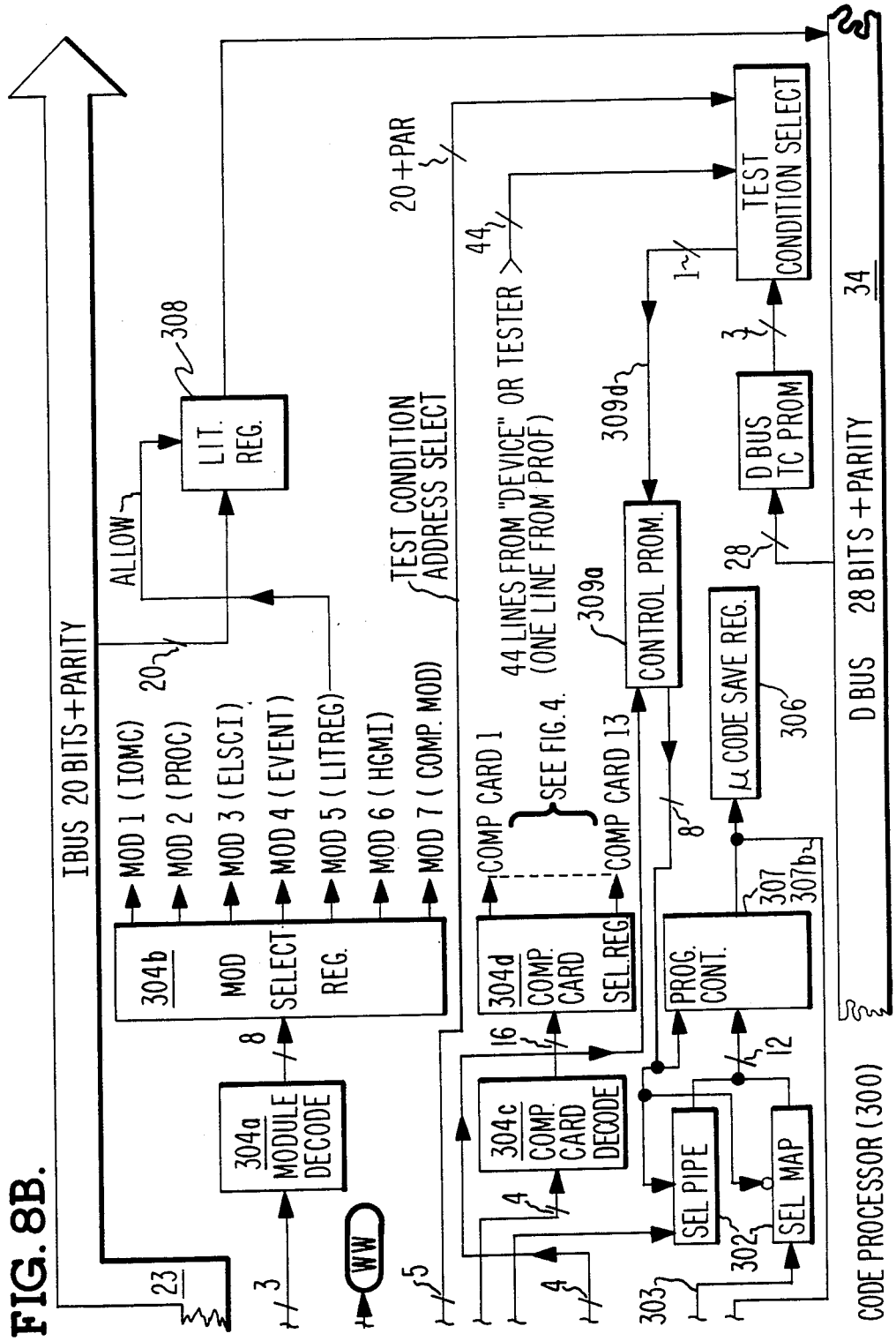

FIG. 9B. EVENT CONTROL
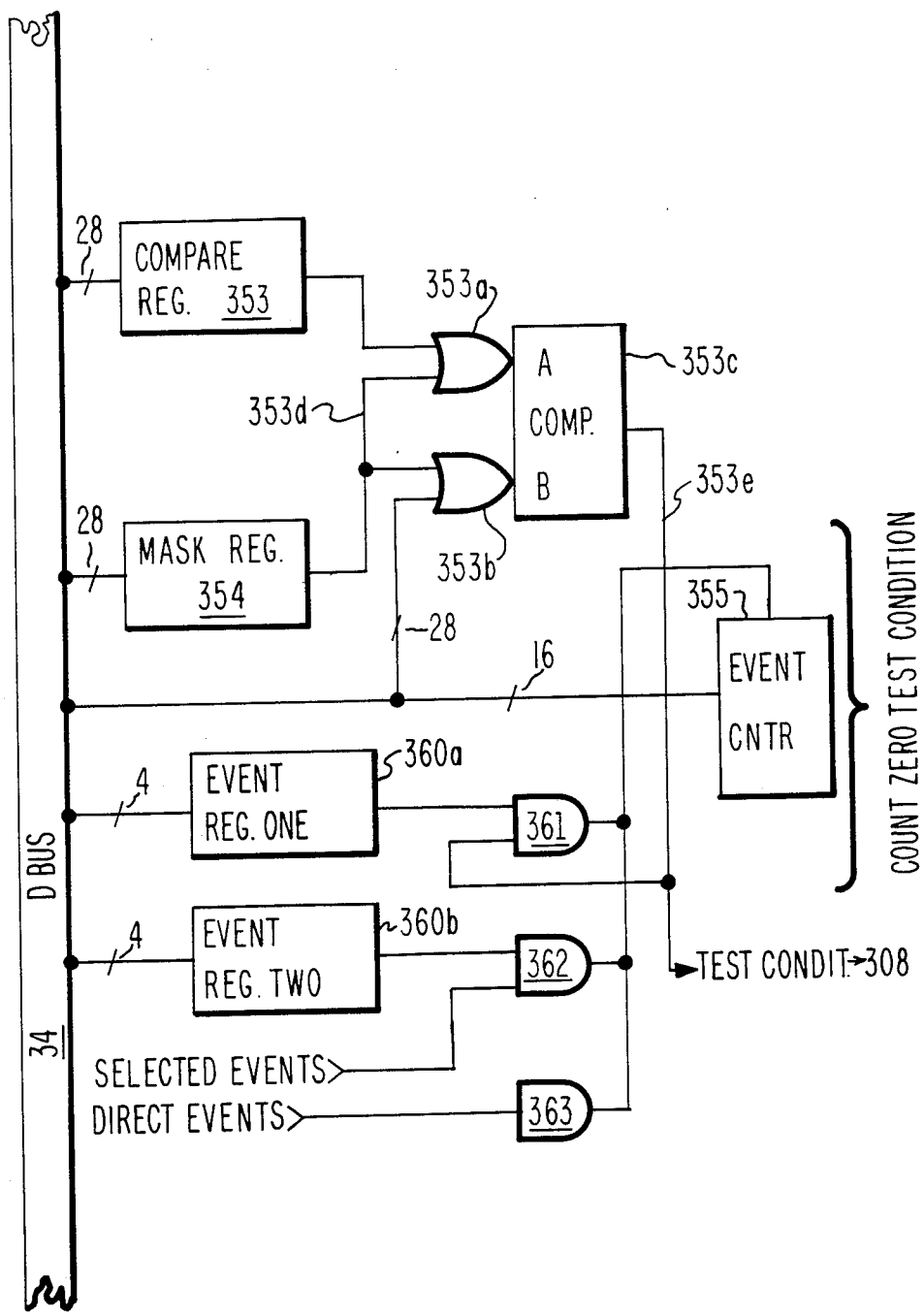

BASIC BLOCK
CLOCK CARD

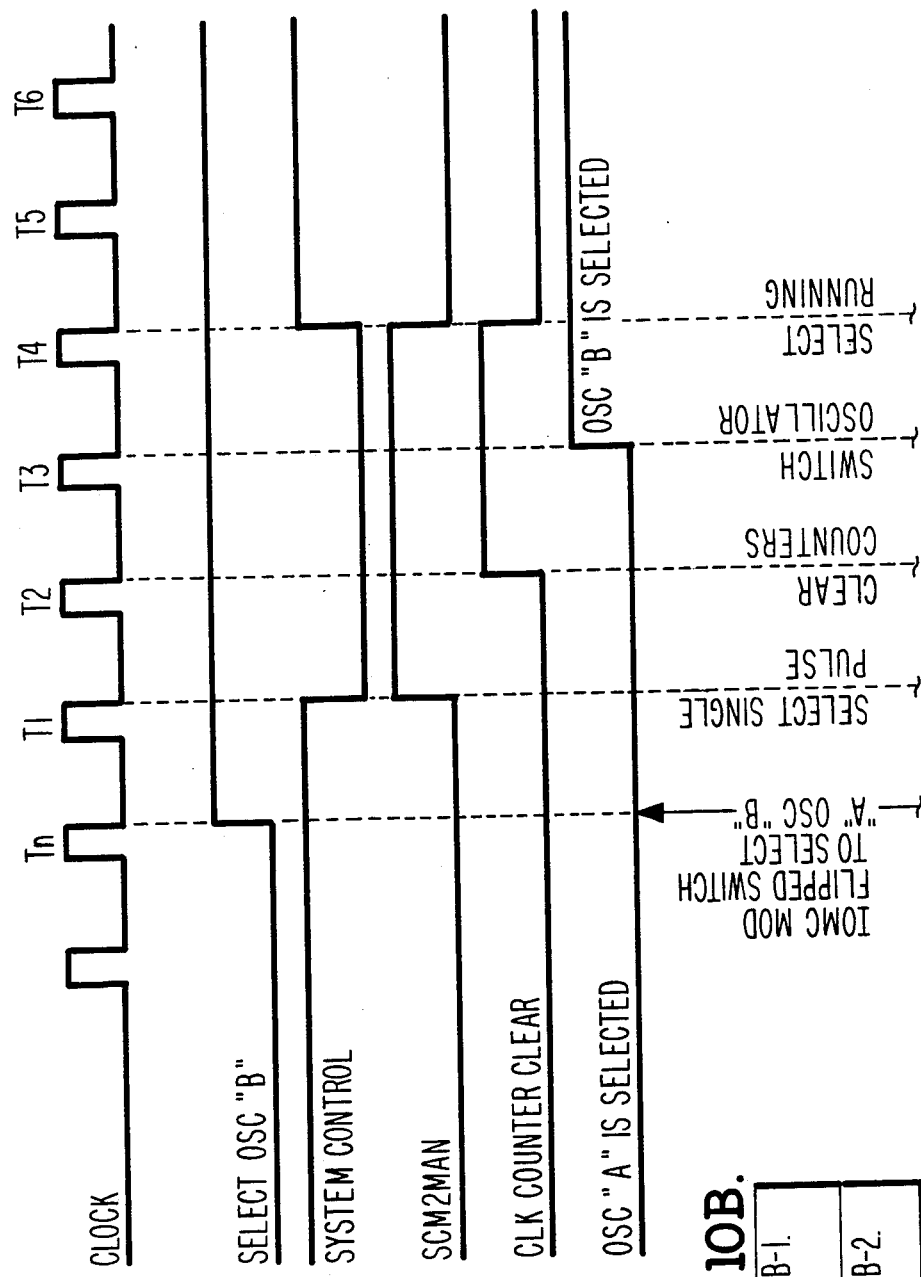
FIG.10B-1. OSC SWITCH TIMING.
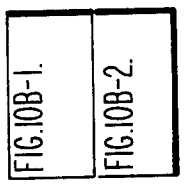
FIG.10B.
| FIG.10B-1. | FIG.10B-2. |

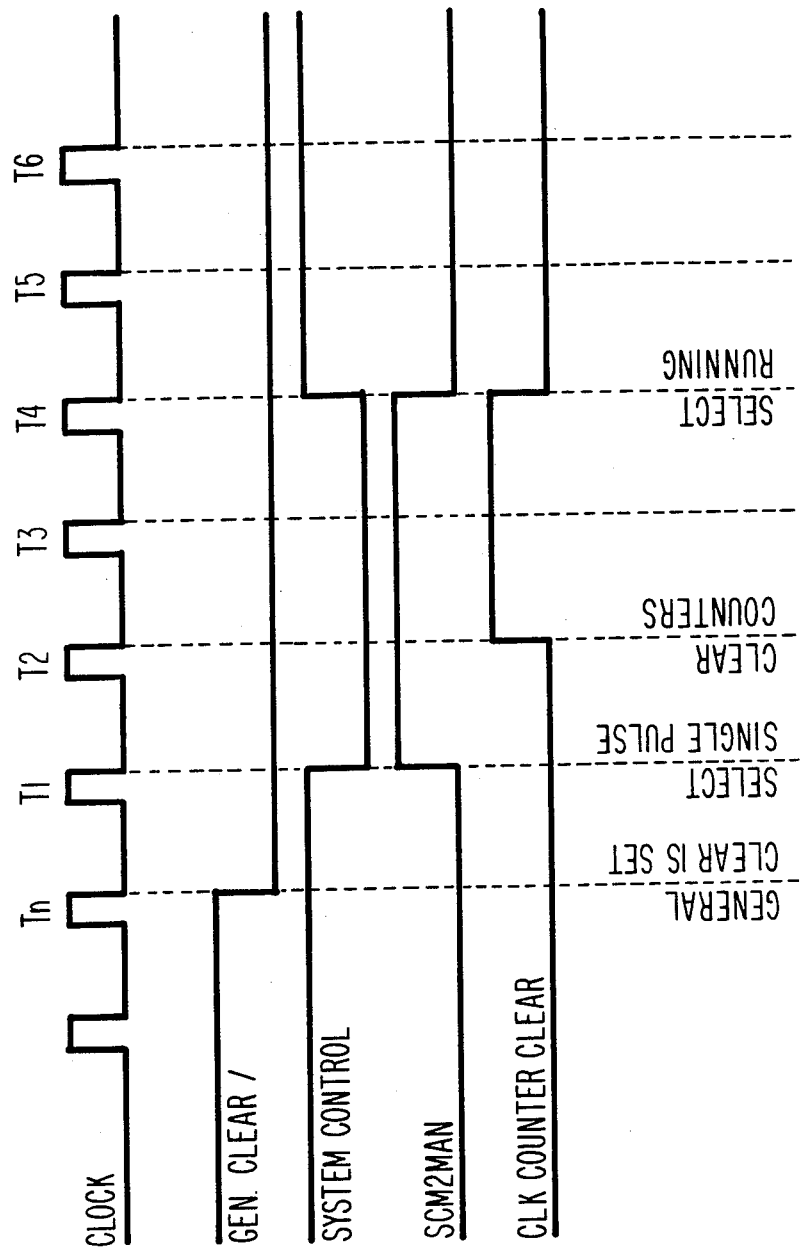
FIG.10C. GENERAL CLEAR SWITCH TIMING.

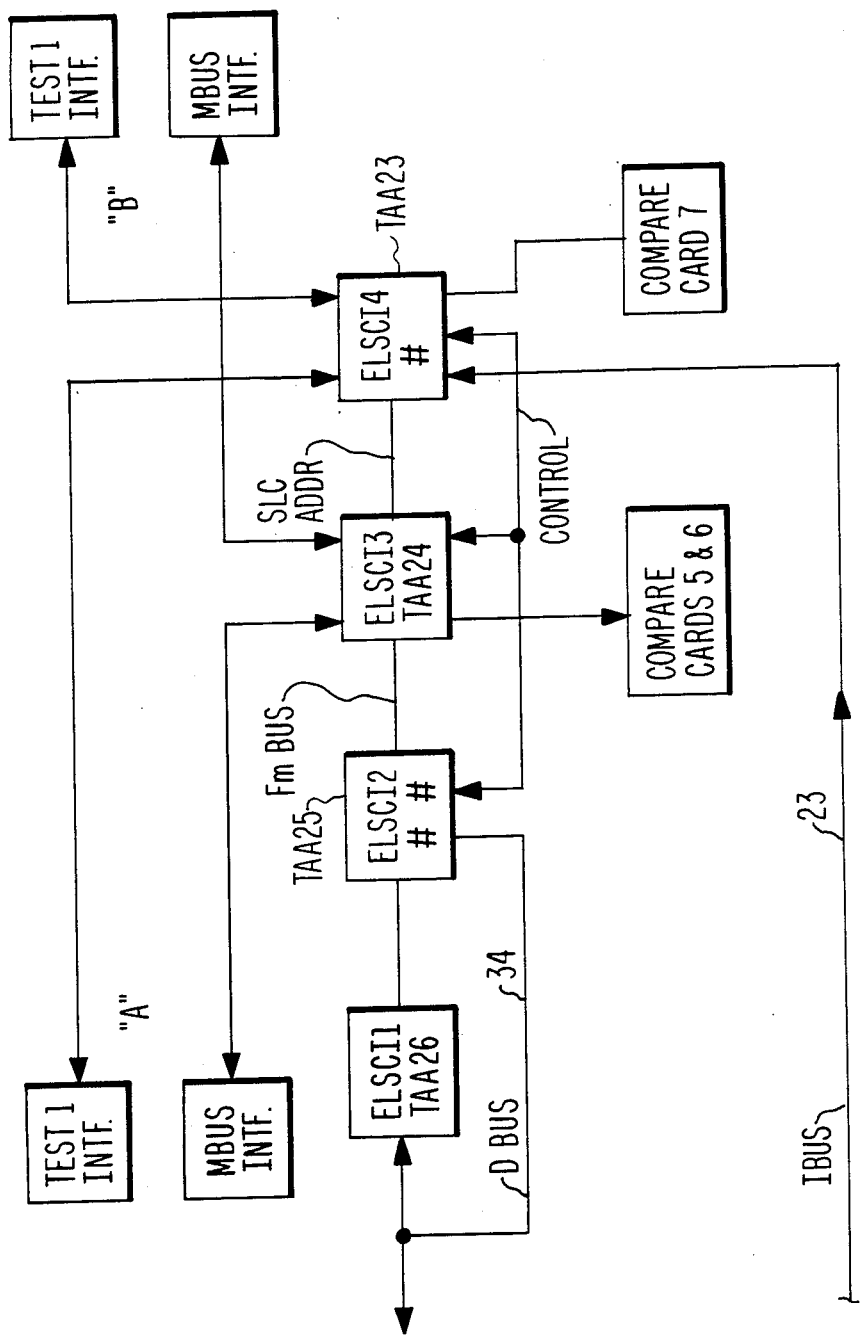
FIG.11A.  ELSCIMOD OVERVIEW.

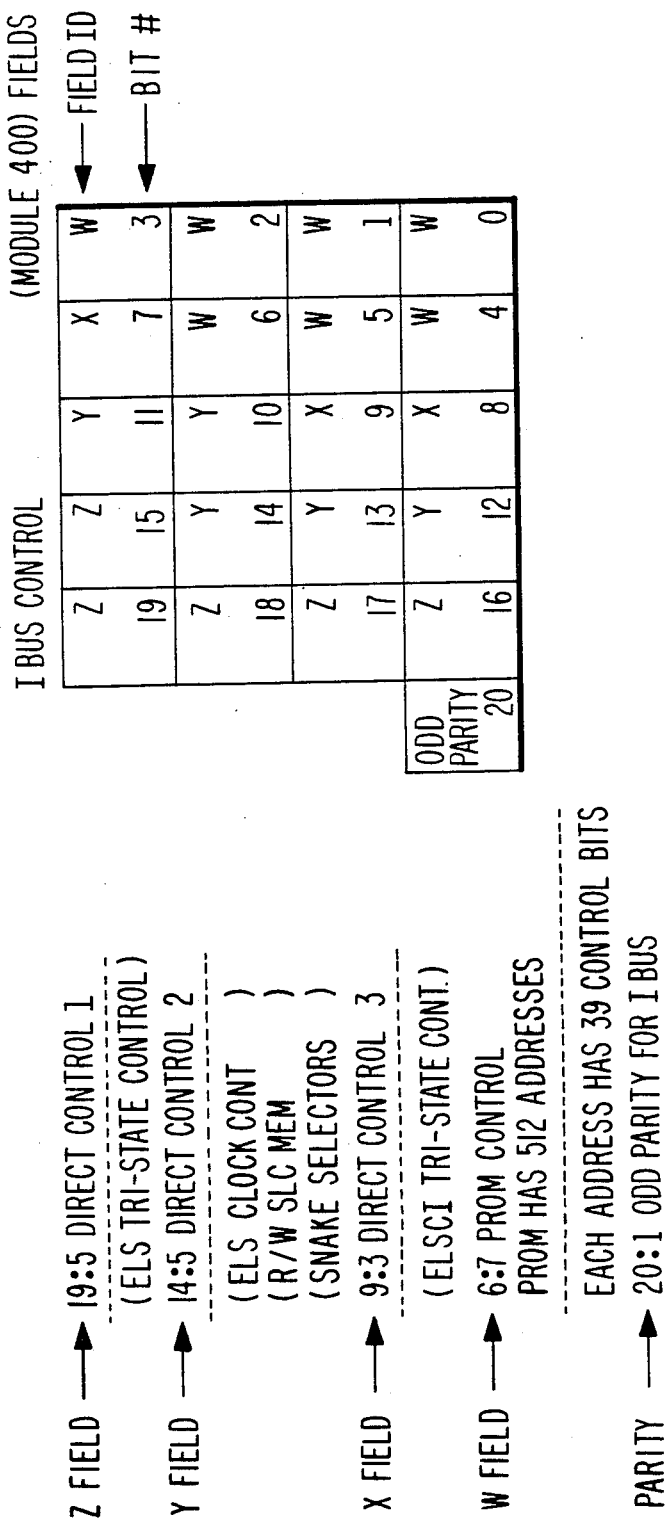
FIG. 11B. ELS I BUS CONTROL.

ELMOD DATA FLOW.

GENERATOR FUNCTION

| S0 | S1 | 16 | 20 | |
|----|----|----|----|---|
| 0 | 0 | X | X | DO NOTHING |
| 1 | 1 | X | X | LOAD SHIFT REGISTER |
| 1 | 0 | 0 | 0 | SHIFT CONTENTS FROM BIT 0—19 |
| 1 | 0 | 1 | 0 | GENERATE 4K RANDOM ADD. PATTERN |
| 1 | 0 | 0 | 1 | GENERATE 65K RANDOM ADD. PATTERN |
| 1 | 0 | 1 | 1 | GENERATE 1 MEG. RANDOM ADD. PATTERN |

SNAKE DATA TO ELS "A" OR "B"

SNAKE DATA PATH.

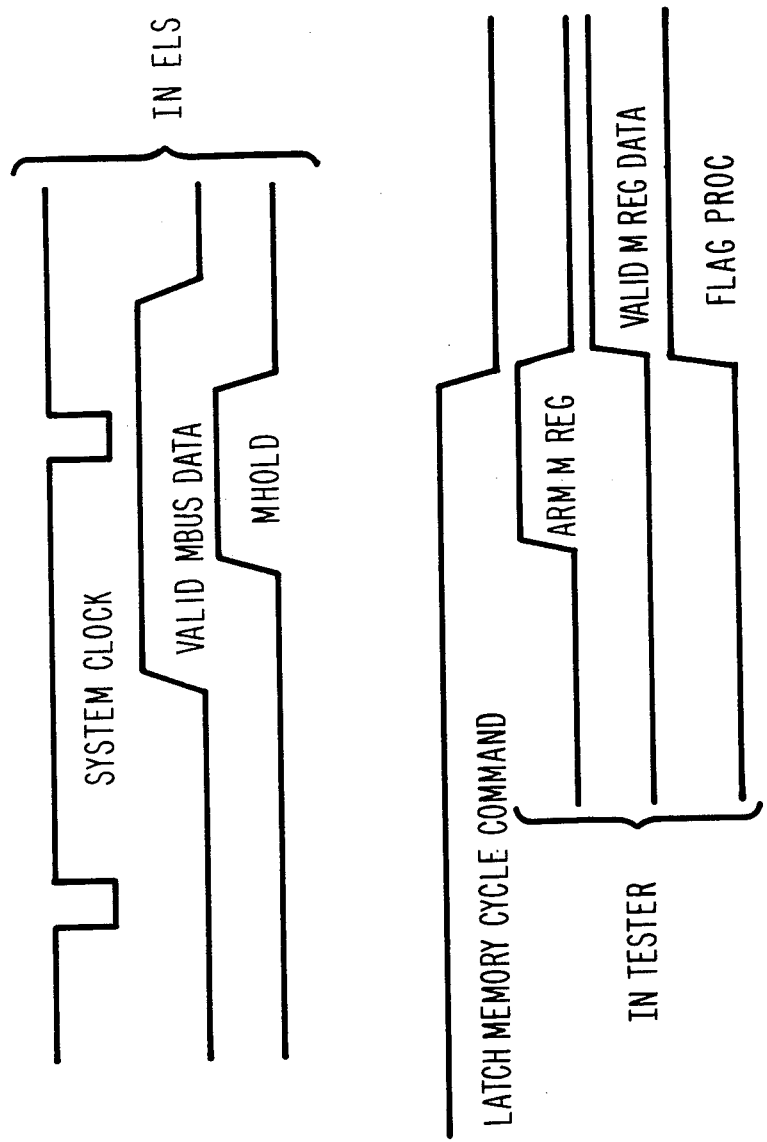
FIG. 11G. LATCH ELS MEMORY CYCLE IN TESTER.

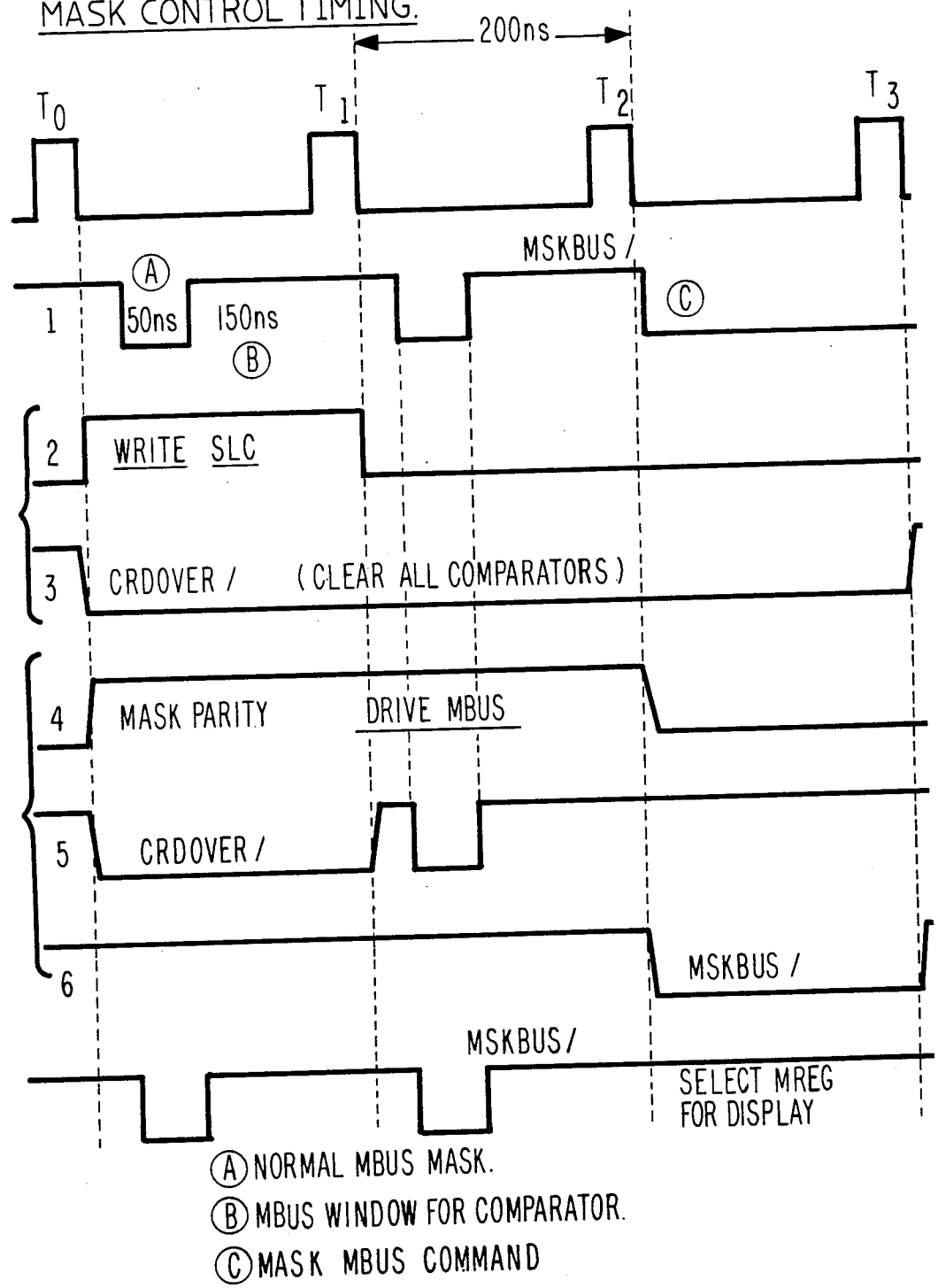
FIG. 11I. MASK CONTROL TIMING.

TO BLOCK 4

*[ TECH = OPERATOR-TECHNICIAN ]

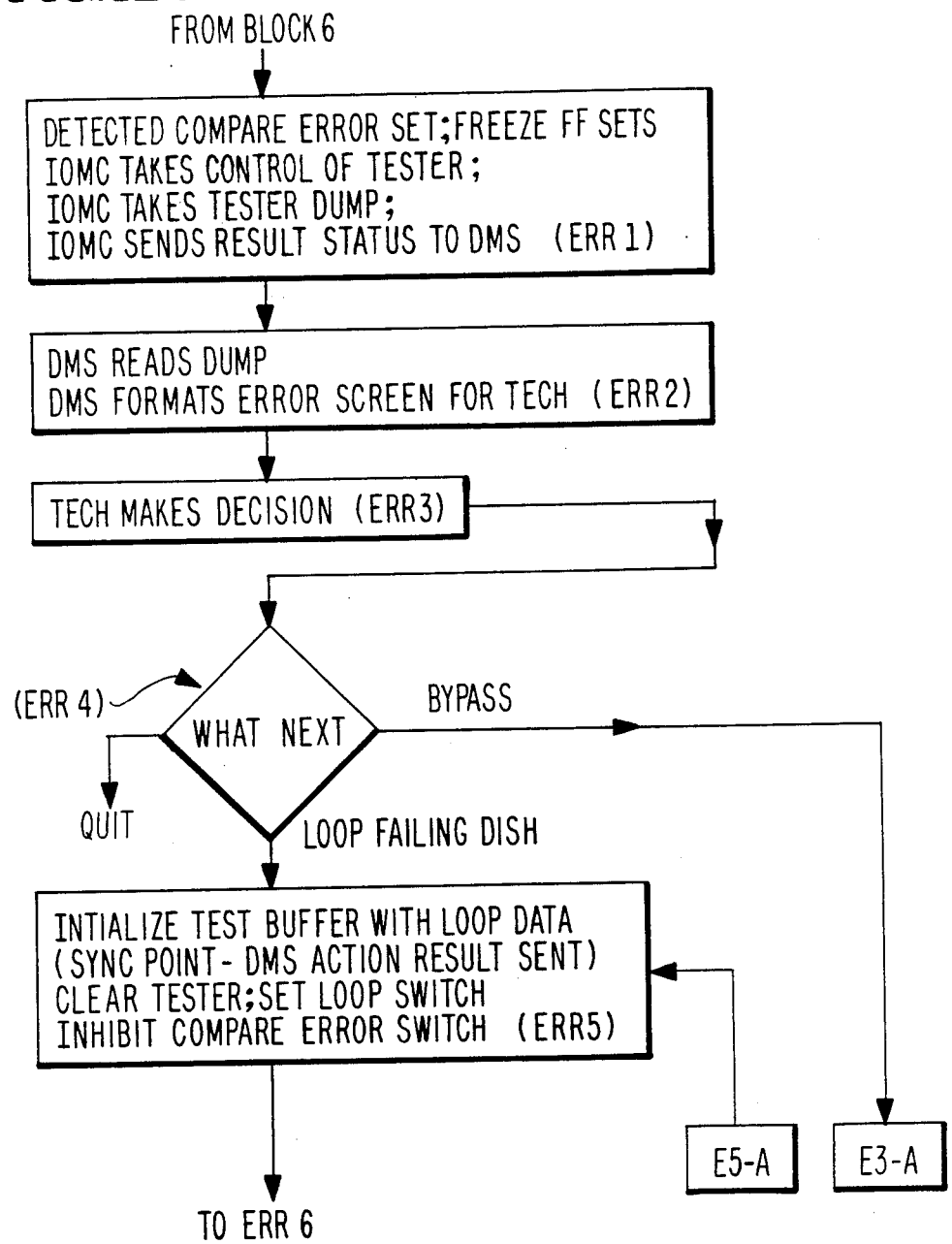

PROGRAMMABLE DIGITAL SIGNAL TESTING SYSTEM

FIELD OF THE INVENTION

This disclosure relates to testing and diagnostic apparatus for checking electronic modules having digital signal operations wherein a module-to-be-tested is compared against a standard reference module.

CROSS REFERENCES TO RELATED APPLICATIONS

This disclosure is related to two applications entitled "Self Testing Detection System for Comparing Digital Signal Transition Times", inventors James B. Whitacre and Peter P. Binoeder, filed Nov. 14, 1983 as U.S. Ser. No. 551,081; and "Adjustable System for Skew Comparison of Digital Signals", inventors Peter P. Binoeder and James B. Whitacre, filed Nov. 14, 1983 as U.S. Ser. No. 551,080.

BACKGROUND OF THE INVENTION

PRIOR ART

In the prior art there have been occasionally developed testing systems for the dynamic testing of signals generated by electronic modules. One such example is U.S. Pat. No. 4,092,589 entitled "High Speed Testing Circuit". This patent disclosure involved the application of test signals to a device-under-test and its subsequent comparison of the device's output signals against computer-predicted signals.

The present disclosure involves a test system for comparing analogous digital signals retrieved from a standard reference unit and from a unit being tested so that a comparison can be made between various signal parameters from the unit-being-tested against the standard reference unit, whereby discrepancies or out-of-tolerance conditions can be flagged and reported for subsequent diagnosis of the problem or trouble involved.

SUMMARY OF THE INVENTION

It is an object of the present invention to provide a testing system which is programmable and which can compare many types of analogous signals whereby comparison is made between signals from a standard reference module and the corresponding signals from a module to be tested.

It is a further object of the present invention to compare two analogous signals, one from a standard reference module and one from a module being tested in order to check to see if the digital signals have comparable logic and timing events which are within the allowed skew permitted by a compare or skew compare circuit.

It is a further object of this invention to provide a testing system whereby out of tolerance or non-allowable differences between analogous signals can be checked and when an error or beyond-tolerance condition is detected, the resultant data and information will be frozen and then conveyed to a host computer system for analysis and display to an operator technician.

The above functions are accomplished by the use of a programmatic comparator system which can receive and compare up to 334 input lines from a standard reference digital module and compare them with up to 334 digital signal lines from a module to be tested. This is done by a data comparator module unit which is under the control of an I/O maintenance processor 200, a code processor 300 which works in conjunction with an event module 350 and a control interface module 400.

These modules form a programmatic comparator system which communicates with a host computer or driver system 100 which can initiate the test operations and also receive back data and information for display on a terminal device 7 whereupon an operator technician may be informed of the test results and may also enter control operations for other types of test operations.

The programmatic comparator system can generate common commands to both a standard reference module and its comparable module to be tested, it can generate common commands to various internal cards and modules and can take the output signals through a skew comparison circuit in order to skew compare the results. Additionally, logic outputs from an untested device or module can be compared against logic outputs from a known standard reference operating module. If the logic and timing levels are within the permissible skew tolerances of the skew compare circuit, then no error (mis-compare) is reported as to the leading edge and trailing edge timing of the analogous digital signals. If the skew is beyond the allowable tolerance, then a miscompare or error signal is flagged. In this case an I/O maintenance processor 200 captures the data in the data compare latches and in other registers and parts of the test comparator system. The driver system 100 will then read back this data and generate a read-out on a screen or printer which will show the failing bits and also show the register contents of various parts of the tester in order to perform a fault diagnosis.

The operator technician can select various segments or loops to be tested in both the standard reference module and the module to be tested. The test loop generates a synchronization pulse in the various clocks prior to any miscompare found in the two systems being compared.

A skew compare signal is defined for read-out which shows the actual error time in the testing loop.

The system has a flexible algorithm control with a bus structured module design which allows easy adaptation to a variety of systems or modules for testing many different types of digital modules which can be tested by comparing them with a standard reference module of their own type or with pre-programmed test dish data.

The programmatic comparator system also is provided with a switch register on the operator technician's terminal 7. This switch register is accessible from the driver system 100 in order to: (a) select tester operating functions; (b) to set margin control of the systems under tests; (c) and to provide for system display selection.

The integrity and proper operation of the programmatic comparator test system is verified and controlled by the I/O maintenance control processor 200 which provides for self test routines and also on-line monitoring of error conditions.

The programmatic comparator tester system utilizes three methods for testing:

(a) Test segment mode—this is the first method to be run and consists of the initialization of the machine states, and execution of a stored logic code followed by a machine dump operation in order to verify error free operation.

(b) Event mode—this is the second method used whereby a selection of certain events can be utilized for diagnostic purposes using functional and software test programs.

(c) Comparator mode—this is the third method of test whereby the programmatic comparator test system contains a variety of maintenance features which include the maintenance processor module 200 which is used to run a series of comparison tests between any two analogous signals from a standard reference module and the module to be tested.

In the test segment mode all of the PROMs and all the RAMs in the programmatic comparator are parity checked. Further, all buses in the system are parity checked on every clock of the machine's operation. All of the registers in the system are readable and capable of read-out and also are settable directly from the I/O maintenance processor 200.

The system uses an event module 350 which contains a multi-purpose comparator capable of full masking capabilities, that is to say any pair of signals which it is desired not to compare may be blanked out so that no comparison is made.

The programmatic comparator test system is used by the maintenance controller processor 200 in order to initiate self tests and further a code processor module 400 is used for logical test verifications of the system. In addition, the data comparator module 500 itself contains self test logic in order to verify the proper skew tolerances in an operational mode.

The programmatic comparator test system generates its own clock and distributes synchronized clock signals to both the modules of system A and of system B for synchronization purposes.

BRIEF DESCRIPTION OF THE DRAWINGS

FIG. 2A is a drawing showing the conversion of event time differences (skew) into digital and analog signals for sensing by an amplitude detector.

FIG. 2B is an extension of FIG. 2A to indicate how error signal detection is converted to provide output signals which indicate either an allowable skew-error or a non-allowable skew-error.

FIG. 7 is a block diagram of the input/output maintenance controller processor of the programmatic comparator testing system.

FIGS. 8A and 8B indicate a block diagram of the code processor of the testing system. The left margin of FIG. 8B should be placed contiguous to the right margin of FIG. 8A.

FIGS. 9A, 9B and 9C show a block diagram of the event module of the programmatic comparator testing system.

FIG. 10A shows a block diagram of the clock card for the comparator testing system while FIGS. 10B and 10C show a timing diagram indicating certain timing events that occur.

FIG. 11A shows card locations for parts of the controller interface module and connections to certain compare cards of the comparator module; FIG. 11B shows certain control bits for the instruction bus; FIGS. 11G, 11H and 11I are timing diagrams illustrating the timing of certain events.

FIGS. 12A, 12B, 12C and 12D show a flow chart diagram which shows the sequences of operations which function to make the programmatic comparator testing system operate in the desired modes.

GENERAL SYSTEM

Figure 5:
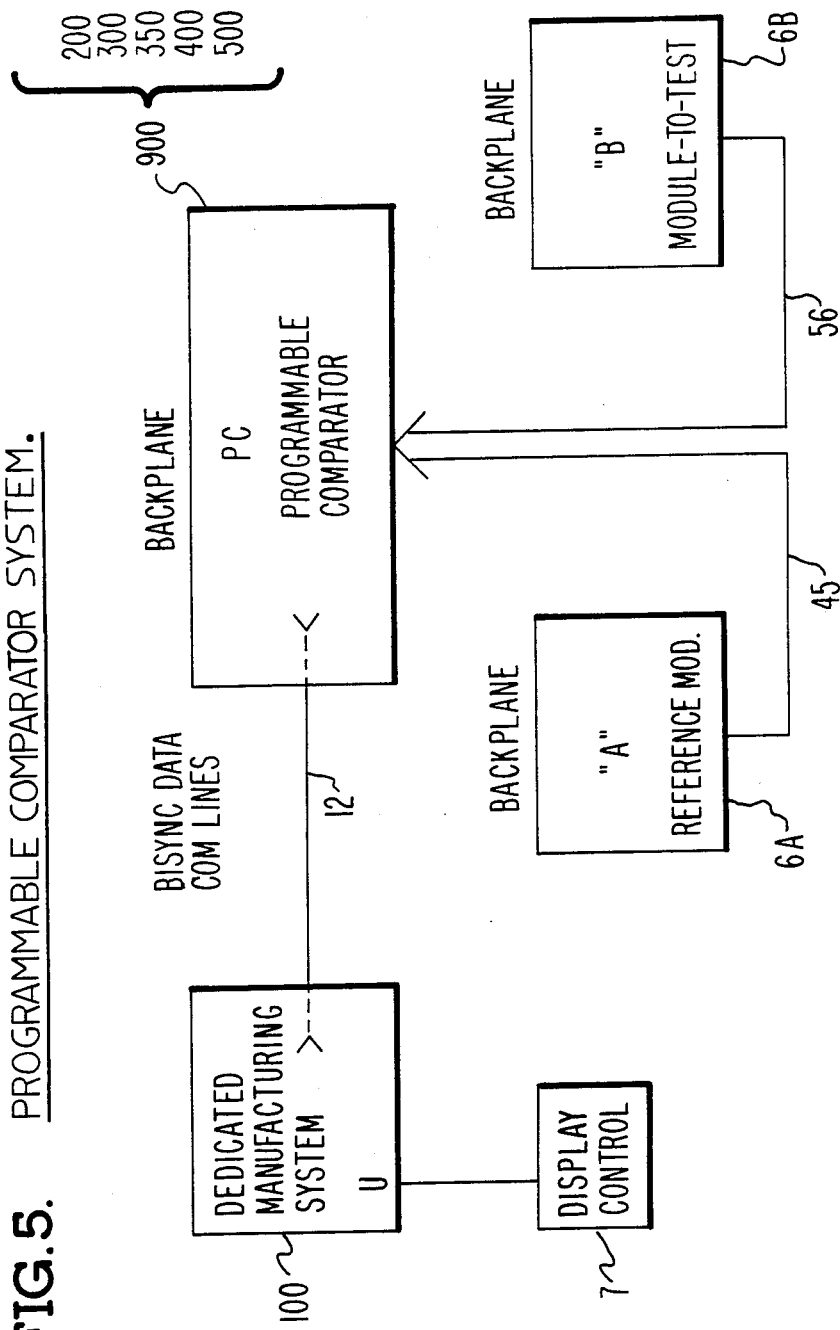
FIG. 5 is a schematic diagram of the programmatic comparator test system showing its relationship to a standard reference module and the module to be tested, and its intercooperation with a dedicated manufacturing system computer and display.

The general system drawing is shown in FIG. 5 whereby a dedicated manufacturing system 100 is connected to a display control terminal 7 which is used for the operator technician. The dedicated manufacturing system may be a host computer such as a Burroughs B 6900 computer or a Burroughs B 5900 computer which has a bi-synchronous data communications line to the programmatic comparator testing system 900. The programmatic comparator testing system 900 is shown in further detail in FIG. 6 which shows the individual modules involved in the testing system. Referring to FIG. 5 it is seen that connections are provided for data signals to be bused from a standard reference module 6A and also from an analogous module to be tested, 6B. Thus, specific signals from the reference module can be fed into the programmatic comparator testing system 900 so that each particular signal can be compared with an analogous signal which is taken from the module to be tested 6B. Thus, it is possible to take any sort of electronic digital module and together with a standard reference module of the same type, use these as input to the programmatic comparator test system 900 in order to perform check and diagnostic tests on the digital electronic module.

The programmatic comparator testing system, as embodied in the present disclosure, is directed to testing the various signal systems involved in a Burroughs B 5900 computer, whereby a standard reference B 5900 computer (unit A) has its signals compared against the analogous signals of a B 5900 computer which is to be checked out and tested (unit B).

The programmatic comparator testing system 900 consists of approximately 36 slide-in cards mounted in a cabinet having a mother board backplane into which the cards can be connected. The testing system is microprogram controlled by three levels of microprocessors. One set is used to communicate to a host system 100 over a bi-synchronous data communications line and the other two microprocessor levels are used to perform various test functions on a pair of similar electronic digital modules such as the B 5900's in this particular configuration.

An additional plug-in card designated Test 1, is used to interface with the B 5900 systems in order to replace a standard maintenance processor board which is normally found in the B 5900 system.

When two separate B 5900 systems are connected to the programmatic comparator testing system, tests are performed on each system in parallel and the results are compared. If the results are intolerably different, then it is assumed that the new system being tested and compared has indicated a failure. Thus, facilities are provided which allow the operator technician to "loop" on to a failure test and where the system provides a specified synchronization point at which the operator technician can view, on an oscilloscope screen, the particular signal actions which occur between synchronization point and the failure point.

In general the software system for operating the programmatic comparator testing system will consist of the following components:

(a) a data base of tests;
(b) programs to generate and compile the tests;
(c) programs to serve the tests over to the programmatic comparator testing system;
(d) subroutines which reside in the programmatic comparator testing system;
(e) a built in I/O handler for data communications and communications to the electronic digital modules under test;
(f) a communications protocol for communication to a host system.

The FIGS. 12A through 12D illustrate a flow chart which shows the operation of the programmatic comparator testing system from the moment of power-up to the execution of a dish routine.

GENERAL OPERATIONS

The programmatic comparator testing system provides for two primary functions. These are: (A)—the reporting function; and (B)—the controlling function.

The controlling function (B) interfaces to the host system 100 and to the electronic module devices under test (devices 6A and 6B). This is for governing the flow of data to and from the electronic digital module units 6A and 6B. Further, the control function includes the control of test execution and the reporting of errors to the host system 100.

Figure 4:
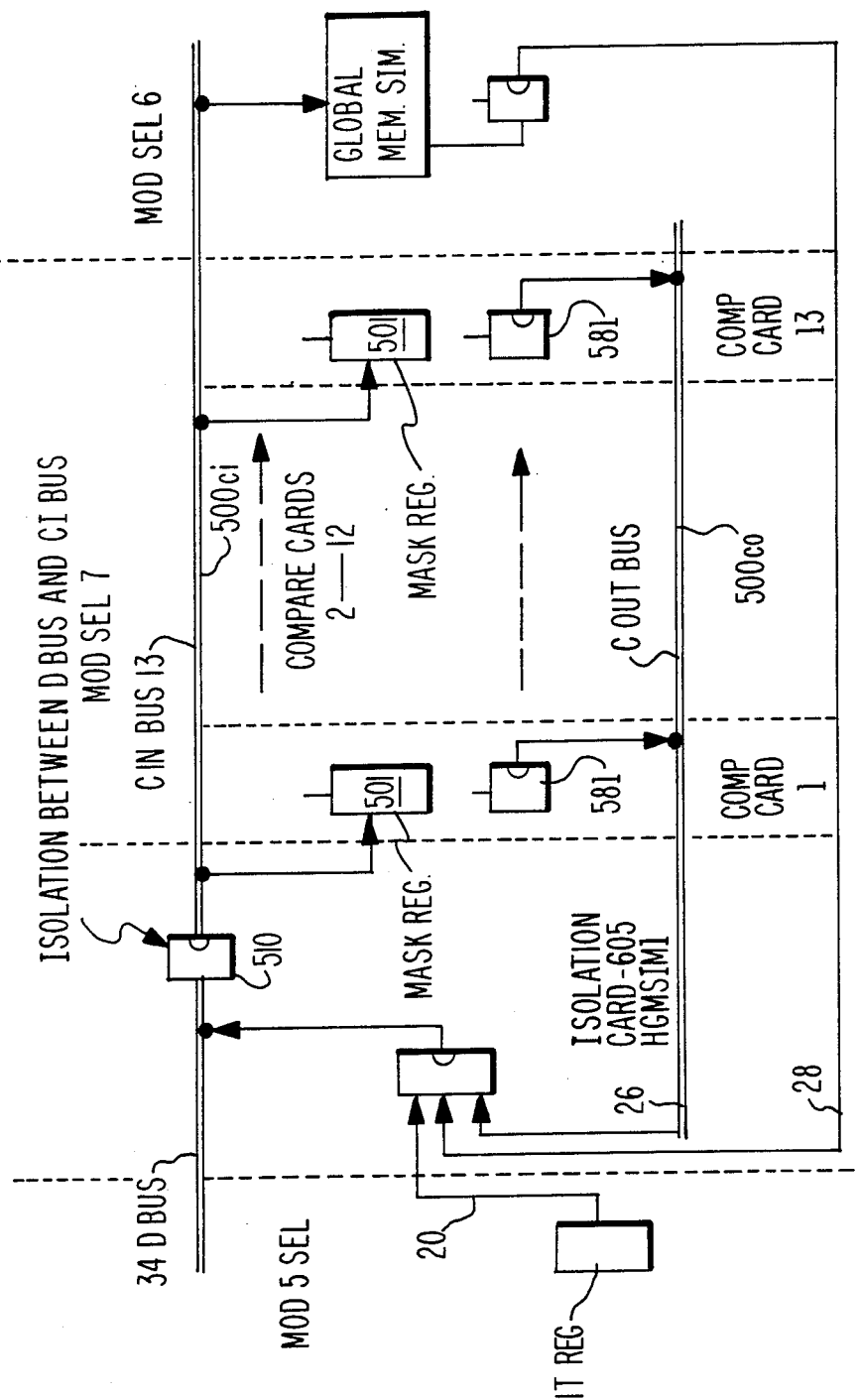
FIG. 4 is a schematic drawing of a series of compare-card units, each of which involves similar circuitry for comparison of different sets of incoming digital data signals.

The reporting function (A) involves the 13 compare cards of FIG. 4, which send their compare error signals to the IOMC 200. The compare cards generate a compare signal for the foreplane of a card designated TAA 37 - P4. A connector T4 has a paddle connected to it which contains test points which can be connected to an oscilloscope for use of the operator in making his view and diagnosis of events and occurrences.

A test point on the paddle is called the state "synchronization point". This is a signal which is generated during the loop of a failing-test case, that is to say, when a test has been made and a failure point has been detected. The synchronization pulse appears for operation of the oscilloscope at the time that the data mis-compare occurs.

Under normal conditions, a bus-compare error may be traced back to a hardware failure in the logic that the executing dish is calling, thus making fault isolation relatively simple.

PROGRAMMATIC COMPARATOR SYSTEM DESCRIPTION OF PREFERRED EMBODIMENT

Referring to FIG. 5 there is seen a block diagram of the programmatic comparator testing system and its relationship to the other modules and systems with which it cooperates. For example, the programmatic comparator unit 900 is itself composed of the units shown in FIG. 6 which are designated as units 200, 300, 350, 400 and 500.

Connected to the programmatic comparator 900 there is a reference module 6A which performs or presents many lines of signal data to the programmatic comparator 900 for comparison with the module to be tested designated 6B which also presents a multitude number of analogous signal lines to the programmatic comparator 900.

The dedicated manufacturing system 100 is generally a form of host computer and may be a computer system such as the Burroughs Corporation B 6900 computer. The system 100 has a bisynchronous data communications line between itself and the programmatic comparator system 900. In addition, there is a connection to a display control unit 7 which is for the use of the operating technician to monitor, control, diagnose and read out data from the test system.

Figure 6:
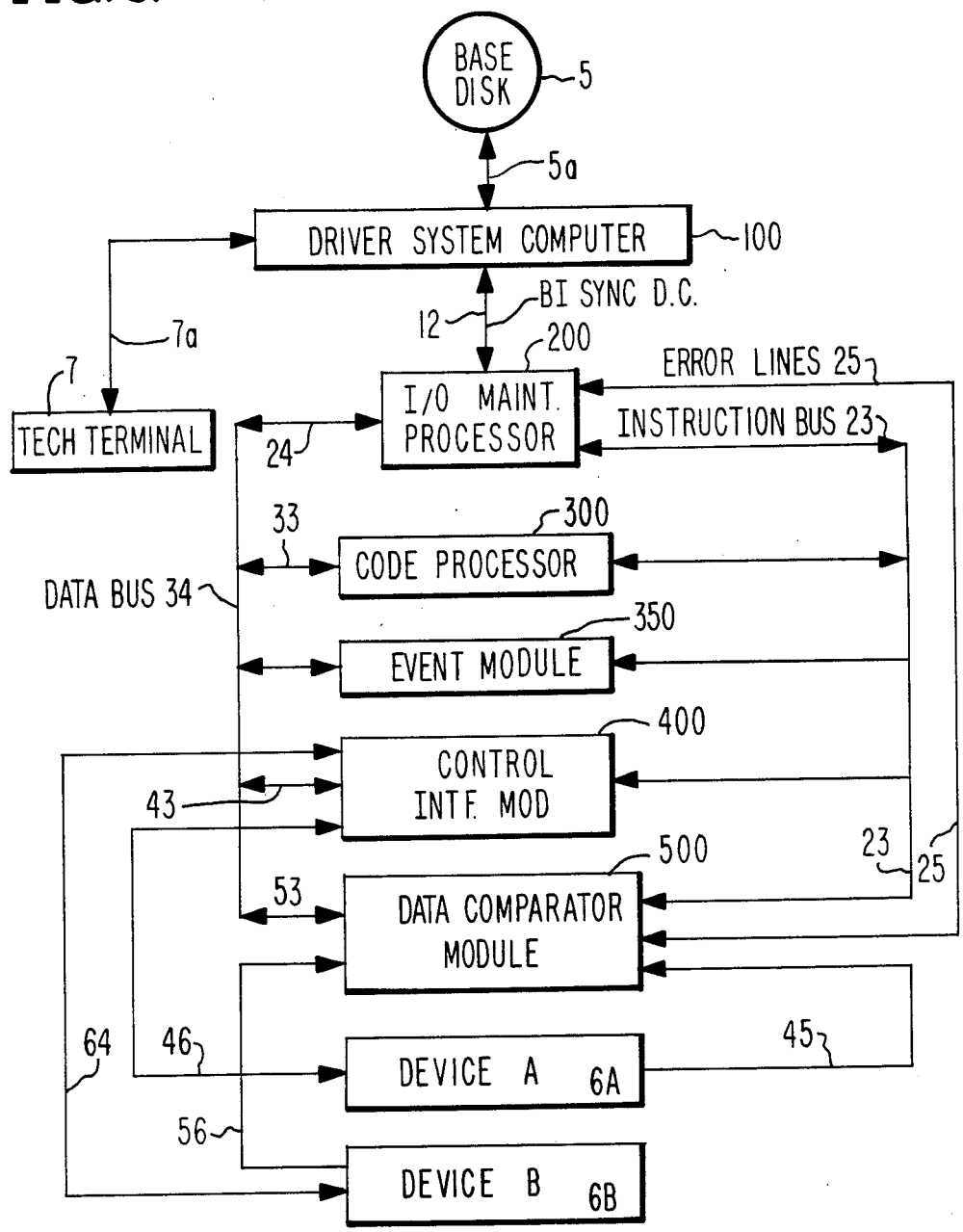
FIG. 6 is a more detailed block diagram of the programmatic comparator test system showing the various cooperating component modules involved and the bus connections therebetween.

In FIG. 6 there is seen a more detailed block diagram of the system described in FIG. 5. Here, the dedicated manufacturing system 100 (DMS) is shown as the driver system computer 100 which has a data base 5 connected to it via a bus $5_a$. In addition, a bus $7_a$ connects the display control unit or technician terminal 7 shown in FIG. 6. The bisynchronous data communications line 12 of FIG. 6 connects the driver system computer 100 to the I/O maintenance processor 200.

Referring to FIG. 6, the terminal 7 is a data communications terminal which is used by the operating technician as a means of initiating the test programs to be used by the programmatic comparator 900 (FIG. 5). The terminal 7 provides an interface with the operating technician and indicates for him the status of the programs, the errors, the failures, and the various other conditions of the test system. It provides a tool which is used by the operating technician to control the mode or the program functions based on a failure scan of a previous checkout or test.

The bisynchronous data communications line 12 of FIG. 6 uses a binary bisynchronous data communications protocol using cyclic redundancy checking on each transferred data block. The electrical interface for this cable uses Burroughs direct interface circuitry which allows the driver system 100 to be placed up to 3,000 feet away from the module-unit-under-test, device 6B.

The instruction bus (I bus) 23 of FIG. 6 is a 21 bit bus of 20 bits plus a parity bit. Odd parity checking is done on this particular bus by all of the various modules. If the selected module detects a parity error, it drives the instruction bus parity error line to the input-output maintenance controller processor, IOMC 200. The IOMC 200 takes over at that point in order to report the error. This instruction bus 23 allows the possibility of up to one million unique commands to be delivered to each one of the addressed modules involved.

In FIG. 6 there is seen an error bus designated error lines 25 which connect the data comparator module 500 and the I/O maintenance controller processor 200. There are 13 error lines from the compare cards in the data comparator module 500 which are used to signal whenever an error is detected. One error line is bussed to all of the compare cards in order to provide for a self test routine. This is to indicate that all of the comparators have properly detected an error reference signal on the fail-test routine which is described hereinafter.

There are other specific error lines in bus 25 from the data comparator module 500 over to the maintenance processor 200, and these include: an instruction bus parity line, a data bus parity line, a time-out line, a format error line (invalid program register code), a pipeline parity error in the microcode, a "P" (program) register parity error, a test data buffer parity error, a control interface parity error in memory data or test data, and a stack overflow error involving the code processor 300.

In FIG. 6 the data bus 34 is the main data path within the programmatic comparator testing system. It provides a bi-directional interface to each and every module shown in FIG. 6. This bus is made up of 28 bits plus a parity bit. As seen in FIG. 6, the data bus 34 has interconnections 24 to the IOMC processor 200, a bus connection 33 to the code processor 300, a bus connection 43 to the control interface module 400, a connection 53 to the data comparator module 500, and a bus connection 35 to the event module 350.

The bus connection 45 in FIG. 6 shows the inputs from a standard reference digital module to the data comparator module 500. This can provide up to 334 signal lines which can be simultaneously compared as a reference to signal lines 56 from the module to be tested 6B.

The bus 56 from the device to be tested, 6B, connects also to the data comparator module 500. The bus 56 provides up to 334 individual signal lines to the comparator which can be compared to the analogous signal lines from the standard reference digital module 6A. In FIG. 6, the driver system 100 has bus connections $7_a$ to the terminal 7 and also has bus connections to a data base 5 via the bus $5_a$, in addition to providing bisynchronous data communication connections on bus 12 to the I/O maintenance control processor 200. The driver system 100 (which may be a Burroughs B 6900 computer) is a computer mainframe capable of running Burroughs ALGOL programs with a bisynchronous intercommunication interface.

For example, if the modules to be tested, for example, are Burroughs B 5900 computers, then the various output signal lines from a standard reference B 5900 computer (6A) is connected to the data comparator module and a B 5900 system-to-be-tested (6B) is connected to the data comparator module 500. Thus, the driver system 100 can be used via the technician operator to initiate various test programs whereby the driver system 100 reads formats and also displays failure data that was provided by the programmatic comparator test system to be displayed upon the technician's terminal 7. The driver system 100 monitors the status of the testing system during all phases of operation and it provides an interface to the operator-technician via the terminal 7 and, in addition, the driver system 100 can be used to control the entire testing program.

Again, in reference to FIG. 6, there is seen a data base 5 which is a mechanism for storing data which is to be used by the driver system 100. The data base 5 contains the programs used to initialize the test system and also provides the programs required for operation of the programmatic comparator test system 900 in its operations for conducting various tests. The data base 5 thus interfaces with the driver system 100 in order to transfer its data to and from the other parts of the system such as modules 200, 300, 350, 400, 500, 6A and 6B.

In FIG. 6 the I/O maintenance controller processor 200 (IOMC 200) is the interface between the programmatic comparator tester system 900 and the driver system 100. Basically, the module 200 is a 3-card module containing (a) a data communications unit, (b) transmitter-receiver registers, (c) an I/O byte register, (d) a I/O byte comparator, (e) a byte counter, (f) a cyclic redundancy checker (CRC) generator/checker, (g) an instruction bus receiver, and (h) a command decoder. These are described later in connection with the I/O maintenance controller processor 200.

The maintenance controller-processor module 200 is controlled by a microprogrammed controller designated as AMD 2910. This controller is described in a publication by Advanced Microdevices of 901 Thompson Place, Sunnyvale, California 94086 in a publication entitled "Bipolar Microprocessor Logic and Interface Data Book", copyrighted 1981.

The AMD 2910 microprogrammed controller is used to drive a 2K×56 bit command PROM $309_a$, FIG. 8B, wherein the command PROM decision making is based on the input from a 48 bit test condition multiplexor $309_c$ described in connection with FIGS. 7 and 8 hereinafter.

The IOMC 200 performs the following functions for the programmatic comparator tester system:
  (a) It routes bisynchronous data communication input to the proper destination required within the test system, as for example:
    (a1) it directs the IOMC command program such as "clear", "load switch register;
    (a2) routing data communication to the code processor 300 and to its microcode RAM;
    (a3) routing data communication input to the code processor 300 for its program register;
    (a4) routing data communication input to the control interface module 400, for its test data buffer.
  (b) It handles error detection routines and reports the resulting status into a 56 bit Result Status Register which is located in the input-output maintenance controller processor 200.
  (c) Upon detection of an error, the code processor 300 plus any of the units under test and all the registers are "frozen" by the IOMC 200. Then the particular state (at that moment) of all the registers, comparator latches, data inputs and other conditions data are stored away in the "test data buffer" of the control interface module 400, described hereinafter.

Then, the data which was frozen is "dumped" and this dumped data can be stored in the "test data buffer" of control interface module 400 after which it can be read out and analyzed by the driver system 100.
  (d) There is provision for "self-test" of all the units in the system. Upon a power-up, or on the IOMC 200 "clear", or upon a driver system 100 "request", or manual request of the operator technician, the IOMC 200 can perform a built-in "self test" routine of the entire programmatic tester. Any resulting failures are frozen and then placed in the "test data buffer" of module 400 after which they are used to form a Result Status word in the result status register of the IOMC 200.

During the self-test routine, and also during the tester-dump period, the code processor 300 (which normally would have control) is preempted by the IOMC 200 which now controls the entire programmatic comparator directly.

In FIG. 6, the code processor 300 also connects to the other modules by means of the instruction bus 23 and also by means of the data bus 34 via its own bus 33. The code processor 300 consists of an AMD 2909 microprogrammed sequencer controlling a 56-bit microcode register. This type of microprogram sequencer is also described in the previously mentioned publication of Advanced Microdevices.

The decision making in the code processor 300 is done via a 48-bit test condition multiplexor $309_c$, described hereinafter. The microcode subroutines are down-loaded by means of the maintenance controller 200 into a 56 bit by 4096 microcode RAM. These subroutines are called up as required by the "test dishes". The "test dish" is a program routine which involves the smallest loopable test routine. A sequence of test dishes are used for the testing program. The code processor 300 has a 56-bit program register (P register) which is divided up as follows:

[Note: the first number indicates the bit position of the instruction word and the second number after the colon indicates the number of next lower bit positions.]

55:4—indicates the type of field A type 15 (all bits on) indicates a "direct program word".

A type 8 (bit 55 on) indicates an "indirect program word".

51:12—indicates the base address for the subroutine being called up.

39:20—indicates the literal field for the P1 register.

19:20—indicates the literal field for the P2 register.

The term "indirect program word" means that the word was temporarily stored in the test data buffer of the module 400 before being activiated for use. A direct program word means that the instruction word came directly from the driver system computer 100 to be used as an instruction word.

"Indirect program words" (IPW) from a given test dish are loaded into the program register (P register) and also into the code processor 300 which does a map entry to the subroutine base address (51:12).

The subroutine uses the "literal" values which are provided in the above mentioned P1 or P2 bit fields. The subroutine performs the intended task and then loads the next IPW (indirect program word) from the test data buffer residing in the control interface module 400.

The code processor 300 has a 20 bit "literal" register which allows a RAM subroutine to provide some 20-bit literal values directly from the microcode.

In addition, the code processor 300 controls the "event" logic in the module 350, which counts events as requested by the technician. The event logic includes a clock counter, a synchronization counter, a programmable event counter (16 bits), an execution counter (20 bits) and a T counter (8 bits) which are described in connection with the event module 350.

The control interface module 400 shown in FIG. 6 is the primary interface between the test system and the actual module-to-be-tested (6B) unit itself. The control interface module 400 is a specific unit which is designed to handle a particular type of test situation. For example, if a B 5900 computer is to be tested against a standard reference B 5900 unit, then the control interface module 400 would be particularly designed to handle testing for the B 5900 systems. If another type of digital device was to be tested, then the control interface module 400 would be designed to control that particular type of device.

The main function of the control interface module 400 is to provide data and control to the "known reference unit" 6A and also to the "unit device under test" 6B. The control interface module 400 has a test data buffer and has an address pattern unit which provides the stimulus and the test case information.

The control interface module 400 receives its control operators from the code processor 300 or else from the IOMC 200. It sends its output data to the other modules in the programmatic comparator and/or to the device units as 6A and 6B.

The data comparator module 500 of FIG. 6 consists of 13 "compare cards" (FIG. 4). Nine of these cards receive compare data from off the backplane connectors of the programmatic comparator test unit and four of these "compare cards" receive data on the front or foreplane connectors. The data comparator module 500 can operate to receive a maximum of two sets of 334 signals which can be simultaneously compared by this particular module.

As will be described hereinafter, each of the 13 "compare cards" has full masking and self test capability such that any pair of signal lines which are inserted for comparison can be "blanked out" at will and any pair of analogous input test signals inserted for comparison can have their individual circuitry undergo a "self test" operation under control of the operator technician or under control of the driver 100.

The comparator circuitry in module 500 uses a "skew" analysis type of error detection as will be described hereinafter. This means that if the difference in skew for moments of transition between a signal from 6A and a signal from 6B (between the reference device signals and the device-under-test signals) exceeds the pre-set limit on either the leading edge or on the trailing edge, then an error signal is latched, the register and comparison data is "frozen" and a result status word is sent to the IOMC 200.

Thus, as is described hereinafter, when an error latch is set, the error signal for this particular compare card and particular set of analogous signals, is sent back to the IOMC 200 whereupon the maintenance controller 200 then takes the appropriate action for reporting this error to the driver system 100 and to the operator technician at the terminal 7.

Figure 1:
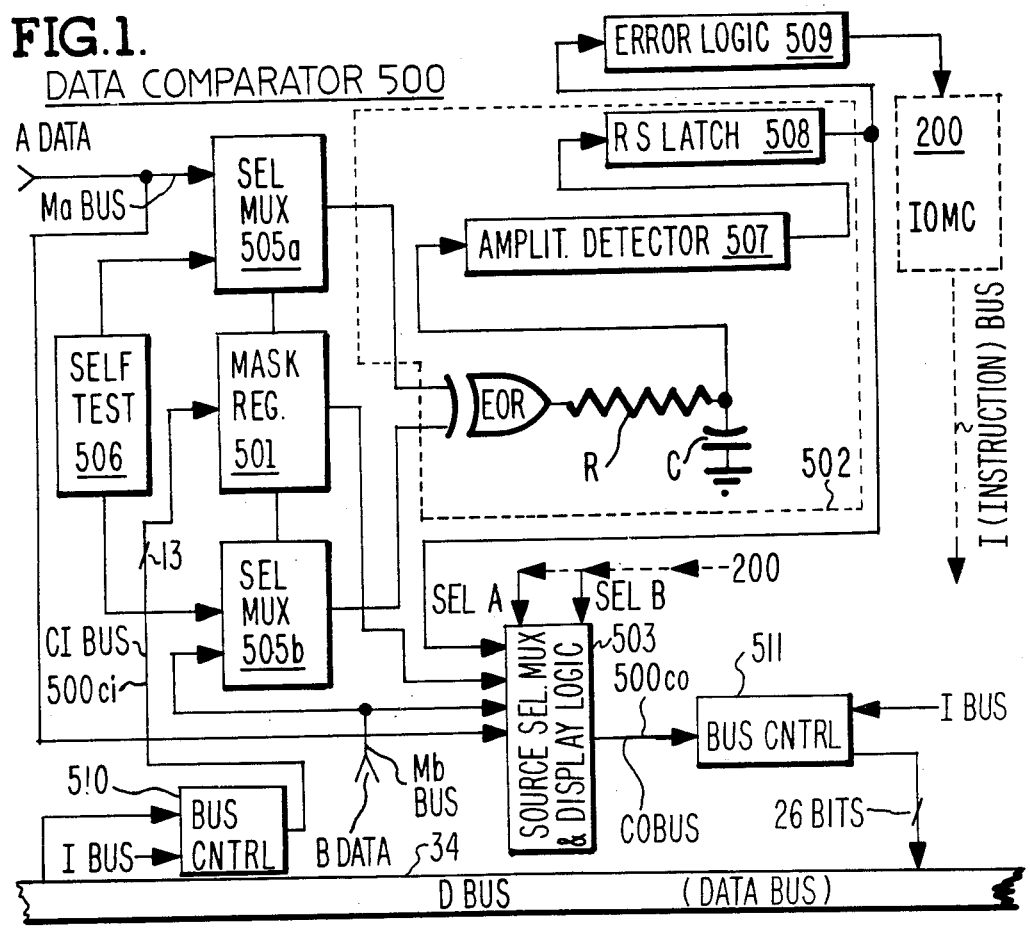
FIG. 1 is a simplified diagram of some basic elements of a digital signal testing system.

Data Comparator Module:

The data comparator module 500 of the present disclosure is shown in its basic format in FIG. 1. There are two sets of data, set A and set B, which are to be compared with each other. For example, 26 lines form a set of data which can be called B data or data from device B. It is desired that this data be checked out against and compared to some standard set of data from a device called device A. Thus, here again we have 26 lines forming a bus of data coming from the device A.

The lines of A data and the lines of B data are fed to selector multiplexors designated as $505_a$ and $505_b$ and the outputs of these multiplexors are fed to a circuit 502 which is an adjustable skew-compare logic circuit having an output presented to amplitude detector (Schmitt trigger) 507.

The selector MUX (505A and 505B) operates as a switching device whereby at certain times the circuit may be tested by outputs from the self tester 506; and in normal operation the selector multiplexors $505_a$ and $505_b$ are used to enable the comparison of data from device A and device B.

A mask register 501 connects to the select multiplexors in order to blank out any desired and selected input lines which are fed to the select multiplexors $505_a$ and $505_b$. The mask register 501 has an input designated as CI (comparator input) bus $500_{ci}$ which carries the bus control signals from bus control unit 510 which connects to the D or data bus 34.

The amplitude detector 507 provides output signals to a RS latch 508 (reset-set) which connects its output signal to an error logic unit 509 which then provides its signals to a maintenance processor 200 whereby the error signals can be identified. The error logic unit 509 is further described in FIG. 3.

The bus lines of the A data and the B data are fed to a display logic unit 503 which also has inputs from the mask register 501 and the RS latch 508. The display logic 503 provides a bus of 26 lines as output and is designated as the comparator output bus CO bus $500_{co}$. The output of this bus $500_{co}$ is fed to bus control unit 511 which provides an output to the main data bus 34 which data can then be fed to a terminal for observation by the operator of the system.

Figure 1A:
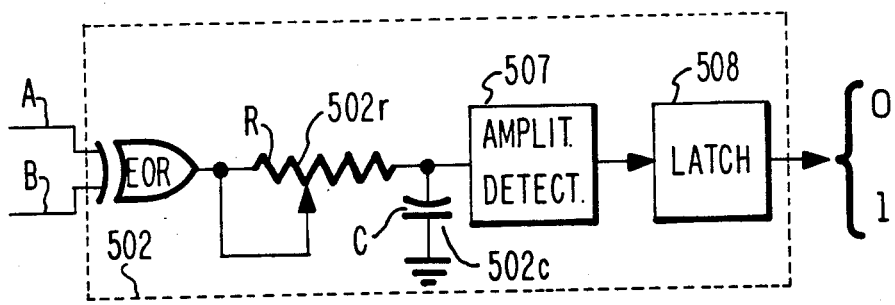
FIG. 1A is a schematic drawing showing the adjustable skew compare circuitry for comparing incoming digital signals from sources A and B.

The skew compare logic unit (502 of FIG. 1) is shown in FIG. 1A whereby each line of the bus data from device A and each line of the bus data from device B are fed to their own separate exclusive OR gates typified by 502. For example, a typical situation would be where a bus line from device A and its analogous bus line from device B would be fed to a single exclusive OR gate designated $502_a$ in FIG. 2A. The output of the gate $502_a$ is then conveyed through resistor $502_{ar}$ and capacitor $502_{ac}$ into a threshold input unit $507_a$ which is basically an amplitude detector as was described in connection with FIG. 1. The output of the amplitude detector $507_a$ is then fed to a latch $508_a$ (FIG. 2B) which is used to temporarily hold the data for further use.

The skew compare logic unit of FIG. 1A is made to have an adjustable RC time constant so that it is possible to compare the time points of the leading edges and the trailing edges of the comparable data line signals from device A and device B.

Since the RC time constant is made adjustable, it is possible to vary the skew measurements between any of the two comparable signals from device A and device B.

The "skew" involved here may be defined as (in the situation where two signals are being compared as to the occurrence of a change which may be called a signal event) the time difference between analogous events between two signals being compared. Thus, the timing difference between the analogous signal events or transition-changes would be known as the "skew". For example, if two signals are being compared for a 0-1 transition and the first signal has this event occur at time $t_0$ and the second signal has this event occur at time $t_1$, then the difference between the two times of $t_0$ and $t_1$ is the measurement of the "skew" as to those signal events.

In the skew compare logic unit of FIG. 1A the amplitude detector $507_a$, FIG. 2A, is a Schmitt trigger which is provided with a threshold voltage such that no output will be registered unless the threshold voltage is met or exceeded. This insures that when the "skew" is considered beyond the level of acceptability, only then will the Schmitt trigger operate to produce an output signal which will generate an error condition to the latch $508_a$.

Further details and operative features of the data comparator module are explained and shown in connection with the following FIGS. 1B, 2A, 2B, 3 and 4.

Figure 1B:
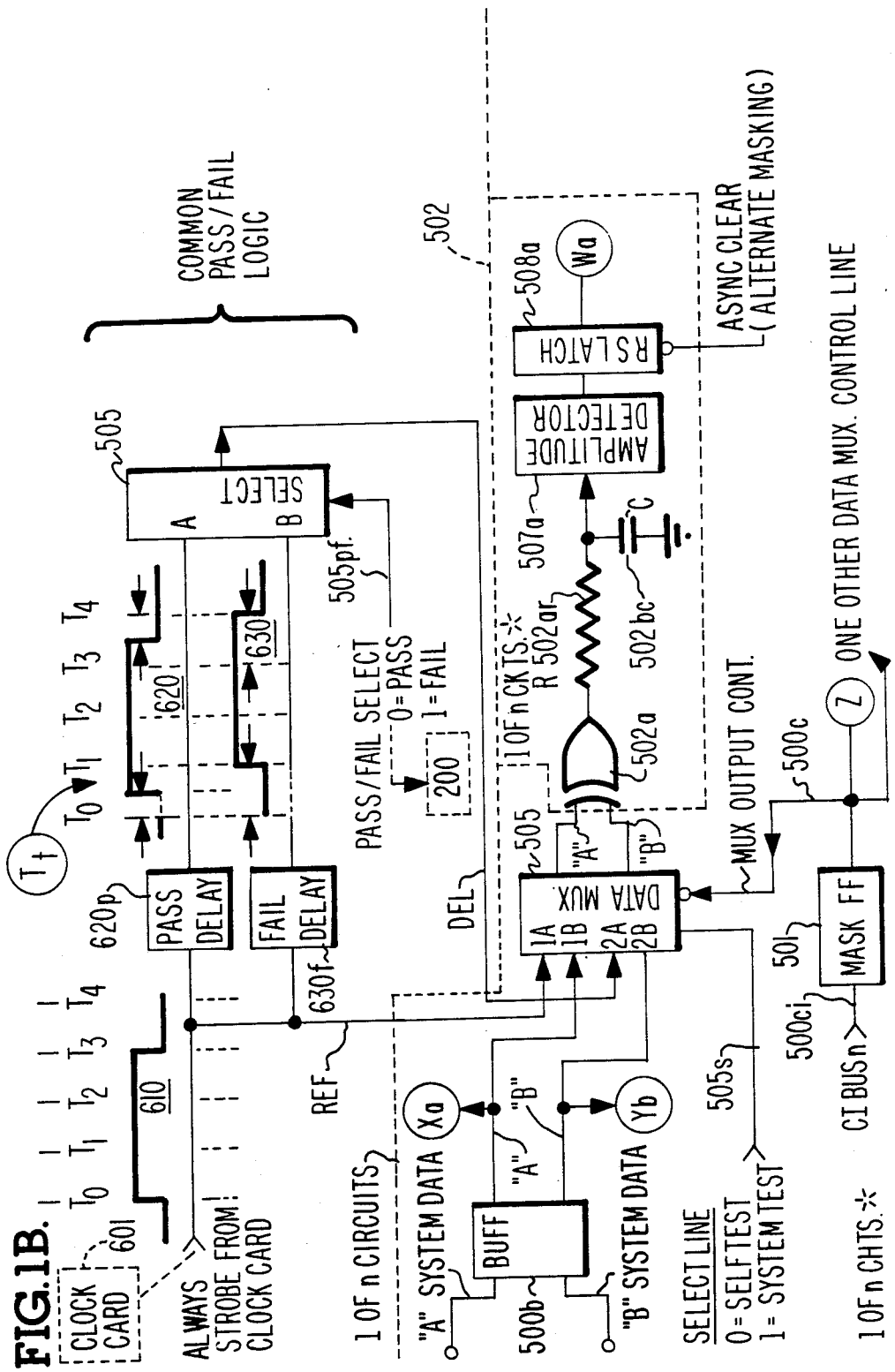
FIG. 1B is a diagram showing a more detailed circuitry system for comparing a series of first and second incoming digital signals together with a self-test system for the circuitry.
Figure 3:
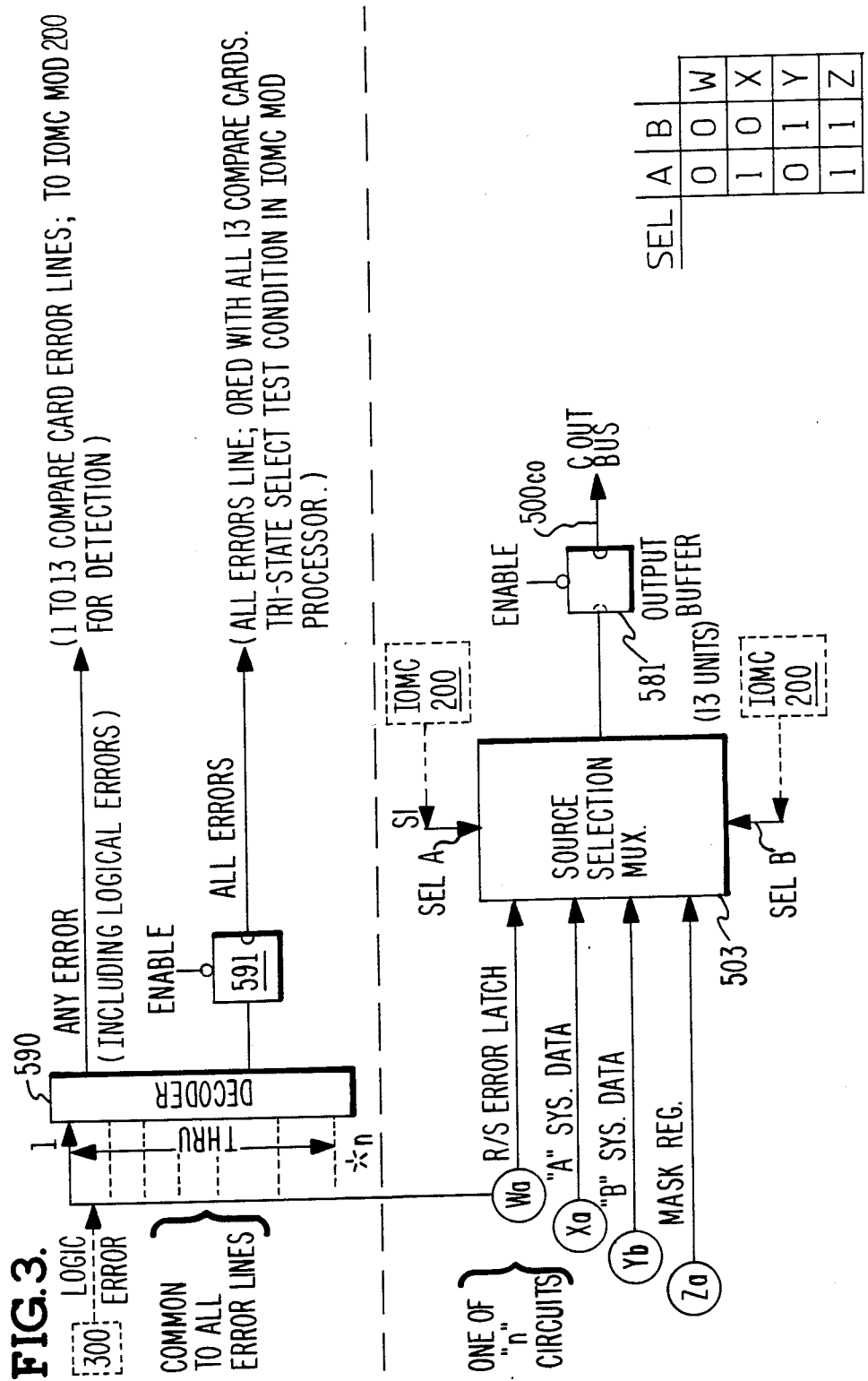
FIG. 3 is a block diagram showing the elements which allow data from the digital data comparator circuitry to be transferred to the input/output maintenance controller processor for analysis or display.
Figure 10A:
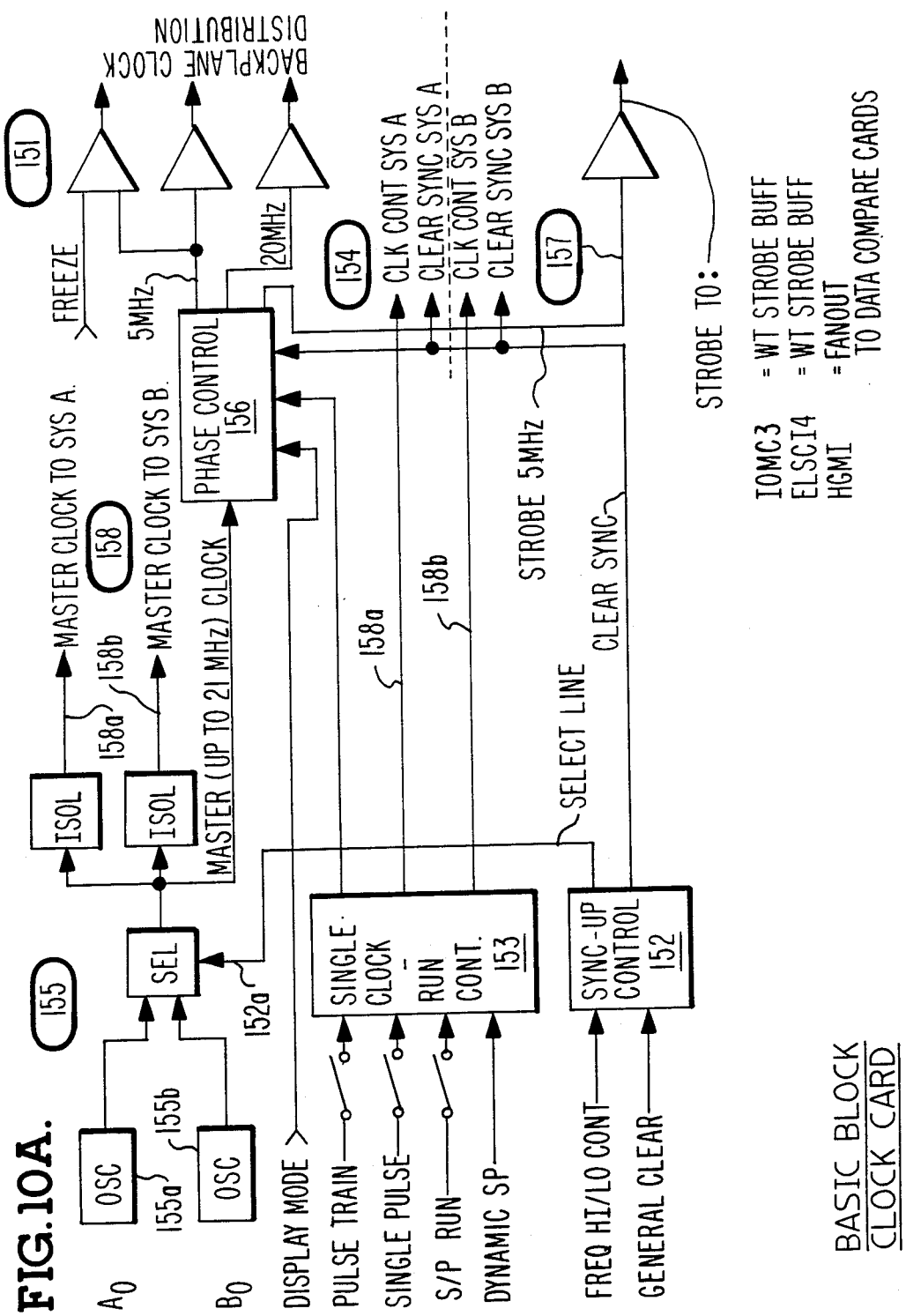
Figures 2, 10B:
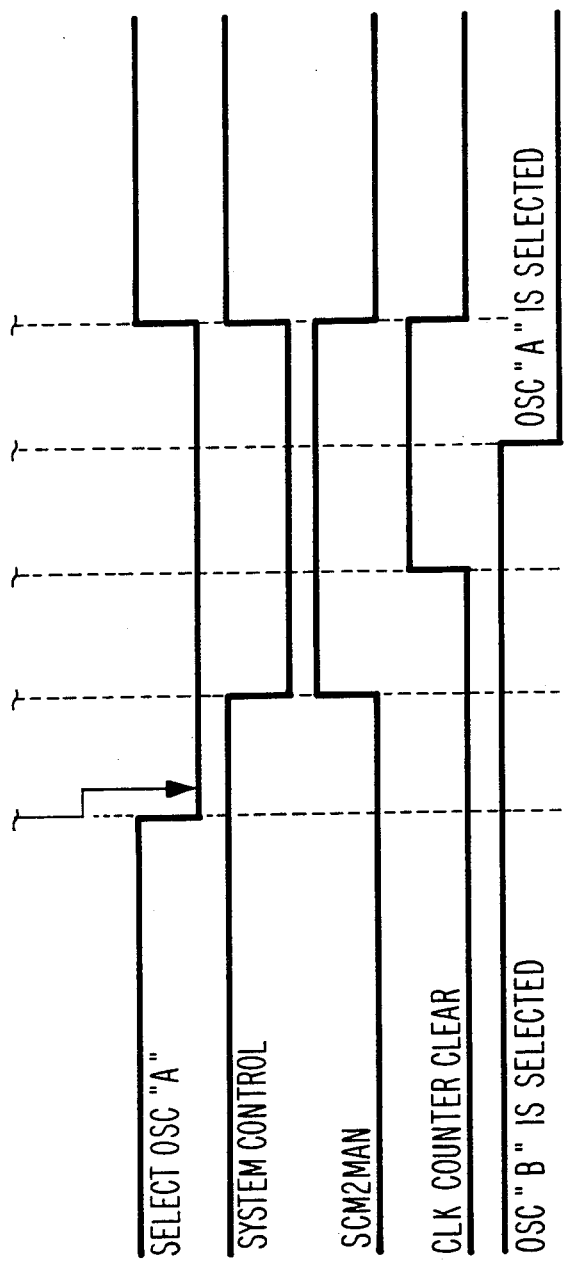

A series of comparator cards (as elements 1 through 14, FIG. 4) are used to provide the various functions shown in FIGS. 1, 2 and 3. The comparator cards provide the following functions:

(a) They provide a self test function to check the adjusted skew window with the generation of a "pass delay" test circuit and a "fail delay" test circuit as shown in FIG. 1B. The pass test circuit sets up a skew timing which must pass all of the skew compare circuits in order to validate the system operation.

The fail delay test circuit sets up a skew period which every circuit sees as a failure. This is a system whereby assurance is made that the skew compare logic unit of FIG. 1A is functioning accurately. This particular set of pass-fail tests is executed in the self test mode function for every single compare card in the system, and is initiated by an I/O maintenance processor-controller designated as IOMC 200 in FIGS. 1 and 3.

Both the pass delay test circuit $620_p$ and the fail-delay test circuit $630_f$ include adjustable taps whereby the digital signals 620 and 630 (FIG. 1B) can be adjusted as to duration and also as to the timing of the low-high transition and the high-low transition moments.

(b) The comparator cards of FIG. 4 have the ability to mask any two bit pair combination on all of the compare circuits. There are 13 mask register flip-flops on each compare card which are used for masking 26 data lines. The mask register bit 0 will mask the data lines 0 and 1. Similarly, the mask register bit 12 will cause the masking of data lines 24 and 25.

(c) A selection of data from either the device of system A or the device of system B can be directly routed to the D bus 34 of FIG. 1 and routed to another module called the event module 350, FIG. 6, whereby certain analytical procedures can be used to gather information about the data. The event module provides a clock counter, synchronous counter and other units which can be used for these purposes.

The testing system described herein uses two basic types of compare cards (FIG. 4). There are four foreplane compare cards in the tester unit and nine backplane compare cards in the tester unit. It is these cards which make up the data comparator module 500 of FIGS. 1 and 4. These units are provided as slide-in cards which slide in to connect to a backplane. The data from system device A and system device B is generally routed by means of flat ribbon cables where it is then either directly connected to the foreplane comparator cards or else is connected through an interface card to the backplane compare cards in the testing system.

For example, if it is desired to test the M bus (main bus) from device A in order to compare it to the M bus from device B, the data is compared during read and write operations. During the M bus turnaround (from read to write or vice versa), an external control module (not shown) will cause an "automatic signal disabling". This external control module uses an asynchronous clear line to the R/S latches 508 on the compare cards. In FIG. 1B there is shown the asynchronous clear line which connects to the RS latch $508_a$. Thus, any tri-state "glitching" is therefore not latched or captured as an error signal.

As seen in FIG. 1B there are the main buses which carry many lines of data both from device A and from device B. If, for simplicity sake, a single signal line from device system A is used to compare to its analogous same system line from device B, it is possible to illustrate what is done for all the comparable lines which are to be compared. For example, in FIG. 1B, analogous lines from device A and device B are entered into a buffer $500_b$ which is used to isolate these signals from the input. The output of the buffer $500_b$ is routed to the data selection MUX 505 and also to a point designated $X_a$ for system A and $Y_b$ for system B. These outputs $X_a$ and $Y_b$ are indicated later on FIG. 3.

The data multiplexor 505 accepts data from system input A and system input B on its inputs designated 1B and 2B respectively. The other inputs designated 1A and 2A are the "self-test" data lines which use the pass delay test $620_p$ and the fail delay test $620_f$ for self test purposes in the system.

In order for the multiplexor 505 to pass the system data through the multiplexor, then the select line shown at the bottom of 505 must be in the "high" condition (equal to 1). When in the low condition (equal to 0), then the "self-test" data is passed through the multiplexor 505.

Data passed through the multiplexor $505_d$ can be enabled or disabled with the output control line $501_c$ whose source is a mask flip-flop 501. The set and reset data to the mask flip-flop 501 comes from the CI bus $500_{ci}$. This is the comparator input bus and is designated $CIbus_n$ to indicate that each line of the bus has a separate mask flip-flop ($501_1$, $501_2$, $501_3$, etc.) which is used to control each separate data multiplexor $505_d$ ($505_{d1}$, $505_{d2}$, etc.) in the system.

Each mask flip-flop $501_{1, 2, 3}$, etc. operates its own data multiplexor $505_{d1, d2, d3}$, etc.

Each mask flip-flop 501 drives two data multiplexor output control lines which are seen in FIG. 1B as the control line $501_c$ and the control line Z. This enables the effective control of two data compare circuits. The line designated Z is seen in FIG. 3 as the mask register input to the source selection multiplexor 580.

There are 13 mask flip-flops (such as 501 in FIG. 1B) on each backplane compare card which control 26 compare circuits. Similarly, there are 13 mask flip-flops (such as 501 of FIG. 1B) on each foreplane compare card controlling 25 compare circuits.

Each compare card (items 1-13 of FIG. 4) has common "self-test logic" which is indicated in FIG. 1 at self-test element 506.

Referring to FIG. 1B, there are seen strobe signals designated 610, 620 and 630 over a set of timing moments $T_0$, $T_1$, $T_2$, $T_3$ and $T_4$. This strobe is originated from a clock card 601 shown in the dotted block of FIG. 1B. The strobe is a 100 nanosecond square wave which occurs during each clock period and is distributed to each of the compare cards. It is a pulse that is used to measure the skew of the compare circuits during the "self-test" mode.

Again in regard to the use of the concept of "skew" here, it should be indicated, as before mentioned, that this is the time period between the occurrence of two analogous signal events. In this particular case, it involves a time comparison of signal events emanating from a system device A and a system device B to see how they compare in their timing occurrences.

In FIG. 1B the strobe signal 610 is connected to three places; (a) the pass delay test unit; (b) the fail delay test unit; and (c) the line 1A on the data multiplexor $505_d$.

The "pass delay" output unit $620_p$ has a delay to the time $T_t$ in reference to the strobe 610 which starts at $T_0$. The "fail delay" unit $630_f$ has, as shown in FIG. 1B, a delay to the time $T_1$ in reference to the strobe 610 which starts at $T_0$. The pass delay unit and the fail delay unit are adjustable via delay line taps and are selected according to the particular skew that is deemed allowable for a particular compare card.

The "self-test" is initiated by the maintenance processor IOMC 200 of FIG. 1 and it is executed automatically on power-up or on demand of the maintenance processor IOMC 200. A failure detected after self-test is reported to IOMC 200.

In the self-test mode, initiated by the self-test unit 506 of FIG. 1 as a result of instructions from IOMC 200, an external module (designated as the input output maintenance control module, IOMC 200) can select the pass delay mode unit or the fail delay mode unit by means of the select logic 505 of FIG. 1B. The output of select logic 505 is carried over as input to the data multiplexor $505_d$ in order to select either the pass delay strobe 620 or else the fail delay strobe 630 in order to check out the operation of the skew compare logic 502.

The strobe 610 of FIG. 1B is carried as input to 1A of data multiplexor $505_d$ while the output of the select multiplexor 505 is carried over as the input 2A to the data multiplexor $505_d$.

Continuing with FIG. 1B, the data multiplexor $505_d$ output has an "A" line and a "B" line which are fed as input to the exclusive OR gate $502_a$. This OR gate is one of "n" circuits which are provided for each one of the analogous lines from device A and device B which are to be compared. The exclusive OR gate $502_a$ is fed as input to a resistor R designated as $502_{ar}$ and this output constitutes the "difference" between (a) the signals 610 and 620 (pass delay) or (b) the signals 610 and 630 (fail delay) depending on whether the pass delay unit or the fail delay unit was selected.

As will be seen in FIG. 2A, the difference in pulse width is the time period which is allowed to charge capacitor C ($502_{ac}$) through the limiting resistor R ($502_{ar}$).

If the time difference period is too short, then the capacitor C cannot charge fast enough to reach an amplitude sufficient to fire the threshold which is set on the amplitude detector $507_a$, and thus no output signal from detector $507_a$ will occur.

As in the case of the self-test using the "fail delay" unit $630_f$, here the pulse width is wide enough to give capacitor C enough time to charge long enough in order to reach an amplitude which the amplitude detector $507_a$ can respond to, as seen in FIG. 2A at amplitude detector $507_b$. In this case, the amplitude detector $507_b$ will fire and set the RS latch $508_b$ (FIGS. 1B and 2B) after which the output signal is routed on to the input W on FIG. 3.

It will be noted that FIGS. 2A and 2B provide a unitary drawing where the right hand margin of FIG. 2A coincides with the left hand margin of FIG. 2B in order to make a complete drawing of illustrations showing the system compare signal operations.

As will be seen in these figures, there is an illustration of how comparisons are made between any two analogous lines from device system A and device system B. Depending on the number of analogous lines to be compared, this will establish the number "n" of similar circuits which will be used in the system.

As seen at the leftmost column of FIG. 2A, there is a time comparison indicated between the analogous signals from system A and system B which signals are fed into the A and B inputs to exclusive OR gates $502_a$, $502_b$, $502_c$ and $502_d$. For example, in FIG. 2A, and comparing the inputs A and B to exclusive OR gate $502_a$, it will be seen that the signal from device A can be compared to the reference signal from device B and it will be noticed that the leading edge of the A signal and the trailing edge of the A signal fall within the leading edge and the trailing edge of the reference B signal. The output of exclusive OR gate $502_a$ will thus provide a first pulse at time $T_0$ and a later pulse ending at time $T_3$. These can be called "digital difference" signals, and these are applied through the resistor R ($502_{ar}$) in order to charge the capacitor C ($502_{ac}$). The amplitude detector $507_a$ has been, for example, set to require a threshold voltage of 2.3 volts. And in this case the separation between the pulses starting at $T_0$ and ending at $T_3$ will be insufficient to develop the required 2.3 volt minimum voltage and no output signal will be triggered from the amplitude detector $507_a$ and thus no voltage output signal will be developed from the RS latch $508_a$ (FIG. 2B) and thus the output line (FIG. 2B) of $W_a$ will not signal an error signal and will indicate that the skew is "allowable".

Now, observing the exclusive OR gate $502_b$ in FIG. 2A, it will be seen that the signal from system device A has its leading edge occurring at a time delay later from the leading edge of the reference signal from system B. Likewise, the trailing edges of A and B involve a time delay (skew). The result of this is that output from the exclusive OR gate $502_b$ will now sufficiently charge the RC circuit to provide an amplitude greater than 2.3 volts, which will trigger the amplitude detector $507_b$ and which will cause the RS latch $508_b$ to provide an output voltage which signals an error signal or "non-allowable" skew at the output $W_b$ (FIG. 2B). Likewise, in exclusive OR gates $502_c$ and $502_d$ it is seen that the difference in event occurrence or "skew" are such that the RC circuit is sufficiently charged to trigger the amplitude detectors $507_c$ and $507_d$ which in turn cause a latching of $508_c$ and $508_d$ which provide an error signal output indicating non-allowance skew on the lines $W_c$ and $W_d$.

In FIG. 2A, the second column indicates the "digital difference output" as a result of the "skew" between the two signals and the third column is designated the "analog difference ramp" which indicates the charge developed on the capacitor C. The charge on the capacitor C is dependent upon the value of C and also the value of the resistor R in addition to the pulse widths involved.

Since, in this preferred embodiment, it is designed with a 2.3 volt threshold charge required on capacitor C in order to fire the amplitude detector 507 in order to trigger an error signal, then it is seen that the adjustability of the R and C unit values is part of the capability for selecting when the error signal or "non-allowable" skew will be triggered and when it will not be triggered.

In the preferred embodiment, the value of the capacitor C is maintained at a standard reference value for all the capacitors C (plus or minus 1%) in all the compare circuits. However, the value of the resistor R is made variable and can be adjusted in each of the n circuits and this value will govern the charge on the capacitor C for any given digital difference signal shown in column 2 of FIG. 2A.

For example, if a main bus (M bus) set of line signals from a system device A is to be compared with the M bus signals of a standard reference system device B, the R value can be set at 1100 ohms. And this will allow skew between the two systems (analogous signal lines from system A and system B) up to 100 nanoseconds to be passed as "no error". Since buses have many more switching transients which it is not desirable to be specified as "errors", therefore this permits a wider skew window in order to pass these signals without unneeded error signals.

For example, if it is desired to use the skew comparator system with another unit called a stored logic control and the stored logic control requires that the allowable skew be 40 nanoseconds or less, then in this case the value of resistor R would be set at 360 ohms. In this manner the comparator circuitry can be optimized and adjusted to deal with any pair of analogous lines for checkout purposes.

In FIGS. 2A and 2B the three lower circuits designated b, c, d show "skew differences" that are designated as errors or failures. It may be noted that the RS latch 508 gets set the very first time that the error occurs and will stay set in that condition until an external module (IOMC module 200) resets the RS error latch. The output of any or all error latches (508, FIG. 2B) will trigger a line to the external module (IOMC module 200) which in turn will initiate its own error handling routines which are useful for indicating on a display or printing out data which will be available to an operator who can read and understand what errors are taking place. Thus, each compare card of FIG. 4 has its own particular error line connected over to the external unit (IOMC module 200).

In FIG. 3 there is illustrated a circuit which is actually duplicated n times, or once for each of the 13 compare cards (FIG. 4).

Referring to FIG. 3, it will be seen that the various output lines $X_a$, $Y_b$, Z and $W_a$ (which are output lines shown in FIG. 1B) are directed as input to a source selection multiplexor 580. There are actually 13 such source selection multiplexors ($580_n$) for the 25 or 26 bits of data on each one of the compare cards.

As seen in FIG. 3, the select A and the select B lines to the multiplexor 580 make up the source selection for the "n" number of RS error latches 508 (FIGS. 1A, 2B), for the $X_a$ data from system device A, for the $Y_b$ system data from the system device B, or the Z output of each of the mask registers, whereby the source selection multiplexor 580 provides an output to an output buffer 581. The signals for select A and select B originate from an external module known as the input/output maintenance control module 200 and particularly in that module's switch register.

In FIG. 3 the output buffer 581 places the data contents (which have been selected by the multiplexor 580) onto the comparator out bus COUT BUS $500_{co}$. During any one clock period, only one of the 13 comparator cards can be selected to drive the comparator output bus $500_{co}$, since this bus is shared by all of the compare cards. The data on the comparator output bus can be conveyed to the maintenance processor IOMC 200 for analysis.

Again referring to FIG. 3, the output on the $W_n$ line ($=W_a$, $W_b$, $W_c$, $W_d$, etc.) from the RS error latches $508_n$ are also routed to an error line decoder 590. The circuitry includes "n" number of these decoders for each pair of analogous lines from system A and system B. Each compare card checks for "any error" or "all errors" as information output.

The "all errors" line is used to sense the self test routine to detect conditions during "fail delay" testing where each of 13 skew comparators must indicate an error signal to show that the system is operating properly.

The "any error" line is used in normal operations to indicate the detection of non-allowable skew (error signal).

The "all errors" line is tri-state selectable while the "any error" signal has a separate line from each compare card to the external module (IOMC 200) for error reporting.

It may be noted that it is not necessarily critical to know when the RS error latch $508_n$ was set. This is so because the "any error" line from the 13 compare cards is ORed together in the external module (IOMC 200). This ORed signal is used for error detection and routed to a test point for observation by the technician-operator.

Thus, during a failing loop, the monitoring technician can spot the error line with an oscilloscope and relate the actual failure time to the logic being tested. The IOMC 200 has a "paddle" to which the technician may connect an oscilloscope.

In FIG. 4 there is shown the routing of the CI bus $500_{ci}$ and the CO bus $500_{co}$. There is also shown an isolation card located in a module designated HGMSIMI which serves as isolation for the comparator-in bus and the comparator-out bus in terms of isolating these buses from the data bus 34.

There is also instruction bus (I bus) isolation and miscellaneous control which is provided for the comparator module.

The comparator input CI bus $500_{ci}$ is 13 bits wide and services 13 mask flip-flops on 13 separate compare cards. Additionally, this CI bus is used for maintenance and parameter initialization by the isolation cards of the HGMSIMI 2 and 3 modules.

The comparator output bus $500_{co}$ is 26 bits wide and interfaces the output from any one of 13 selected compare cards onto the D bus 34. One of four source selections is made and is sent via the tri-state control logic 581 over to the comparator out bus $500_{co}$, which may also be seen in FIG. 3.

On the previously mentioned HGMSIMI (global memory simulation card 605) the comparator output bus $500_{co}$ is one of three sources that can be selected to drive the data bus, D bus 34. The other two sources for driving the D bus 34 are the LITERAL register shown in FIG. 4 or the global memory simulator on the isolation card unit 605.

The programmatic comparator tester system was designed to use an internal self-test as the primary means of error detection and fault isolation. The input/output and maintenance control module (IOMC 200) executes the self-test as one of 16 subroutines which are located in its command PROM. The IOMC module 200 contains error detection logic which is used for verifying the self test results and for detecting errors during the actual tests on the devices A and B which are being tested and compared. Successful completion of the internal test as well as the self-test entree at the top of the menu will guarantee the integrity of the tests being done on the B 5900 units (system devices A and B).

Fault Isolation

The following system tools are available for fault isolation:
(a) result status words;
(b) tester dump information;
(c) test point plug-on;
(d) display plug-ons;
(e) B 5900 control panel and the clock control plug-on;
(f) IOMC command PROM information.

Result Status Word

The IOMC 200 module houses a 56-bit result status register 209 which is used to report error and status information. The contents of this register are sent to the dedicated manufacturing system 100 under certain conditions. This may be done at the normal completion of a test; it may be done after an error has occurred and the IOMC has stored the information relating to the failure in the dump buffer; or this may be done anytime the driver system 100 makes a request for a readout (type 4 word).

INPUT/OUTPUT MAINTENANCE CONTROLLER PROCESSOR (IOMC 200)

The functional block diagram of the module known as the input/output maintenance controller processor 200 is shown in FIG. 7. The IOMC 200 module functions basically as the main nerve center of the programmatic tester system. The following items show the major tasks which are performed by the IOMC module:
(a) Generate and decode bi-synchronous protocol; and to handle all data communications with the driver system 100;
(b) To decode data received from the driver system 100 and to perform the required data transfers or commands necessary;
(c) To house and to maintain a 20-bit switch register 205 which controls the static tester operations; this includes the Inhibit Error (IE); the loop; the clock; the voltage margin control; and the comparator display selections;
(d) To monitor all the error conditions within the programmatic tester system. These conditions include the data bus and instruction bus parity error detection from all of the concerned modules; the program (P) register parity errors; the "P" register format errors; the pipeline register parity; the test data buffer parity; the code processor stack overflow; the cable interface error to the devices under test; the data communication interface errors; and all the compare errors detected between the devices under test in the comparator module 500. When one of these errors are detected, the error is captured in the 56 bit result/status register (in the IOMC 200) along with other status and state information pertinent to the "time" of failure. Thus, in FIG. 7 a freeze flip-flop located within the error detection logic 208 is set and is used to accomplish the following functions:
(1) Stops the device under test;
(2) It places the tester system in the "maintenance mode";
(3) Stops the code processor 300;

(4) It captures the tester's counters and registers at the time moment of failure;

(5) It informs the IOMC micro-controller 203 that an error has been detected;

(e) Upon error detection, the IOMC 200 takes control of the tester system and assumes the following operating functions:

(1) It stores all the accessible "states" of the tester system and the devices-under-test away in the area called the dump buffer (DUMP BUF) of the test data buffer in the control interface 400;

(2) It informs the driver system 100 of the error by sending the result/status word with the appropriate error bits being set;

(3) Upon request, it sends the DUMP information to the driver system 100 for use in building the operator-technician's error screen.

(f) The IOMC 200 performs the "self-test" verification of the entire tester system. The self-test operation is done automatically upon "power-up" or by manual IOMC "clear", and it can be done programmatically by the driver system 100 at any time.

DESCRIPTION OF FUNCTIONAL BLOCK DIAGRAM FIG. 7

With reference to FIG. 7, the basic functional elements which make up the input/output maintenance controller processor 200 are shown. The transmit register $201_a$ is a 56-bit register which is used to transfer information to the driver system 100. This register is loaded in two 28-bit parts from the D bus 34. The transmit register is divided into seven bytes which are routed through the OUT MUX $201_d$ and then loaded into the multi-protocol communications controller $201_f$ (MPCC) in order to be sent to the driver system 100.

The receive register $201_b$ is a 56-bit register for storing data received from the driver system 100. This register is partitioned into seven byte locations.

Each byte of data received from the MPCC $201_f$ is loaded into descending bytes of the receive register $201_b$. The byte to be loaded is addressed by the byte counter $201_c$. When a complete word has been stored in the receiver register $201_b$, then the micro-controller 203 does a map entry to the subroutine indicated by the "word-type" in the receive register (bits 55:4). This micro-code subroutine will either move the receive register contents to a designated location in the tester system or else perform a direct command. The following "word types" are used as shown hereinbelow with each word type shown followed by the particular function or command involved:

Word Type 2: To set the interrupt flip-flop in the IOMC 200 module. It is also used to tell the code processor 300 to stop looping a test dish.

Word Type 3: To clear the tester and load the receive register 19:20 into the switch register 205.

Word Type 4: This sends the result/status register 209 contents to the driver system 100. The driver system uses this command during a test loop in order to monitor the status of the tester system and the devices under test.

Word Type 5: This loads the buffer address register (408, FIG. 11C) in the control interface module 400 with data from the receive register $201_b$, the data being at bits 11:12. This sets a starting address for loading test dish data over to the test data buffer (401, FIG. 11C) or microcode to the microcode RAM (301, FIG. 8A).

Word Type 6: This causes the IOMC 200 to capture all accessible states of the tester system and the devices under test and to store this data in the "DUMP BUF" area of the test data buffer (401, FIG. 11C) and sends the result via the "tester dump" subroutine.

Word Type 7: This performs "self-test" on the tester system via the "self-test" subroutine.

Word Type 8: This moves the receive register $201_b$ data 55:56 over to the test data buffer 401. This is called the "IPW" or indirect program word subroutine.

Work Type 9: This moves the receive register data 55:56 over to the test data buffer 401, as part of the routine called the "BUF/Data/Word".

Word Type A: This causes the tester system to send a "null" message (STX/ETX) for test purposes.

Word Type B: This causes the tester system to send the received word back to the driver 100 for test purposes.

Word Type C: This is the RAM micro-word. It moves the receive register data 55:56 over to the code processor 300 and into its micro-code RAM (301, FIG. 8A).

Word Type D: This command is "read buffer". This sends a number of test data buffer words into the receive register at 31:12, starting at the address in the receive register 11:12 and thence over to the driver system 100. The last word sent is the contents of the result/status register 209.

Word Type E: This command is "set switch register". This loads the switch register 205 (FIG. 7) from the receive register data bits 19:20.

Word Type F: This is the "direct program word". It loads the program register 305 in the code processor 300 from the receive register bits 55:56, and sets the program-register-occupied flip-flop in the code processor 300.

It may be noted that the words of type 0 and 1 are the tester subroutines called "initialize and idle" respectively and they are non-valid types in data communication transmissions.

Referring to FIG. 7, the byte counter $201_c$ is preloaded by the micro-controller 203 via bits 2:3 of the maintenance data bus MNTD and the OUT MUX $201_d$. The byte counter $201_c$ is operated in the count-down mode and the output is decoded by decoders (3 line - 8 line). These decoders address one of seven byte locations in the transmit register $201_a$, in the receive register $201_b$, and the result status register 209.

The OUT MUX $201_d$ is an eight bit wide multiplexor operating on a 4-1 line basis (four inputs and one output). It is used to route data for hardware initialization and data communications. The data sources for the OUT MUX $201_d$ are as follows:

(a) The addressed byte of the transmit register $201_a$;

(b) The addressed byte of the result/status register 209;

(c) The eight-bit input/output register 206;

(d) The selected input from the IN-MUX $201_e$ which is the data received from the MPCC $201_f$ or the maintenance data bus from the micro-controller 203.

In FIG. 7 the IN-MUX $201_e$ is an eight bit wide multiplexor of the 2-1 configuration. It is used to select an input or to initialize data from either the MPCC $201_f$ or from the maintenance data bus MNTD of the micro-controller 203.

In multi-protocol communications, controller MPCC 201$_f$ is a monolithic n-channel MOS LSI circuit which formats, transfers and receives synchronous serial data while supporting bit-oriented or byte control protocols. The chip is TTL (transistor type logic) compatible, and operates from a single five volt supply. It can interface to a processor with an eight bit or a 16 bit bi-directional data bus. In application to the programmatic tester system, the micro-controller 203 interfaces the MPCC 201$_f$ in the eight-bit mode via the maintenance data bus MNTD, the IN-MUX 201$_e$ and via the OUT MUX 201$_d$.

The input/output register 206 is an eight bit register which can be parallel loaded from the OUT MUX 201$_d$. It can also be serial loaded from the CRC checker generator 201$_g$ in order to send generated CRC code at the end of a message. The I/O register 206 can be serially shifted out into the CRC checker generator 201$_g$ for checking or generating CRC codes. The I/O register 206 is also used in conjunction with the I/O comparator 207 for character recognition on the incoming data from the driver 100. This is done to verify the bi-synchronous line protocol.

The input/output comparator 207 is an eight-bit comparator circuit that compares the contents of the I/O register 206 to a value supplied by the micro-controller 203 over the maintenance data bus MNTD. The result of the comparison was sent back to the micro-controller 203 as a test condition (IOCOMP=) for subsequent decision making. The main use is in the execution of the bi-synchronous data communications protocol.

The CRC checker generator (cyclic redundancy code) 201$_g$ is used to check the cyclic redundancy code at the end of a message to ensure the validity of the data. In the transmit mode, it generates the 16-bits of CRC which are appended to the end of the message for the receiving stations verification. The CRC checker/generator 201$_g$ is used in conjunction with the I/O register 206 which serially shifts data "in" (for checking or generating) and "out" (for transmitting the generated cyclic redundancy code).

The Flag RAM 201$_h$ is a 1024 by 1-bit static RAM (random access memory). It may be used by the micro-controller 203 to remember events pertaining to the bi-synchronous line protocol and error handling procedures. It is written into by the micro-controller 203 via the maintenance data bus MNTD, via the IN MUX 201$_e$ and the OUT MUX 201$_d$. The read output goes back to the micro-controller 203 as a test condition.

In FIG. 7 the stack history 202 logic records the macro-entry addresses as they are pushed into the code processor 300 into the stack file (type AMD 2909). The stack file in the type 2909 is not normally visible for problem analysis. The 2909 has a 4-deep stack, and the stack history logic records each address as it is pushed into the stack and allows the unit 2909 to go four levels deep. Each time a POP (return) is performed, the stack history pointer is decremented. If the 2909 attempts to go five deep, then a stack overflow error is recorded in the result status register 209 so that the tester system and the units under test are "frozen" and then a tester "dump" is performed. The stack addresses and pointer are stored in the dump for later analysis.

The micro-controller 203 is basically the only intelligent logic used in the tester system when the system is first powered on. The various sections of the micro-controller 203 consists of the following:

(a) a 2,048 word by 56-bit command PROM;
(b) a 56-bit command register;
(c) a command parity checker;
(d) a 48-bit test condition selector;
(e) an AMD (American Micro Devices) 2910 microcode sequencer;
(f) Map entry and entry vector (manual entry) logic;
(g) control panel logic for manual entry, force step, cycle, and clear commands.

The micro-controller 203 executes all the IOMC functions. Under error conditions or under "self-test", it controls all the logic in the tester system. The micro-controller's command PROM is divided into 16 subroutines. Each of these subroutines is designed to perform the requirements of a particular word type as it is received from the driver system 100. When the tester system is first powered up, then the subroutines 0 (initialize) is entered and executed. After initializing the tester system's registers, and writing No OP code in the code processor's micro-code RAM, and after writing zeros in the test data buffer 401, the micro-controller 203 branches to subroutine 7 ("self-test").

Upon completion, the "self-test" subroutine branches back to subroutine 0 (initialize). After re-initializing the tester system, this subroutine checks to see if the self-test has been done. If the self-test has been done, it checks to see if the self-test was done manually (power-up clear or IOMC clear) or was done programmatically (type 7 word received from the driver system 100).

If the self-test was programmatic, then subroutine 4 (send result/status) is executed; otherwise, the subroutine 1 (idle) is branched to. The "idle" subroutine handles all incoming communications on the bi-synchronous data communications line. Three conditions are monitored during "idle", and these conditions are:

(a) data available test condition from the MPCC 201$_f$. This indicates that incoming data on the line must be handled;
(b) the Send result/status flip-flop being "set" by the code processor 300. This indicates the completion of a test dish;
(c) the "freeze" flip-flop setting to indicate an error has already occurred and a "tester dump" (subroutine 6) must now be done.

The instruction bus control and command decode logic 203$_a$ is used to receive and execute certain of the instruction bus commands (I bus 23) from the code processor 300 and to decode and execute commands directly from the micro-controller 203. During maintenance mode, and self-test mode, the code processor's I bus (23) drivers are turned off and the I bus is used directly by the micro-controller 203 to perform the required tasks on all modules.

In FIG. 7 there is seen the control and status latches 203$_b$. These are controlled by the I bus 23 and the micro-controller 203. They are composed of latch flip-flops that control various status and mode conditions enumerated hereinbelow:

(a) IOMC busy flip-flop;
(b) processor busy flip-flop;
(c) send result flip-flop;
(d) interrupt pending flip-flop;
(e) maintenance mode flip-flop;
(f) self-test flip-flop;
(g) inhibit error flip-flop;
(h) end of transmission flip-flop;
(i) transmit register empty flip-flop.

The control panel, designated 204, has manual controls for entering the IOMC PROM subroutines and for entering data for maintenance purposes. It contains a 12-bit maintenance register with manual load controls, a display A/B switch for selecting between two sets of display information on the IOMC display plug-ons, general clear buttons and IOMC clear pushbuttons, an enter button for entering a IOMC subroutine as addressed by the maintenance register, a force-step pushbutton for stepping through display and input sequences for maintenance purposes, a local/remote switch, an inhibit error switch, and a cycle switch that cycles repeatedly through all command PROM addresses in order to check for defective PROMs.

In FIG. 7, the switch register 205 is a 20-bit register that controls static functions within the tester system and the devices under test. This register is parallel loadable from the bits 19:20 of the data bus 34 (D bus).

The error detection logic 208 is a gating tree of all the error conditions. It is controlled by the inhibit error switch on the control panel 204, and by the inhibit error flip-flop in the status and control latches; also by the inhibit error and inhibit compare error switches in the switch register 205. When an error is detected, the freeze flip-flop in 208 is set and operates as a test condition to the micro-controller 203 to take the proper action for recording the error.

The parity checker/generator $208_a$ is a logic unit which checks the D bus 34 for proper parity on IOMC module transfers and generates the correct parity for data being driven on the D bus 34 by the IOMC module 200. A detected error will be sent to the error detection logic 208 for reporting as an error signal.

The result/status register 209 is a 56-bit register that is used for constantly monitoring error, status and state information. When an error is detected by the error detection logic 208, the present error, the present status, and the present state information is captured in this register for reporting to the driver system 100.

Self-Test Routine: The self-test subroutine calls 12 individual test macros that are dedicated to checking specific areas of the tester. The names relate to the test area which is intended to be tested. The following list shows the 12 macros in the order in which they are used:
(a) flag RAM test;
(b) I/O test 1;
(c) I/O test 2;
(d) DC/main test-data comm maintenance test;
(e) event flip-flop test;
(f) event counter test;
(g) event compare test;
(h) control interface module register test;
(i) control interface module-counter test;
(j) buffer test;
(k) RAM test;
(l) comparator test.

The self-test is basically a confidence test when executed by the driver system 100. When used locally from the control interface module control panel, it is a diagnostic tool for repairing faults. To run a self-test, the two devices A and B (in this case B 5900's) must be connected and powered on. Then by pressing the clear button, the IOMC will cause a run of the self-test and get the system in the idle loop so that communications with the driver system can begin.

CODE PROCESSOR 300

Figure 8A:
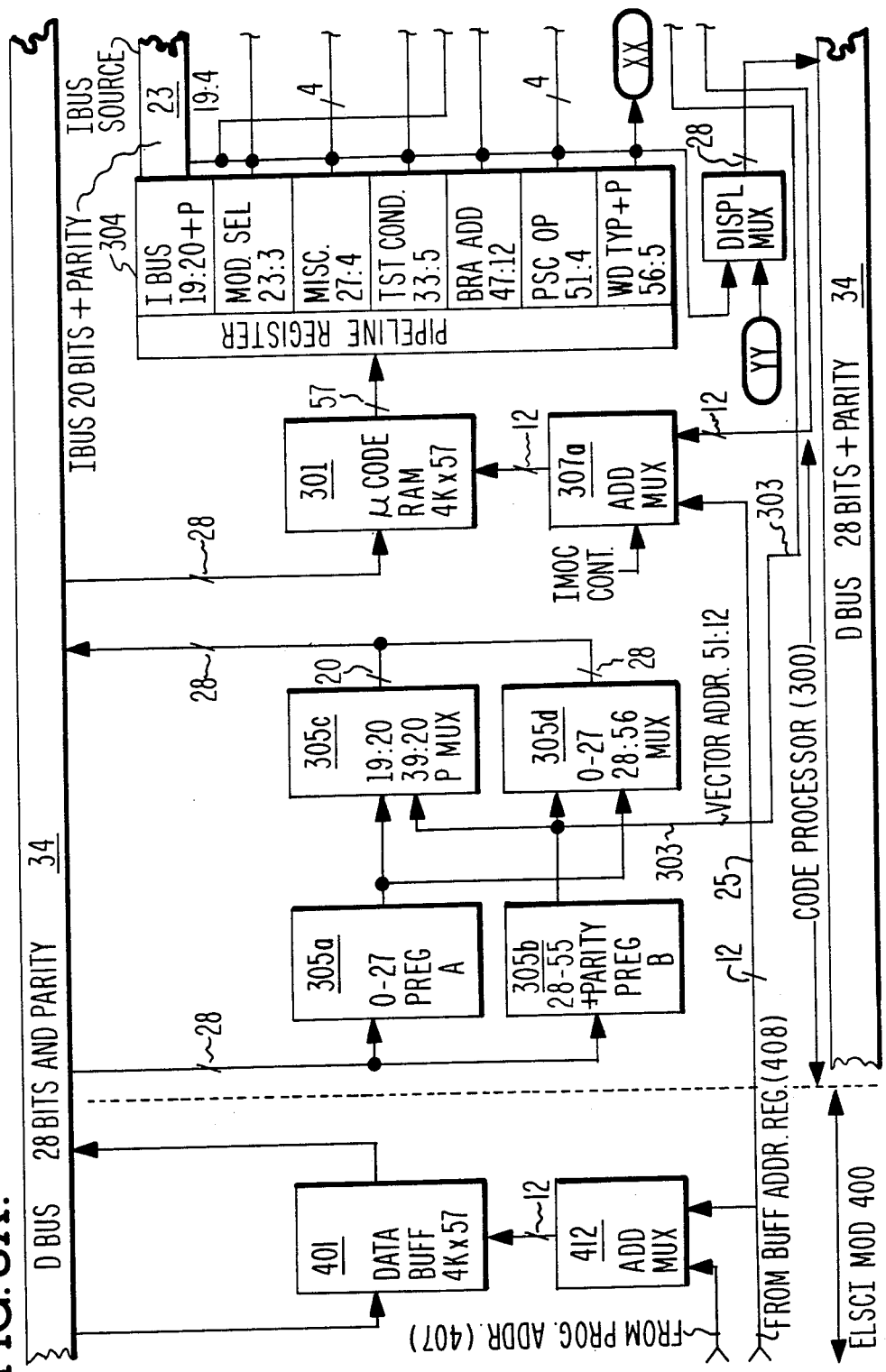

The code processor 300 is shown in two drawings FIGS. 8A and 8B. These two drawings are such that the right hand margin of FIG. 8A is continued onto the left hand margin of FIG. 8B.

It should be noted that the left hand side of FIG. 8A has a dotted line which separates the figure in order to show the interconnection of two units which reside on the controller interface module 400, these units being the data buffer 401 and the address multiplexor 412.

The primary function of the code processor 300 is to execute test case routines that were sent from the dedicated manufacturing system 100 via the input-output maintenance controller processor 200. The other modules in the tester are used to help the processor 200 to do its job. Each of the individual modules are designed to execute a specific function in the realm of testing a particular type of digital electronic device having output signals which can be tapped for testing.

The hardware functions to be executed in the programmatic comparator tester system are stored in a write/read RAM memory 301 shown in FIG. 8A. This memory can hold up to 4096 words. The data is written in in such a way that when it is retrieved, it will execute a logical operation in the programmatic comparator tester system. The data that executes these logical functions is generally known as a "subroutine".

Subroutine entry addresses are part of a "direct" or an "indirect" program word. Direct program word commands are initiated by the dedicated manufacturing system DMS 100 and are used for directly controlling the individual digital module reference 6A or 6B or else the entire programmatic comparator testing system. The modules 6A and 6B are often referred to as system "A" and system "B" or unit "A" and unit "B".

Indirect program words (IPW) reside in the data buffer 401 of the controller interface module 400 as shown in FIG. 8A.

As few as one IPW and no data literals may make up a test dish which is a test case routine. A maximum "test dish" may have up to 2,400 IPW's and 80 data literals.

The program register 305 supplies the starting address of a subroutine in the microcode RAM 301. In addition, it contains two 20-bit data fields known as PREGP1 and PREGP2. These data fields can be used in various ways by the executing subroutine. A "type" field is also supplied in the program word. It indicates if it was a "direct" or an "indirect" program word. Finally, the parity bit indicates "odd" parity for the 56 bits in the word.

The program register 305 is made up of two 28-bit fields, these are the PREG "A" of element $305_a$ and the PREG "B" of $305_b$. The input is the D bus 34. The data for the PREG comes from the data buffer 401 or from the receive register $201_b$ in the IOMC 200 module.

In either case, the data is loaded consecutively into PREG B and then PREG A. When the loading of the PREG A is completed, then parity on the word is checked and validated with the flip-flop PROF (P register full or occupied). PROF is also used to gate out the parity error line to the IOMC module 200.

There are two types of display multiplexors for the PREG $305_c$ which is used to transfer PREG P1 bits 39:20 or PREG P2 bits 19:20 over to the D bus 34 in a format which is usable by all of the modules.

The display multiplexor $305_d$ transfers the bits 27:28 or bits 55:28 to the D bus 34 via bits 27:28. The display multiplexor $305_d$ displays the whole word where the unit $305_c$ only displays the two data fields. The bits 51:12 (entry vector address) line 303 is always connected to the parameter select logic 302, FIG. 8B.

Referring to FIG. 8A, the microcode RAM 301 and the data buffer 401 are made of identical boards. Thus, these two cards are interchangeable with each other. The microcode RAM 301 is for use of the processors as a "read only memory". It gets loaded initially with data from the module 200 which will do an initial load of the microcode for the RAM. After this occurs, then code data is only fetched from this particular RAM.

The output of the RAM is 56 bits plus parity. This information is loaded into a 56 bit plus parity pipeline register 304 shown in FIG. 8A. The register 304 checks the parity on the loaded word and reports errors to the maintenance controller module 200. The purpose of the pipeline register 304 is to control the hardware function within the tester. There are several control fields in the pipeline register 304. These are:

(a) The instruction bus bits 19:20 plus the parity bit which involves control information from the tester modules. In some instances it is useful to be able to generate a "literal" data value in conjunction with the microcode. Thus, the literal register 308 (FIG. 8B) allows this to be accomplished. The literal may be 20-bits (the width of the I bus), and by the selection of MOD 5 through the module selection register $304_b$, FIG. 8B, the I bus field is transferred to the data bus 34 (D bus) on the next clock for the use of a new I bus command.

The I bus field bits 19:4 are also routed to the compare card decoder $304_c$, FIG. 8B. The 16 output lines are clocked into the compare card select register $304_d$. During the selection of the comparator module 500, one of the 13 compare cards may be selected to respond.

(b) The module select field is bits 23:3. These three bits go to the module decode logic which clocks the module select register $304_b$ and selects one of eight lines. The particular module selected will respond to the I bus field for control and to the D bus 34 for information.

(c) The miscellaneous control field is primarily for the processor and the symbol (ww), FIG. 8B, depicts this control where bit 24 is the program register mode; and bit 25 is the load transmit register in the module 200.

There are two bits which work in conjunction with each other and these are bit 26:—which enables the P register to the D bus and bit 27:—which selects the PREG P1 or PREG P2.

(d) The test condition bits 33:5 represent a five bit address field which selects one of 44 lines in the test condition selector $309_c$. The test condition logic also has a D bus PROM $309_b$ which reports if or whether the D bus has 12, 16, 20 or 28 bits that are "0". This feature allows any of the above listed bit size registers to be checked for zero when its contents are placed on the D bus.

(e) The branch address field bits 47:12 (of register 304) is the next address that the microcode RAM will go to, provided it is not an entry to a new subroutine. The branch address is routed to the parameter select logic 302, FIG. 8B, which is controlled by the PSC (program sequence control) bits 51:4. The four bits of the PSC OP are sent to a control PROM $309_a$. The control PROM $309_a$ makes the actual selection of the Pipe or the Map address of parameter select logic 302 in order to input to the program controller 307. The program controller 307 has a four deep push-pop stack for calls within a subroutine. The "present address" is also stored in the microcode save register 306 which is sent to the maintenance controller module 200 where a stack history file is kept. The output of the present address, line $307_b$, is also routed to the address multiplexor $307_a$ which has an output that points to the "next address" in the microcode RAM.

During writing of the RAM 301, the maintenance controller module 200 controls the address multiplexor 307 and uses the address line 25 from the buffer address register 408 in order to increment the RAM 301.

In FIG. 8B the line $309_d$ is the actual test condition line from the select logic $309_c$. It is the result of a line which the processor has examined and based on the result "the test condition $309_d$ being true or false" such that the processor will continue on the same line of code or else branch to another area of code.

(f) The "type" decode bits 55:4 which describe the information to the microcode word with a "C". Bit 56 is the parity bit for the word in the pipeline register 304 of FIG. 8A. The pipeline parity error is reported to the input-output maintenance controller processor module 200.

The output of the pipeline register 304 may be displayed back outward on to the D bus 34. The line yy (FIG. 8A) which provides an input to the display multiplexor in FIG. 8A is another selection of processor hardware which is to be displayed. Thus, it is possible to display the module select register, the comparator card select register and miscellaneous control registers, which is valuable to the operator-technician for diagnostic information.

EVENT MODULE 350

Figure 9A:
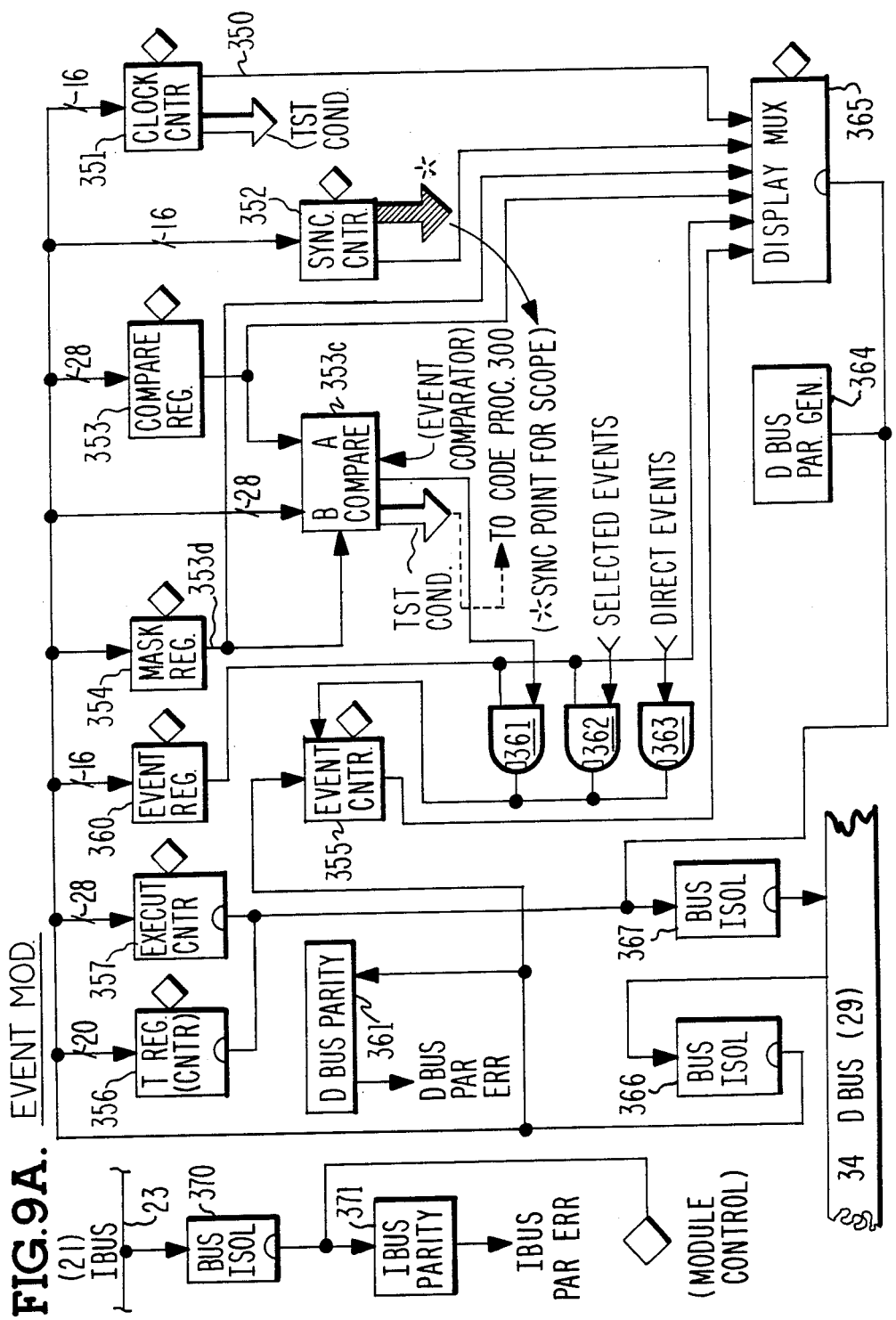

A block diagram of the event module 350 for the system programmatic comparator is shown in FIGS. 9A and 9B. The event module includes an event comparator $353_c$, an execution counter 357 and a T register 356 which have parts located on a display card TAA 31. The primary functions of the event module are:

(1) To generate synchronization pulses for failing test cases;

(2) To use the event comparator $353_c$ for logical compare operations by the input-output maintenance controller, IOMC 200, or code processor module 300;

(3) To utilize the event count and the control logic in subroutine executions;

(4) To make use of scratch registers by the processor subroutines.

All of the inputs and outputs of the registers and counters in the event module 350 will have access to and from the D bus 34.

Similarly to the control interface module 400, here, likewise, all registers and counters can be transferred from within the event module 350 on to another module via the D bus 34. The control functions for the event module come from the code processor 300 or from the I/O maintenance controller (IOMC) 200 module.

With the module select number 4 (derived from code processor 300), the event module 350 responds to the instruction bus (I bus) 23 control bits for all its execution functions with the exception of some direct control functions from external sources or other commands from the code processor module 300.

In most cases, the control for the registers and the counters are independent bits from the I bus 23, thus allowing multiple tasks to be performed with one command.

PRIMARY TASKS OF THE EVENT MODULE 350

(1) To generate synchronization pulses for "failing test" cases: one advantage of the programmatic tester system over other test methods is the possibility of generating a synchronization pulse for the technician's oscilloscope in a "failing test" dish. The synchronization time in relation to the time the failure was detected is "settable" in the "driver program" from the dedicated manufacturing system (data base 5, driver system 100, and technician's terminal 7).

The event module 350 has a 16 bit count-up counter 351 in FIG. 9A.

The code processor module 300 first clears and then "arms" this counter 351 prior to executing the first subroutine in a test dish. Once the counter 351 is armed or loaded, it will count-up "once" every time a tester clock is seen. If no failure was detected in a test dish, then this counter serves no significant purpose.

However, in the case of a "detected compare failure", the IOMC 200 module will "remove" the clock (freeze) from most of the counters and registers in the tester for the purpose of capturing the "machine state" at the moment of the failure time.

For the clock counter 351, its contents are also "frozen". The IOMC 200 module has now taken control of the tester system and stores its contents away in the buffer memory (401 of FIG. 11C) of controller interface module 400.

The dedicated manufacturing system (5, 100, and 7) or DMS is thus informed by the IOMC 200 module that an "error" has occurred and that the tester contents are available to be read. When the DMS 100 reads out the contents of the buffer memory 401, the value in the clock counter 351 is thus remembered.

At the time that a dish is to be looped, one of the requirements is that there be a value for the synchronization counter 352 (FIG. 9A), in the event module 350. The synchronization counter 352 is a 16 bit count-down counter; and when at 0, it generates a synchronization pulse.

The driver program for the event module 350 has optional settings for a "plus or a minus" synchronization value from the point or moment of failure. The synchronization count is "n" percent of the clock counter 351 value ahead or behind the time of failure. For example, if the test dish which failed had a clock counter 351 value of 10,000, the synchronization signal should normally come before the failure; therefore, if a fixed percentage of 10% is selected and a "minus" is set, the synchronization count which is lowered into the synchronization counter 352 will be 9,000.

Everytime the programmatic tester goes through a loop on that "failing dish", the synchronization signal used to trigger the technician's oscilloscope for diagnosis is generated 1,000 clocks before the failure point. It should be noted that the failure is at clock 10,000 which was recorded earlier in the "original failure" moment.

The synchronization pulse has a duration of one clock period. It has "sinks" or connections to a "test point paddle" on the IOMC 200 card and also to the event module 350.

In most cases the test dishes are less than 65,000 clocks long. If the clock counter 351 overflows (that is to say more than 65,383 clocks), then that condition is sent to the IOMC 200 module as a "result status bit" for the dedicated manufacturing system (5, 100, and 7).

For test dishes that exceed 65,000 clocks, the synchronization mechanism still functions but only at some arbitrary point in the loop. The code processor module 300 provides for other synchronizing generation alternatives.

(2) The use of the event comparator $353_c$ for logical compare operations: the event comparator 353 provides an important function to the operation of the tester system. The IOMC 200 module uses this comparator 353 extensively in the self test mode where expected results from the various registers and memories are compared.

Processor subroutines may use the comparator in capturing the B 5900 (module being tested) machine state for one or another given reference, for example, comparing a stored logic control (SLC) address which performs a specific hardware function. When the stored logic control address appears to be tested for comparison, the module being tested (B 5900) may be "frozen" and its state may be read out by the tester system and sent to the dedicated manufacturing system DMS for analysis.

The event comparator system consists of three primary elements which are:
  (a) the mask register 354 of FIG. 9A which is a 28 bit register;
  (b) the compare register 353 of FIG. 9A which is also of 28 bits; and
  (c) the compare element $353_c$ which is also used to hold 28 bits.

With the mask register 354, any combination or all bits may be masked. The purpose for the masking is to "void" areas on the D bus 34 which are not desired or wanted for application on a particular compare period.

The compare register 353 contains the bit pattern which is to be compared. This is seen in FIGS. 9A and 9B at the line $353_d$. The line $353_d$ represents 28 mask lines for controlling the D bus 34 through the AND gate $353_b$ and into the B port of the comparator $353_c$ and the compare register lines through AND gate $353_a$ into the A port of $353_c$.

In FIG. 9B there is seen the line $353_e$ which is the "compare=" term which is a "test condition" to the processor and also the input to the gate 361 of FIG. 9B in order to provide a selectable "OR" condition to the event counter 355 on its decrement line.

(3) Handling of the event count and control logic: the event count and control logic consists of the event register 1, $360_a$, and also the event register 2, $360_b$, and also the event counter 355. The event counter 355 is a 16 bit count-down counter used by various multiple sources for decrementing a pre-loaded value down to 0. The 0 value in the counter is a "test condition" to the code processor 300 for signaling that the "event" has occurred. There are eight lines which make up the decrement tree for the event counter 355.

Figure 9C:
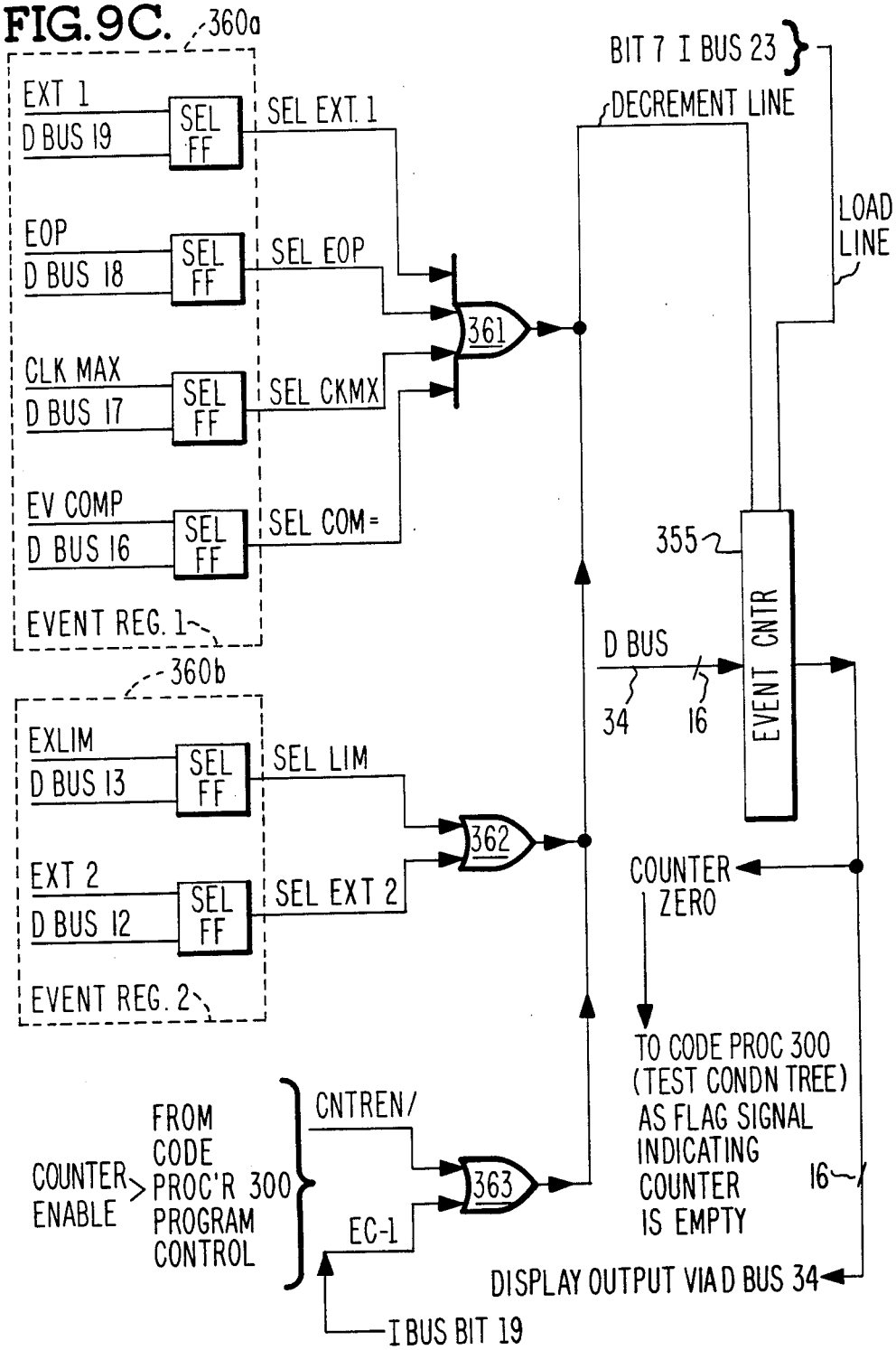

Referring to FIG. 9C in which the event register 2 is shown as $360_b$ and also there is shown the event counter 355, it will be seen that the line CNTREN/ is used by the processor module 300 in order to count clocks in a given subroutine. For example, a shift register in the module being tested (B 5900) has 52 bits. For the tester system to write this 52 bit "snake", a value of 52 would be required to be placed into the event counter 355. The microcode word in the subroutine that does the "register write operation" would not change until the zero line from the event counter 355 reported that "the register is zero".

While the "write register" microcode word is active, the processor uses the CNTREN/ line in order to decrement the event counter 355. After 52 decrements, 52 bits from the MREG would be shifted into the selected register in the module being tested (B 5900).

Regardless of what element decrements the event counter 355 down to zero, the key here is that the processor 300 looks at the test condition (FIG. 9B) which asks "is the event counter 355 empty or not". Here logical decisions are made on what the code processor 300 sees when the event counter 355 is "tested".

If the counter 355 is not empty, the processor 300 goes back and repeats whatever routine was just being completed. A decrement occurs by a selected decrement line and the processor tests the counter again, repeating this operation until the counter is empty, at which time the processor may then go on to another routine.

In the case where the CNTREN/ line is used, the processor 300 executes a given microcode word while decrementing the counter and testing it continually for "0". Based on the pre-load of the counter, a microcode word in a subroutine may be executed for as long as 65,384 clocks, if all the 16 bits were pre-loaded.

In FIG. 9C it is seen that the EC-1 line to AND gate 363 is enabled with the instruction bus (I bus) bit 19 and with the MOD select SEL number 4. This command is part of a subroutine.

The line designated SEL EXT 1 is an external line meaning it can be used for anything that serves the purpose of finding a problem. EXT 1 is qualified with a data bus 34 (D bus) bit 19 flip-flop which is placed in the event register No. 1, 360$_a$.

The line SEL EOP comes from a selected module to be tested (B 5900). The line is active when the module to be tested (B 5900) has completed the execution of an operator. It means that it is possible to look at "n" number of operators based on the value that was pre-loaded into the event counter 355, then stop and capture the result in a selected test module.

The line EOP is one that is qualified with the data bus D bus 34 bit 18 flip-flop in the event register No. 1, 360$_a$.

The line designated SEL CKMX was used during the development of the tester. The line CLKMAX is a qualified one with bit 17 of the data bus 34 (D bus) flip-flop which is in the event register No. 1, 360$_a$.

The line SEL COM= is used to indicate that when a compare function was equal, then that line is active. When used with the event counter 355, "n" number of compares have to occur for the value in the counter to establish completion.

The line EVCOMP is qualified with bit 16 of the data bus 34 flip-flop in the event register 1, 360$_a$.

The line designated SEL LIM is a flag from the execution counter 357 (FIG. 9A), which tells whether the counter is either going to MAX or a zero depending on the direction which was selected. The maximum count of the execution counter 357 is 1,048,576. By using the flag from the counter to decrement the event counter 355 (FIG. 9B), very large count values can be achieved by "wrapping" the execution counter around for the number of times specified by the value in the event counter 355.

In FIG. 9C the line EXLIM is qualified with bit 13 flip-flop of the data bus 34 in the event register 2, 360$_b$.

The line designated SEL EXT 2 is an "external line" which means it can be used for anything that serves the purpose of finding a problem. EXT 2 is qualified with the bit 12 flip-flop of the D bus 34 which resides in the event register No. 2, 360$_b$.

(4) Use of scratch register by processor 300: there are two counters in the event module 350 that are required by the processor 300 for use in "nested loops" or for temporary storage: (i) the T register 356 in FIG. 9A is a 8-bit count-down counter; (ii) the execution counter 357 of FIG. 9A is a 20 bit count-up, count-down counter.

General data flow in the event module 350: the instruction bus, I bus 23, is isolated by means of the element 370 of FIG. 9A. If errors are detected, they are reported to the IOMC module 200 as hardware errors. The D bus 34 is received and isolated with tri-state element such as 366 in FIG. 9A. The bus is sinked by all the registers. The D bus 34 is checked for parity with element 361 of FIG. 9A. Here, the error reporting mechanism is the same as in the instruction bus 23.

The I bus 23 (instruction bus) parity is checked on the parity-tree element 371 of FIG. 9A. If errors are detected they are reported to the IOMC module 200 as hardware errors.

The display path for most of the registers involved is through the display multiplexor MUX 365 of FIG. 9A and the isolation element 367 of FIG. 9A.

The parity generator 364 of FIG. 9A will generate the proper parity for the data that is sent to the D bus 34.

If the operation is a register transfer, then the data is sent on the data bus 34 and received with use of the tri-state element 366 of FIG. 9A and loaded into the assigned register.

CONTROL INTERFACE MODULE 400

It should be understood that the control interface module 400 is a "variable" type unit and is conditioned to have a design which is suitable for the types of digital standard reference module and digital module to be tested in any given case. In the present embodiment a description will be given of one particular type of control interface module, that is to say the type of module that is used with the testing system when tests are being made of a Burroughs B 5900 computer system. Thus, a standard reference B 5900 computer is used for device 6A while the module to be tested is a B 5900 computer system which is to be checked out and is designated as device 6B (FIG. 5).

Hereinafter certain references which are made to "ELS" (Entry Level System) are used to refer to control interface module 400 and its control relationship to the Burroughs B 5900 computer which in the described embodiment are as the digital units 6A and 6B of FIG. 5.

FIG. 11A shows the hardware functions of a maintenance processor card in a B 5900 unit. The idea here was to execute the same operations as the maintenance processor card at the same system speed with improved flexibility. Another primary factor was the ability to use and compare certain control lines and data buses. With these features involved, it gives the programmatic tester system total control over the B 5900 units for every clock period in the operation.

The following description of the control interface module 400 (for use with the B 5900 computer testing in this particular embodiment) will encompass a number of figures which are designated FIGS. 11A through FIGS. 11I, in addition to indicating dependencies with other modules in the programmatic tester system.

The control interface module 400 responds to instruction bus (I bus 23) commands from the code processor module 300 or the maintenance controller processor module 200, FIG. 6. Data for the control interface module 400 is from the test data buffer 401, FIG. 11C, directly via the D bus 34 (see FIG. 11A) with the element ELSCI1/TAA26. The source of this data is from the code processor module 300 (in the P register P1 and the P register P2) or from the B 5900 data via the comparator module 500.

When it is handling the control operations, the input-output maintenance controller processor IOMC 200 (FIG. 6) module sends data from its receive register to the control interface module 400 by means of the data bus 34 (D bus).

Data may be loaded into the M register 407 from the selected Fm bus 402 by means of the cable interface.

Figure 11C:
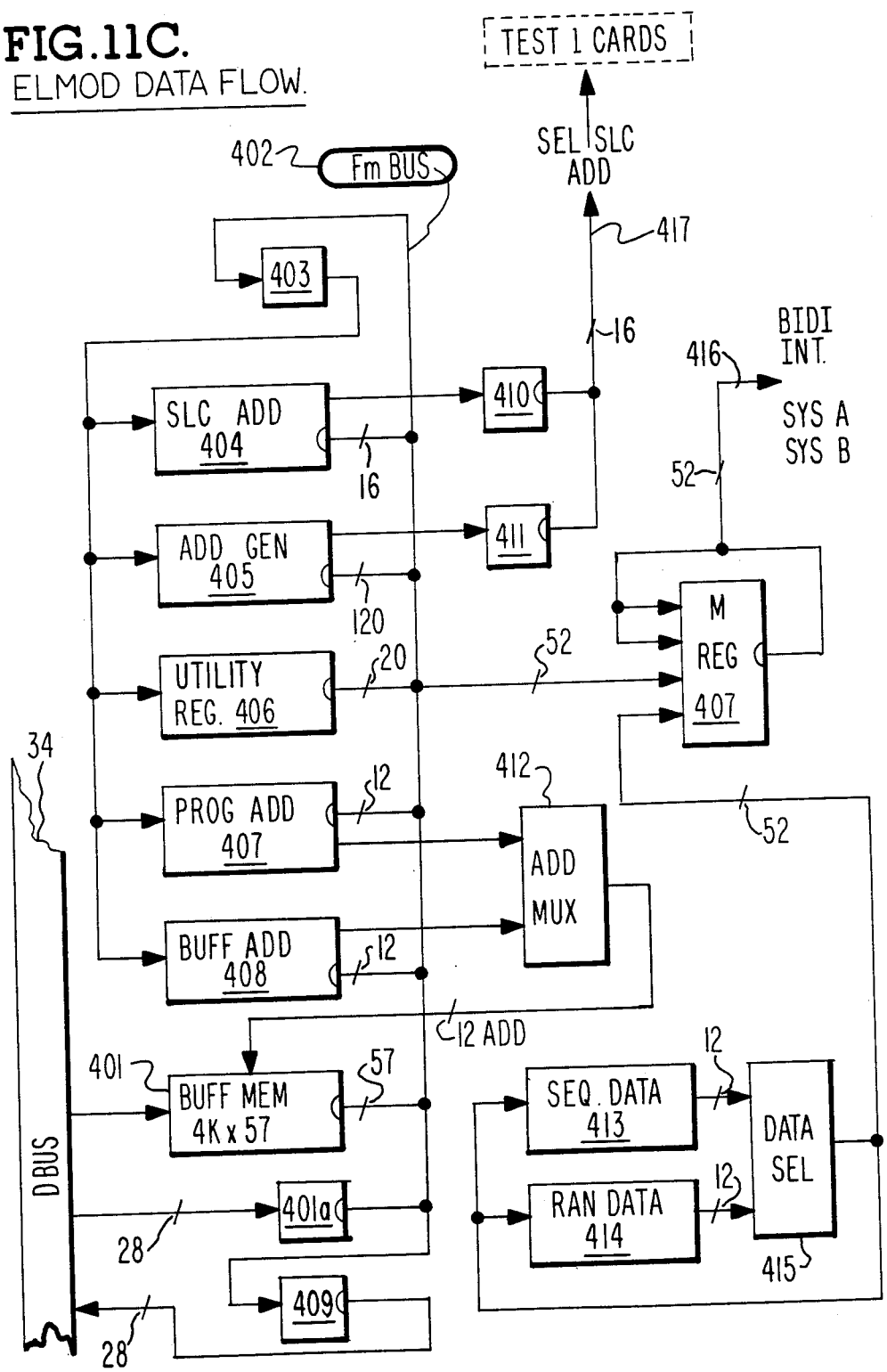
FIGS. 11C, 11D, 11E, and 11F show a block diagram of the control interface module.

The M register 407 of FIG. 11C can also be serially loaded by a read operation of a selected maintenance chain (snake) in either the B 5900 computer device A or device B.

There are two identical read/write memory boards in the tester system—one is in the code processor module 300, and the other is in the control interface module 400 at the location TAA26 shown in FIG. 11A. This location of ELSCI1 is shown as buffer memory 401 in FIGS. 11A and 11C.

The primary buffer memory 401 is used to store test case data and "literal" data plus IPW (or indirect program words) for subroutine execution out of the code processor module 300 and the "always" conditions required for the tester software. This is shown in the buffer allocations of FIG. 11C.

Data for the buffer memory 401 comes from the data bus 34 (D bus). Since the buffer memory is 56 bits wide (plus parity bit), and the D bus is only 28 bits wide, then two write cycles must be performed for any given address. In FIG. 11C the buffer address register 408 is a 12 bit (4K) count-up counter on the card designated TAA 25 (ELSCI2) of FIG. 11A. and this buffer address register is used for all buffer write and for most buffer read operations as is indicated in FIG. 11C.

Buffer write operations are initiated by the maintenance controller 200 module for self test purposes, for data or code initialization, and for tester dumps. The code processor module 300 may also write the buffer memory 401 during subroutine executions. The buffer memory control is initiated on the card marked TAA 23 (ELSCI4) of FIG. 11A.

In FIG. 11C the output of the buffer memory 401 is connected via a foreplane to the card designated TAA 25 (ELSCI2) shown in FIG. 11A, where it is made into a selectable source to the Fm bus, shown as element 402 in FIG. 11C.

The Fm bus 402 of FIG. 11C is 56 bits wide and located on the cards ELSCI2 and ELSCI3 of FIG. 11A. The outputs of the buffer memory 401, the SLC (stored logic control) address register 404 (of FIG. 11C), the address generator 405, the utility register 406, the program address register 407, and the buffer address register 408 are all tri-state ORed into the Fm bus (FROM bus).

Any of the above listed registers can be transferred to the TO bus 400B by means of the isolation buffer 403 of FIG. 11C. The Fm bus also inputs to the M register 407 or else it can drive the D bus 34 via the isolation buffer 409. The Fm bus 402 also receives data from the D bus 34 by means of the isolation buffer 401$_a$ for transfers over to the TO bus 400B or to the M register 407.

M REGISTER: It should be noted in FIG. 11A, that all control signals for the cards ELSCI2 and ELSCI3 will originate on the card ELSCI4.

In FIG. 11C the SLC address register 404 is a 16 bit count-up counter. One of its outputs via isolator 410 is tri-state ORed with one output, 411, of the address generator 405 which resides on the ELSCI4 card as an alternate SLC address source for the TEST-1 cards (FIG. 11A in the devices A and B).

In order to better understand the operations, it may be noted from FIG. 11C that the SLC address register 404 and the address generator 405 provide inputs to elements 410 and 411 which reside on the card ELSCI4, FIG. 11A.

The outputs of the tri-state units 410 and 411 are fed to the Test-1 cards and into a buffer 444 whereby the stored logic control addresses (SLC) are fed simultaneously to the standard reference device A and also to the module under test B.

The SLC address is used in the B 5900 in order to control the "stored logic". Basically, it is a read only memory that tells the logic in the B 5900 modules what functions to perform. However, the intelligence must first be written into the SLC registers before a functional code can be executed.

Figure 11D:
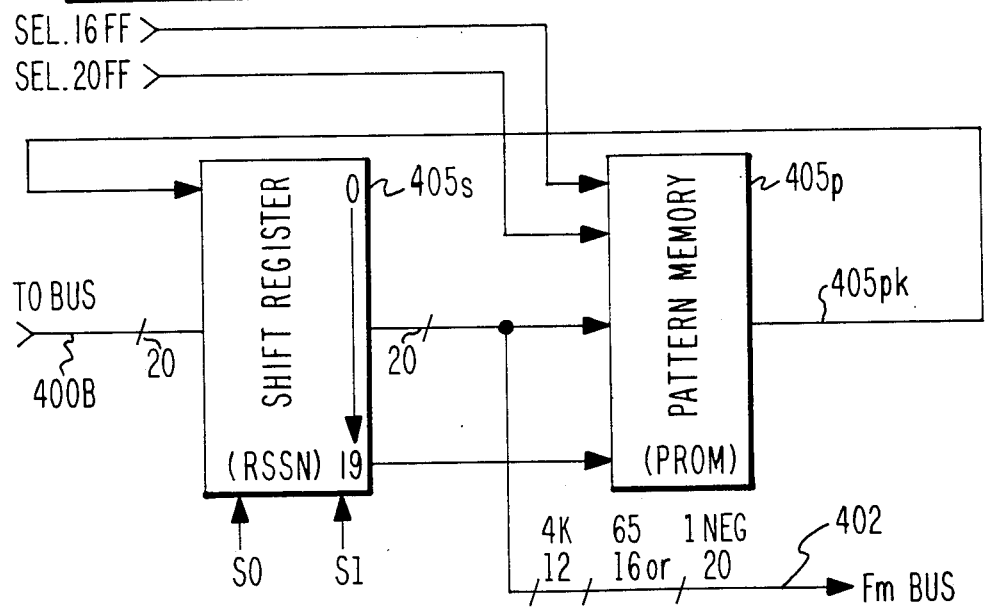

Now, referring to FIG. 11D which shows the address generator 405 on the ELSCI2 card at location TAA25 of FIG. 11A. The address generator 405 is a 20-bit shift register capable of generating a string of complex patterns that are required for main and local memory testing and for other memory devices in the B 5900. In conjunction with the utility register 406 (FIG. 11C), virtually any pattern can be generated for a particular application. In FIG. 11D the shift register 405$_s$ can be loaded from the TO bus 400B. Essentially this bus is also the Fm bus 402 of FIG. 11C. Thus, the output of any of the other registers of the buffer memory 401 or the D bus 34 can be placed into the shift register 405$_s$ of FIG. 11D.

The output of the 20-bit shift register 405$_s$ then provides the input to the pattern memory 405$_p$ and also the Fm bus 402. When the shift register 405$_s$ is in the shift mode, it moves data from the least significant bit to the most significant bit (that is from location 00 to location 19).

The pattern memory 405$_p$ has an output which is a shift data line 405$_{pk}$ which is conditioned by the data shift from the shift register 405$_s$, and from the 20-bit shift register and the two select lines, SEL 16 and SEL 20, which come from the card ELSCI4 of FIG. 11A.

In FIG. 11D which shows the address generator 405, the select line 16FF and select line 20FF come from the ELSCI-4 card shown in FIG. 11A.

In FIG. 11D there is also shown a generator function table for the pattern that is sent to the Fm bus 402.

The pattern memory 405$_p$ is a PROM that is programmed to generate a polynomial which conditions the shift register 405$_s$ to generate address patterns of 4096 (12) bits; or 65,363 (16) bits or 1,048,000 (20) bits of address patterns.

When the select line 16FF is active, the 20-bit output would have the first 12 bits active counting 4K repeatable patterns where the upper 8 bits remain static to a preset value.

For the select line 20FF to be active, the 20-bit output would have the first 16 bits active, counting 65K repeatable patterns where the upper four bits remain static to a preset value.

When the select line 16FF and the select line 20FF are both active, all 20 bits would be moving and counting 1,000,000 repeatable patterns.

With no select lines active, then whatever pattern resides in the shift register 405$_s$ could be shifted 20 positions. If more than 20 positions were shifted, the pattern would get pushed out into the "shift out line" and returned to the "shift in line", thus repeating the pattern. The address generator 405 also serves as a temporary storage register for use by a given subroutine.

In FIG. 11C the utility register 406 is a 20-bit binary count-up or count-down counter. Its primary functions are to support the address generator 405 in creating the required test patterns, and the counter mode is used for tracking nested loops in subroutines or in the register if required for temporary storage.

It may be noted that patterns can be created by either the address generator 405 or the utility register 406. The pattern complexity can be achieved by shifting and counting. Since both registers can interchange their patterns, then notification of those patterns can be made in order to create new ones.

The buffer address register 408 of FIG. 11C was described earlier as a 12-bit count-up counter used for write writing and for reading the buffer memory 401.

The program address register 407 is also a count-up counter used solely for the purpose of program fetches. The address multiplexor 412 is used for purposes of a select function from buffer address 408 or program address 407.

The buffer address is normally selected unless the processor 300 requires a programmed word, at which time the "program register load bit" in the microcode word will select the program address.

The data word for the program address has the subroutine index address 51:12 over to the microcode RAM with the P1 parameter being 39:20 and the P2 parameter being 19:20. These conditions are further described in the discussion of the code processor module 300.

In FIG. 11C the buffer address register 408 can be loaded and incremented with direct control lines from the IOMC 200 module. It is used for down-load and to initialize certain routines, but otherwise, load and increment functions are generally executed with the instruction bus (I bus) in control.

The program address register 407 can be loaded, or incremented and displayed by means of I bus 23 control.

The code processor 300 uses a separate line in order to increment the program address 407. During an indirect program word fetch at the entry vector point to a new subroutine, the code processor 300 increments the program address so that it points to the next IPW to be executed. This mechanism is known as the "get-next-operator", and this is a mechanism that is done in parallel with any particular subroutine entry procedure.

In FIG. 11C the sequence data unit 413 and the random data unit 414 are generators which have a data selector 415 which go to make up the "data pattern generator". The sequence data generator 413 is a 12-bit count-up, count-down counter. The random data generator 414 is a 12 bit shift register, similar to the address generator 405. It also has a pattern memory such as 405$_p$.

The output of the sequence data generator 413 via the data selector 415 is in the input to the random data generator 414 or to the M register 407. The output of random data generator 414 via data selector 415 is used to provide the input to sequence data generator 413 or to the M register 407. The output of the data selector 415 is 12 bits wide. When the M register data selector 415$_a$ of FIG. 11E picks the input from the data selector 415 for locations 00-11, it also inserts that data into locations 23:12, 35:12, 47:12, and data 00-03 to 51:04. The output of the M register data selectors provides 52-bits and is therefore 00-11 which is placed into 4⅓ locations in order to fill up the 52-bit field.

Figure 11E:
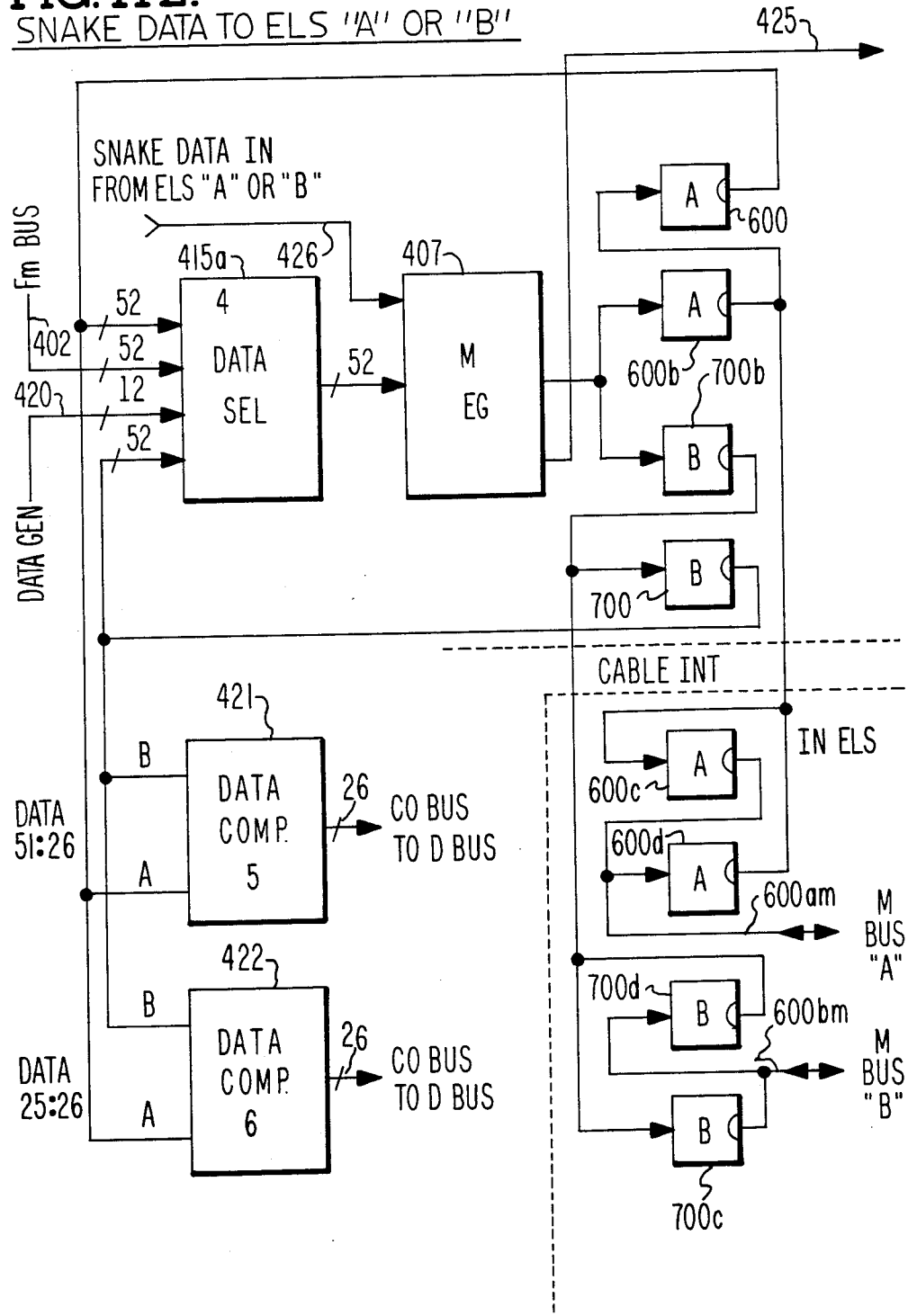

In FIG. 11E there is seen the M register data select unit 415$_a$ which receives the Fm bus 402 and also the M bus data from the device A via the M bus interface card plus receiving M bus data from the device B and also data from the data generator on line 420.

The 52-bit selected output from the data selector 415$_a$ is routed to the input of the M register 407. The M register is the primary interface between the programmatic tester and the unit to be tested, in this case the B 5900. Data is written into the B 5900 via the M register 407 in order to satisfy all operations that are required for execution. The M register can also be read from either the system device A or the system device B via the M register data selector 415$_a$. Thus, for any analytical purpose, any system data can be retrieved for analysis.

The M register 407 (FIG. 11E) is the source register for shift register write operations in the B 5900 units (snakes). It also receives the selected snake signals from the B 5900.

Any value in the M register 407 can be rotated in order to position data where it is required for execution. A 52-bit rotation would reposition data to its original starting position since the M register 407 is 52-bits wide. In FIG. 11E there is seen the M bus control and also the M bus compare logic data path.

For example, in FIG. 11E the data comparators 421 and 422 will provide compare output data to the D bus 34 by means of the comparator output bus (CO bus). Then in FIG. 11E there is seen the unit 600$_c$ and 600$_d$ for control signals on the M bus to the device "A" and there is the unit 700$_c$ and 700$_d$ for output of control signals on the M bus to the device "B".

In FIG. 11E the M register 407 output is 52-bits wide and goes to the tri-state units 600$_b$ and 700$_b$ when used in writing data to the B 5900 unit. The output of 600$_b$ and 700$_b$ pass via cables to the input of 600$_c$ and 700$_c$ on the M bus interface cards of which there is one in each of the B 5900s used for device A and for device B. The output of the tri-state control units 600$_c$ and 700$_c$ goes to form the M bus designated 600$_{am}$ and 600$_{bm}$.

In order to read out the M bus to the M register 407 and to compare it, the data from buses 600$_{am}$ and 600$_{bm}$ is routed through the tri-state units 600$_d$ and 700$_d$ on the M bus interface card via cables to the units 600 and 700, where it provides an input for selection in the M register data selector 415$_a$ and also provides the input to the data comparator cards 5 and 6 (FIG. 11A) which are located in the comparator module 500.

The compare card 5, shown as 421 in FIG. 11E, will accept M bus data from both B 5900 units (via 51:26) to be compared, i.e., units "A" and "B".

The compare card 6 is designated as 422 in FIG. 11E and it accepts the data bits designated as 25:26. This is further described in connection with the description of the comparator module 500.

The data path from the M register 407 to the data bus 34 is routed through element 600$_b$ and 700$_b$ through the units 600 and 700. The compare cards 5 and 6 will then route the M bus data to the D bus 34 via the comparator output bus, CO bus. The selection of one compare card at a time can be made in order to transfer 26 bits at a time.

Figure 11F:
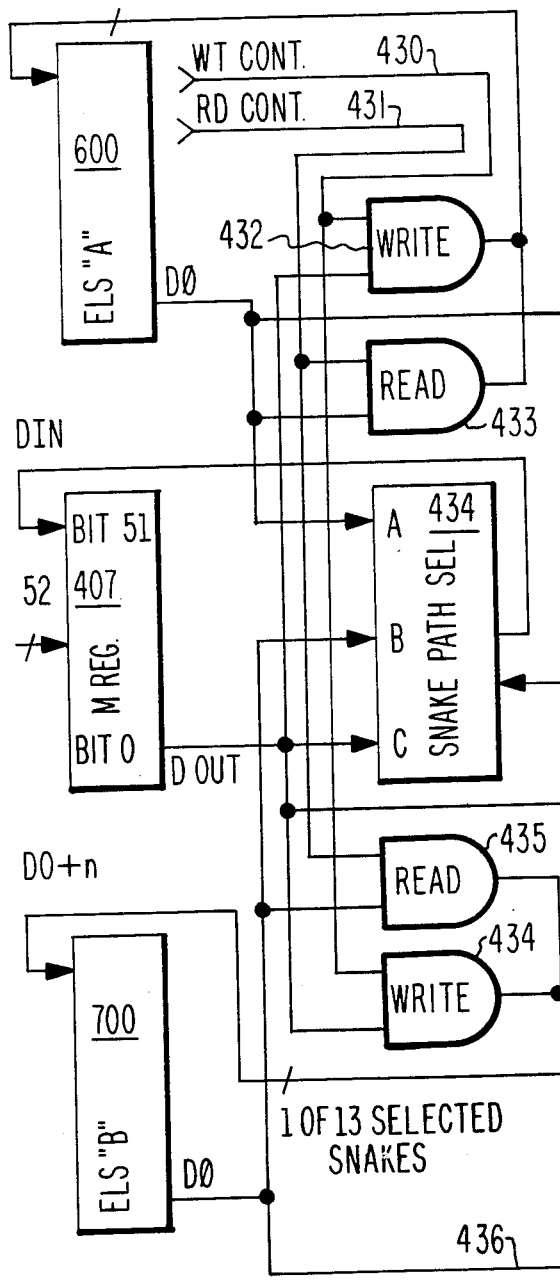

In reference to FIG. 11F, consideration is now taken of the item called the "snake data path". The word "snake" implies a serial shift chain. The maintenance tool that is used by the B 5900 in order to test its hardware is to shift data into flip-flops and registers in a bit-serial fashion.

During normal operation, the parallel form of input-output is used. In the maintenance mode, data is moved to the "shift-in" lines over to the register 407 (M register 407). Once the B 5900 has all the test data shifted in, the machine is allowed to run for "n" clocks. The result is then checked by shifting the data out of the registers through the "shift-out" line. In other words, it is read out from the shift register 405.

During a shift chain (snake) read operation the serial data goes to three places: (1) back to the shift-in line of the shift register 405, because if data is read from a shift register, it will store whatever it sees on the "shift-in" line. Thus, the circuit is made to restore the contents that where read out; (2) the "shift-in" line in the M register 407 where data can be stored in the M register for use as required; (3) to the comparator module 500.

The bit serial line from each B 5900 unit A and unit B is sent back to the ELSCI4 card (FIG. 11A) where it is routed to a compare card 7 for validation.

The following discussion will involve FIG. 11F which involves the use of the serial shift chain known as the "snake" and also the snake data paths.

As seen in FIG. 11F there is a drawing of one typical snake data path (of which there are 13) used in the programmatic tester system. The following discussion will indicate how a 20-bit "snake" is written into and then read out from the module where it resides in the B 5900. The module where this data resides is known as the IT/1 module.

The control data for the IT/1 module is loaded from the buffer memory 401 of FIG. 11C and via the Fm bus 402 over to the M register 407. Since the IT/1 unit has a 20-bit register, then data in the M register 407 is made to reside in locations 00-19.

The subroutine that writes the serial shift chain snake sets up a length of 20 and selects the IT/1 unit snake on the TEST-1 card. The subroutine puts the M register 407 into the shift mode and pushes data through the DOUT line over to the gate 432 of FIG. 11F, and onto the TEST-1 card 600 in the B 5900 module A, while the gate 434 on the TEST-1 card places the data over to the B 5900 unit module B, at element 700.

In FIG. 11F the write control line (WT CONT) 430 is enabled by the subroutine allowing the data to enter the IT/1 cards "shift-in" line via the D$\phi$+n line in the B 5900 elements 600 and 700. After 20 clocks, the write snake operation is completed, wherein data from the M register 407 has been transferred to both unit A and unit B of the B 5900 into their IT/1 card units.

In order to protect against erroneous compare errors during the write of a shift (snake) operation, the D$\phi$ lines that feed gate 437 are set to zero for the snake write time plus one additional clock.

For the read operation of the IT/1 card units in both the module A and module B of the B 5900 units, the subroutine that executes the task selects the data out line (DO) of the IT/1 card units, and selects a length of 20, and enables the RDCONT (read control) line 431 to enable the read gates 435 and 433 respectively and thus select in the snake path selection unit 434, the DO (data out) line from the module A or the module B to the data in (DIN) line in the M register 407.

It should be mentioned that there is a "switch register" in the IOMC 200 module which is pre-set to select data either from the module unit A or module unit B, in this embodiment each of which are B 5900 computer units.

The subroutine reads a string of 20 data bits which get routed through the "read" gates 433 and 435 back to the "shift-in" line on the IT/1 cards for restoration of the data. The 00 outputs also get routed to the compare card 7 (TAA18) via the card ELSCI4 of FIG. 11A.

The gate 437 of FIG. 11F is located in the comparator module 500 and is the typical exclusive OR gate to which signal lines from the module unit A and the module unit B are inputted for comparison purposes, whereby the line 438 output is presented to the error detection logic which is described in connection with the comparator module 500.

In FIG. 11F the selected data output D$\phi$ in the unit 434 is shifted into the M register 407 as the data bits 51:20.

In FIG. 11F the snake path selection unit 434 has one other function. The data out line DOUT of the M register 407 (which also goes to input C of 434) can be "rotated" back into the M register 407 by means of the data in line DIN, therefore giving it the ability to move data from any location in the register to any other location.

Referring to FIG. 11G there is given an illustration of the memory cycle for latching data from a B 5900 unit for use of the programmatic comparator tester system.

The programmatic tester system has the ability to capture any B 5900 memory cycle for any given address, for the purpose of logically analyzing that particular data word. The control for this mechanism is found on the card ELSCI4 of FIG. 11A.

In FIG. 11G the top line depicts the system clock for the programmatic tester and for the B 5900 modules under test. In the second line, the valid M bus data signal is the information from memory to a designated module in the B 5900.

The third line of FIG. 11G is the M hold which is the strobe that captures the data in the B 5900.

In the programmatic tester, in order to get information regarding a given cycle, it is only necessary to set a flip-flop called match memory cycle flip-flop. That particular flip-flop will look at the M hold signal which is used to arm or set the M register 407. At the clock time T1 shown in FIG. 11G, the M register 407 will take on a load of data from the selected system by means of the contents of the M bus. Following the time T1, the data is valid in the M register at which time the code processor module 300 is conformed by an information signal.

Figure 11H:
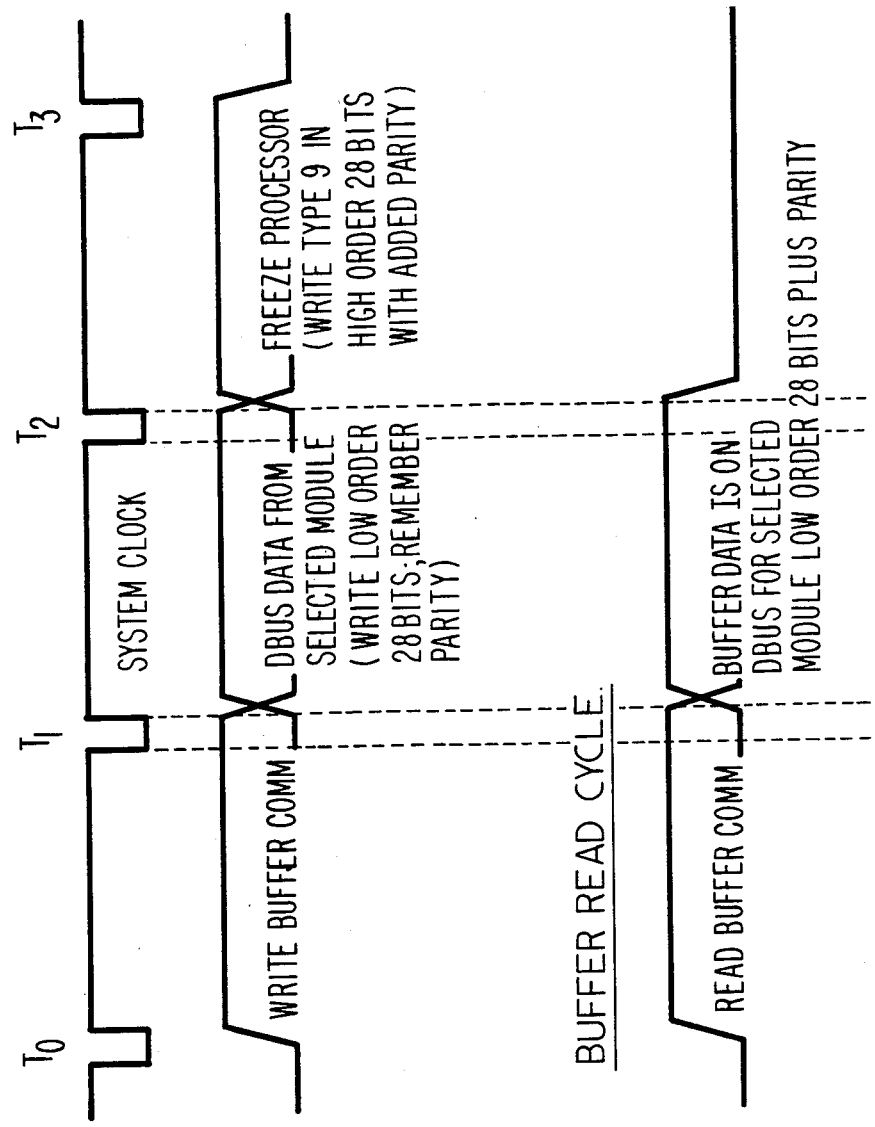
Figure 12A:
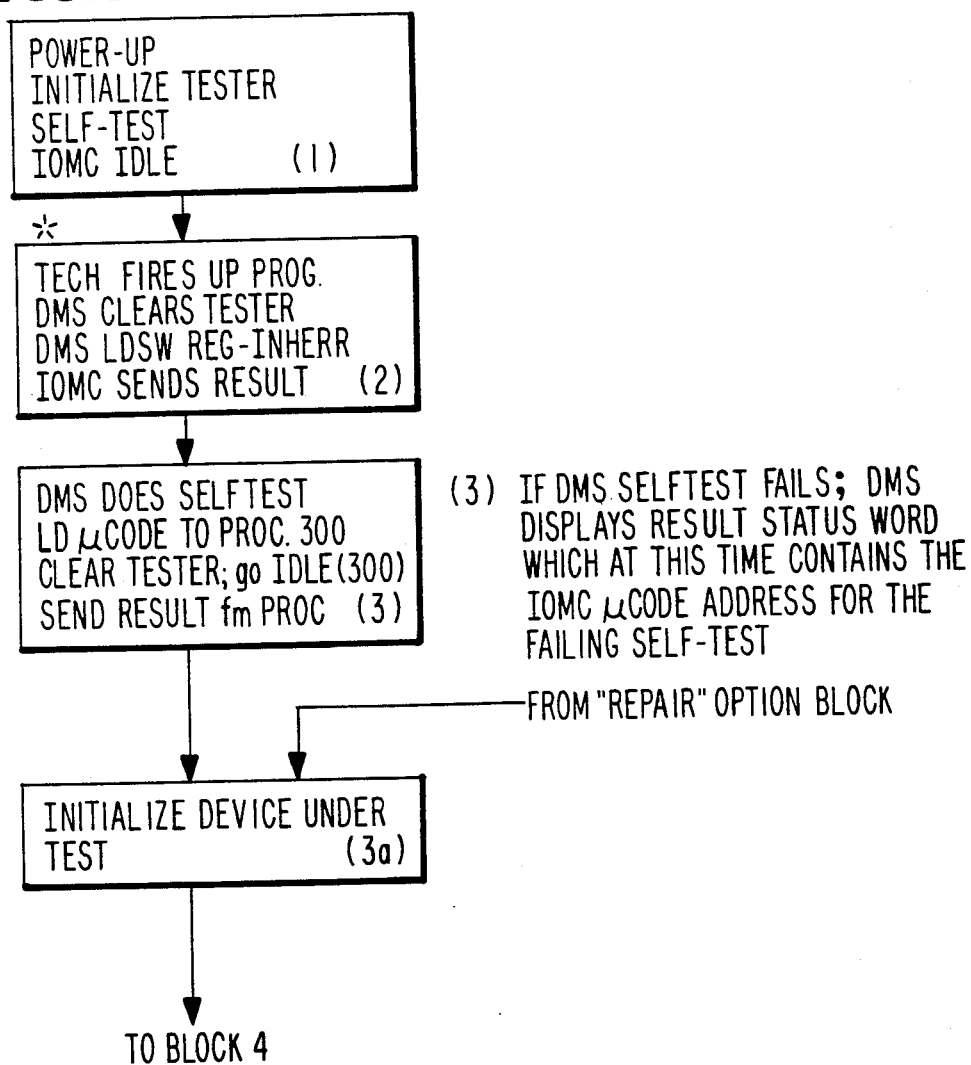
Figure 12B:
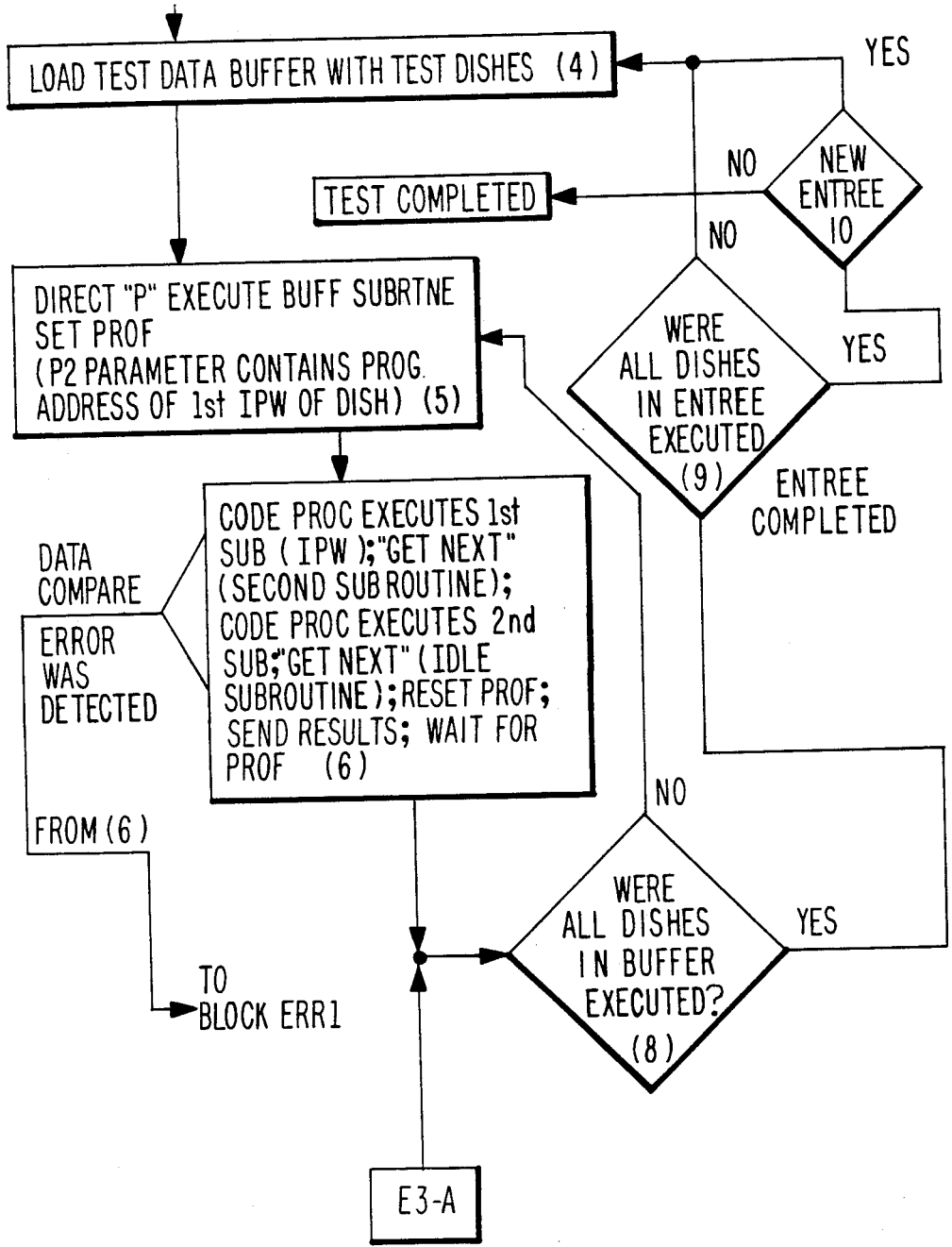
Figure 12D:
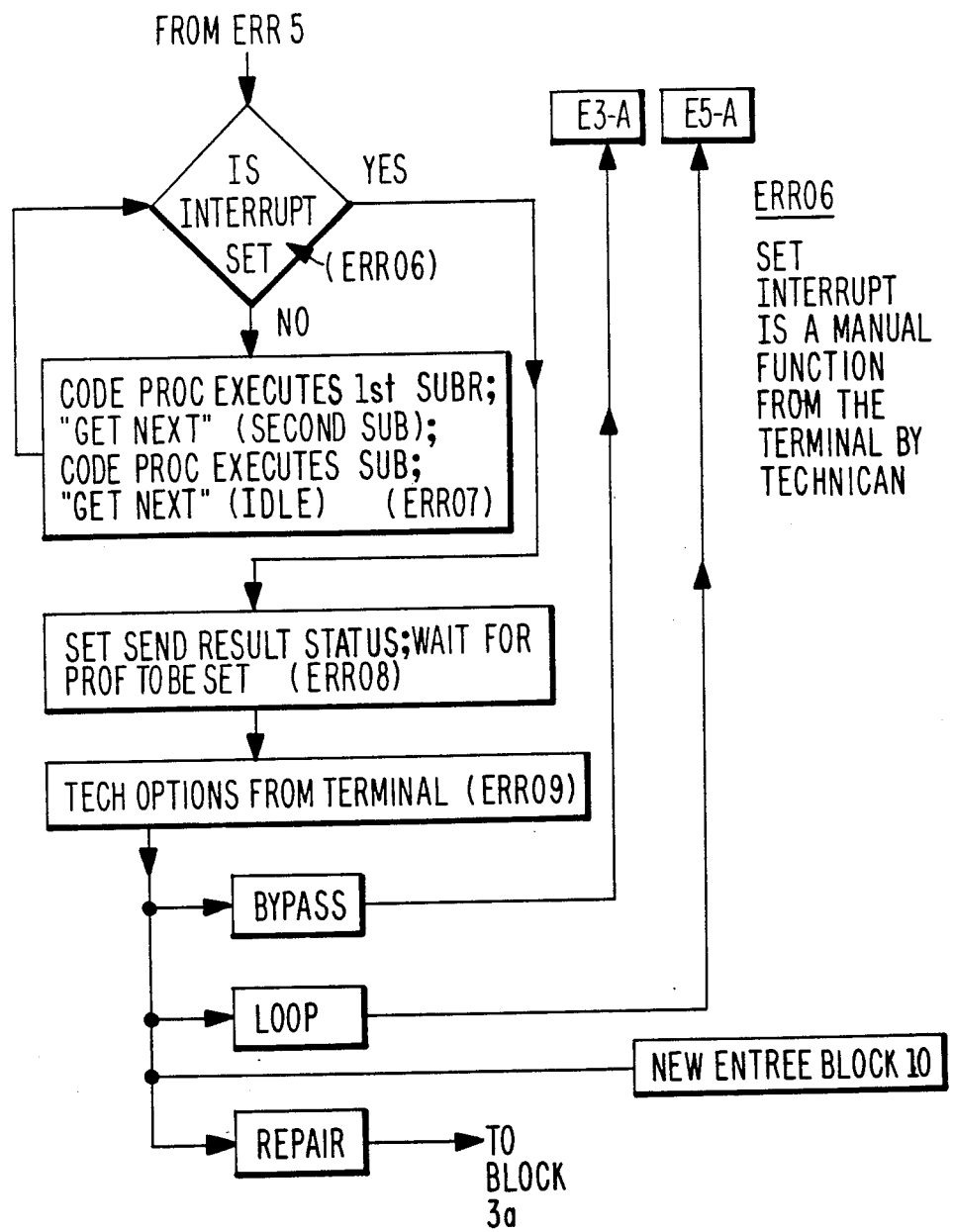

In FIG. 11H, there is depicted a buffer write cycle and a buffer read cycle.

The buffer memory 401 of FIG. 11C can be written by the I/0 maintenance controller 200 module or by the code processor module 300. In FIG. 11H there is shown a code processor module 300 on a write and a read. The memory buffer is 56-bits wide. When the subroutine writes into the buffer, it only utilizes the low order 28 bits which is the width of the D bus 34. Even though the upper 28 bits are not used, they must also be written in order to make it a valid 56-bit data word plus parity into the buffer.

During any buffer read, the IOMC 200 module checks the word type in order to ensure it was a IPW (indirect program word) word.

In FIG. 11H the times are shown as $T_0$, $T_1$, $T_2$, and $T_3$. During time $T_0$ and $T_1$ the write buffer command is initiated. In the next clock period from $T_1$ to $T_2$, a module in the tester is selected to place its data on the D bus 34 to be written into the buffer memory 401. Also during this time the parity is noted. From the period $T_2$ to $T_3$, the card ELSCI-4 (which controls the buffer memory operation) turns the clock off to the code processor module 300 so it cannot continue. During the time that the code processor is "frozen", the controller interface module 400 writes a "9" in the bits 55:4 and 51:22 with "zeros", and generates odd parity for the 56-bit word. After the time period $T_3$ then the code processor 300 is again allowed to proceed into operation.

The buffer read command as shown in FIG. 11H is generated by the code processor module 300. During the time $T_0$ to $T_1$, the read command is issued; on the following clock $T_1$ to $T_2$, the low order 28 bits are transferred from the buffer via the D bus 34 to a selected module within the programmatic tester. The upper 28 bits are not used.

With reference to 11I there is seen a timing diagram which is used for mask control, whereby certain selected data signals can be blanked out or wiped out so that no comparison is made during the course of a test program.

Further, due to an extraordinary amount of "hash" and unwanted pips on the buses in the B 5900 unit, it was deemed necessary to build a mask controller so that buses could still be compared without getting erroneous data and false errors due to pickup of hash. Thus, on the card designated as ELSCI-4 (FIG. 11A) there is provided a mask controller which controls the automatic clearing functions for all of the 13 compare cards shown in FIG. 4. The mask controller uses the term CRDOVER/.

Further, a data inhibit function is generated for the compare cards 5 and 6 with a bus designated MSKBUS/.

Referring to FIG. 11I there is seen below the clock signals a series of lines numbered 1 through 7 with certain designated letters to indicate certain areas and functions.

The M bus mask period designated A is a function of line 1 between the time periods $T_0$ and $T_1$ which depicts a typical M bus compare cycle.

The period marked "A" is a normal mask period, in which data is disabled as far as the compare cards 5 and 6 are concerned. This mask period A is settable from 0 to 80 nanoseconds. The particular programmatic comparator tester system described herein permits the setting to be set to 0 nanoseconds so that then there is no automatic masking; however, when this setting is increased to a definite period, then there will be masking or signal disabling.

In line 1 the character B is the period in which the comparator circuits are checking for errors. Then further, the time period C shows a mask period which is issued by a command that controls the MASK BUS/.

In lines 2 and 3 of FIG. 11I there is seen a 1-word SLC write cycle. Thus, one word has been written into the SLC memory "x" of the B 5900 during the time between $T_0$ and $T_1$. For the next two clock periods there is an uninitialized state from the SLC memory "x" which is still seen by the comparator circuits. Line 3 of FIG. 11I shows the comparator circuits latch clear line (CARDOVER/) which services all 13 of the compare cards of FIG. 4. This latch clear line is active from the period $T_0$ (the beginning of any SLC write) and terminating two clocks after the completion of the SLC write.

In FIG. 11I the lines 4, 5 and 6 show an M bus write to the B 5900 from the programmatic tester. Prior to the time $T_0$, the programmatic tester was comparing the M bus. All of the writes to the B 5900 over the M bus require a minimum of two clocks.

During the first clock, a tri-state turnaround is masked by the signal CARDOVER/ of line 3.

From the period $T_1$ to $T_3$ the comparator is enabled after the automatic mask period between time $T_1$ and $T_2$.

Line 6 of FIG. 11I shows an additional mask period at the end of the B 5900 "write" with the MSKBUS/. For any write period over to the B 5900 M bus, then, on the first clock all compare matches are held to be reset; at the end of the write period then, for one more clock, the MASKBUS/ then disables the data to the M bus comparator circuitry.

In FIG. 11I the line 7 depicts the normal M bus compare modes for the time period $T_0$ to $T_2$.

When the command "select M register for display" is issued, then the automatic masking is disabled until another command is issued which is "reset M register for display". It may be noted that the display M register command allows the M register data to be passed to the D bus 34 via the compare cards 5 and 6 and via the comparator out bus, CO bus.

Thus, in summary it may be stated that there are certain basic functions that are performed by the card ELSCI-4 which constitutes the controller interface module 400 of the programmatic comparator tester system. These basic functions are as follows:

(a) Sorting the SLC address register or the address generator for maintenance and for SLC addresses. It routes the SLC address to the TEST-1 cards;

(b) Providing a data comparator interface for signals from the TEST-1 cards over to the compare card 7;

(c) Providing a monitor for the power on/off for the B 5900 units and routing to the IOMC module 200;

(d) Functioning as a hardware error collector for the M bus interface, for the TEST-1 interface, for the ELSCI-I bus parity error, for the PROM logic parity error signal which errors are routed to the I0MC 200 module.

(e) Performing all the control logic for the buffer memory, for the registers, for the counters and the tri-state controls in the control interface module 400;

(f) Providing an interface for the instruction bus (I bus) and also miscellaneous commands to the TEST-1 cards.

CLOCK CARD

Referring to FIG. 10A there is seen the clock card 150 which is used in the base module which holds a variety of slide-in cards. The clock card 150 is such a slide-in card.

In an environment where circuitry is used in order to "skew-compare" pairs of analogous digital signals, it is essential that the clock systems in the test environment should be in synchronization. It is not only highly desirable but necessary to operate the programmatic tester system at the same clock frequency as the unit modules which are being held under test against the standard reference module.

Thus, it is important to have a common clock source in the "programmatic test system" for the purpose of keeping signals in synchronization.

Thus, the card 150 is the common control for the clock system in the programmatic tester and for the devices under test.

The basic functions of the programmatic tester clock card 150 may be described as follows:

(a) To generate the common master clock signals to both the "device under test" and to the programmatic testing system which includes the standard reference module;

(b) To generate a common clock control and provide for synchronization of the "device under test" and the testing system;

(c) To distribute clock signals and a strobe signal to the modules in the programmatic tester system.

Referring to the drawing FIG. 10A there is seen the basic clock diagram for the programmatic comparison tester clock. The tester clock card 150 has two oscillators (155a, 155b) that are selectable with a switch known as the HI/LO frequency switch in the input-output maintenance controller processor module 200. One of the oscillators is set to the nominal operating frequency of the module under test, unit 6B; the other oscillator is set "n" percent above the nominal frequency as specified for the purpose of frequency marginal testing. The HI/LO frequency line comes into the SYNC-up 152 logic. One of the outputs from this logic 152 is the select line, used to choose the oscillator A or the oscillator B as the master clock.

The arrangement of the clock both in the programmatic comparator tester and in the device under test, device 6B, may be summarized as follows:

Firstly, the programmatic comparator test system is made to have "major clock signals" and also "minor clock signals". The major clock signals are 200 nanoseconds apart which provide a 5 megahertz frequency output. The minor clocks are set to be 50 nanoseconds apart to provide a 20 megahertz frequency output signal. The relationship between the major clocks and any minor clock must also be the same in the programmatic comparator test system. Since this relationship could easily be disrupted when frequencies are changed or the machines are powered up from a power-down condition, then special precautions must be taken to get the systems back into synchronization.

The sync-up control 152 consists of certain hardware elements. These are:

(a) A leading edge and falling edge detector which looks at the "frequency HI/LO CONT" line (which is the select line for oscillator A or oscillator B).

(b) A falling edge detector for the "general clear/" line;

(c) A clock control output timer which generates a sequence of events to put the programmatic comparator test system's clock in phase.

The oscillator switch timing diagram in FIG. 10B shows the action when the oscillator A is switched over to oscillator B and vice versa.

At a given time "n", the select line is switched to choose oscillator B. At this point the interconnect wires, the system control and the signal SCM 2 MAN (FIG. 10B) from the tester clock card over to the two device clock cards are switched at time T1 in order to put the programmatic comparator test system into a "single pulse mode".

At the time T2, the Clock Counter Clear signal (FIG. 10B) is issued to the three clock cards (the tester clock card and the two device clock cards). It should here be noted that the clear counter line (clear sync line) holds the phase control unit 156 (FIG. 10A) in the cleared condition. At time T3, the switching between oscillators is performed, at which time the programmatic comparator test system has no clocks and cannot move.

At time T4, the Sync Clear change starts the clock phase in the programmatic comparator test system at the same time. Also, at time T4, the system control and the SCM 2 MAN signals (single clock manual) are returned to normal, at which time the new crystal frequency is selected and in phase with the programmatic comparator test system.

The mechanism for the "general clear" (FIG. 10C) is very similar to the frequency switch over. The general clear is used after a "power-up" of a device or the programmatic tester system. General clear is also logically selected for the clearing state in the programmatic comparator test system; however, the "general clear switch timing" mechanism is always invoked.

The phase control unit 156 (FIG. 10A) accepts a master clock frequency up to 21 megahertz. The unit 156 generates control outputs of major and minor clocks. The "device under test" module device 6B has a similar phase control unit.

The display mode line is used when selecting the "maintenance mode" in the programmatic comparator test system. When the display mode is active, unit 156 converts all minor clocks into major clocks, and similarly this happens in the device under test module unit 6B.

When the "single pulse" mode is selected, the phase control unit "remembers" on which minor clock or major clock the system was in when it was switched. When the running is re-selected, the clocks will commence where they were before going into the single pulse mode.

The major clocks are separated into two groups, one group is free running controlled only with SP/PT (single pulse/program timer), while the other is additionally controlled with the "freeze" line 151, FIG. 10A. The "freeze" line clock outputs are used in the programmatic tester to capture the state of the counters at the time that an error was detected.

The 20 megahertz output clock is only used on the clock card in the Sync-up control unit 152.

The major clock strobe 157 (FIG. 10A) occurs in the center of a major clock period for 50% of a major clock period.

The output of the strobe is used in the IOMC module 200, in the data comparator module 500, in the controller interface module 400 and in the global memory adapter unit when this unit is used.

The unit 153 designated as single clock/run control provides the system operator with the ability to select "single pulse", or "pulse train" mode (as the result of emitting four minor and one major clock), or dynamic single pulse mode (used instead of pushing the button in order to emit a single pulse or pulse train) wherein the code processor 300 can emit "n" number of pulses as specified by the microcode in a given subroutine or the Run mode.

These heretofore described functions control the entire programmatic comparator test system. These signal functions are connected with ribbon cables 154 from the tester clock card over to the device-under-test 6B and reference unit 6A.

Figure 10D:
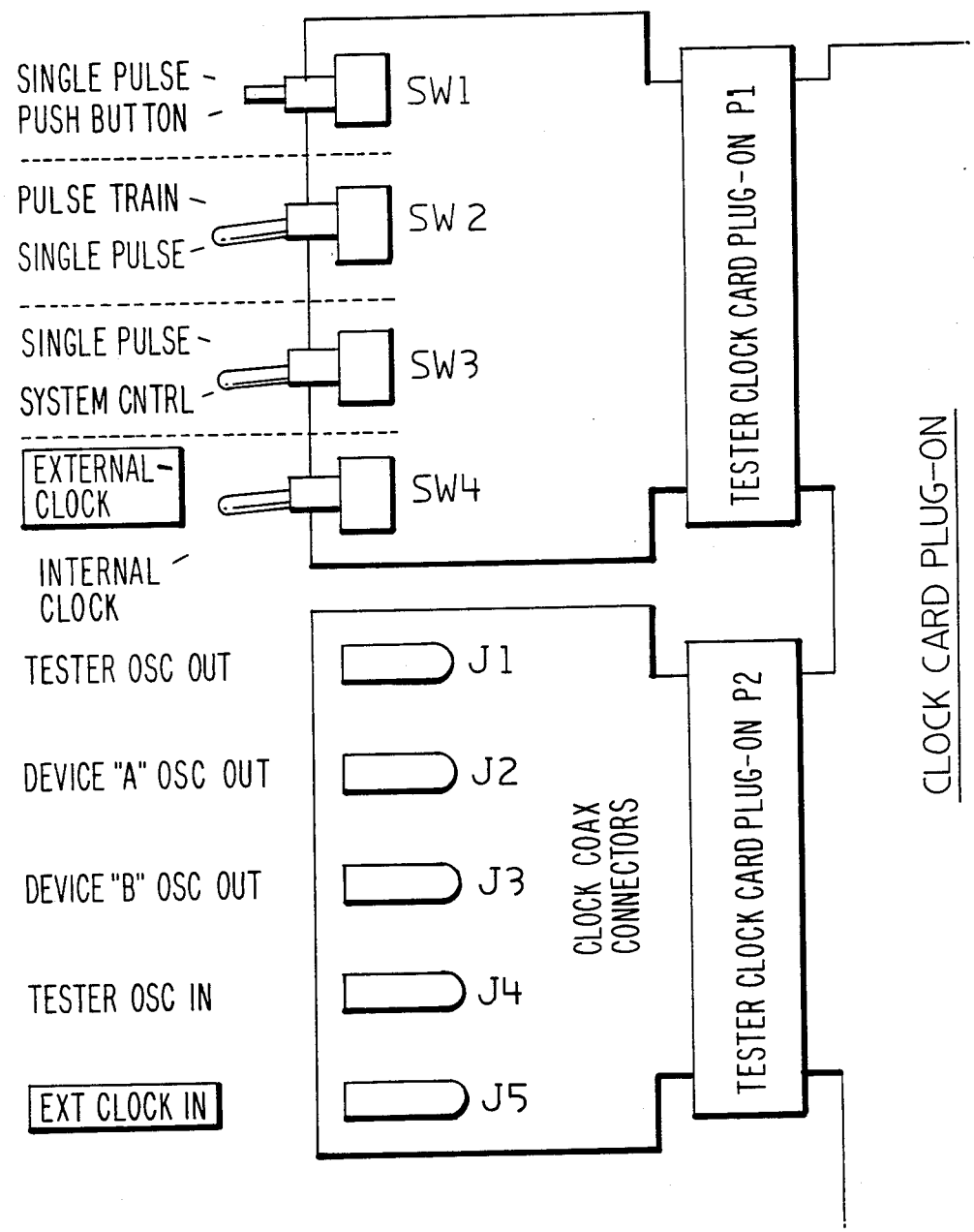
FIG. 10D shows two plug-on units which provide manual controls and coaxial connectors for the programmatic comparator testing system.

The tester clock card has four connectors (foreplane) which have plug-ons connected to them as in FIG. 10D. The very top foreplane connector is designated as P1. The second one down is designated as P2 and so on.

The connector P1 mates with a plug-on P1, manual controls of FIG. 10D. P1 controls the clock in the programmatic tester and also the clock in the standard reference device unit 6A and the unit-to-be-tested 6B. "Device clock cards" receive this control via the ribbon cables on the device clock control 154 shown in FIG. 10A.

If the switch SW 3 of FIG. 10D is set to "single pulse", then the single pulse would be invoked not only in the tester but also both in the standard reference device 6A and the unit under test 6B.

In order to "single pulse" or to "pulse train" the programmatic comparator test system, the switch SW 3 is set to "single pulse"; then the switch SW 2 is set to select either PT (pulse train) or to select SP (single pulse).

The switch SW 1 (FIG. 10D) is a spring-loaded "button" that can be pushed to advance pulsing one step at a time. The switch SW 4 selects either the internal oscillator or an external clock source.

If an external clock source is selected, the input to the tester clock card is from an oscillator distribution plug-on.

The master clock outputs for the device 6A and device 6B are lines 158a and 158b respectively. This is the output 158 shown on the basic block FIG. 10A.

The programmatic tester system also requires coaxial cables to be of the same length as when data is carried from the reference device module 6A to the module 500 and the device module 6B to the data comparator module 500. This makes the clock "skew" in each cable the same for each of the two items being compared in the programmatic comparator test system.

FIGS. 12A through 12D provide a flow chart which illustrates the operating sequences involved in operations of the programmable comparator test system.

There has herein been described a system for testing electronic digital modules and permitting diagnosis and fault isolation to be accomplished. While one embodiment of the system has been described, it should be understood that other variations may be built which still are encompassed by the following claims.

What is claimed is:

1. Testing and diagnosing apparatus for a digital unit comprising:
   (a) a standard unit to which it is desired that said digital unit conform, and including:
      (a1) pairs of output lines, each pair consisting of one output from said standard unit and one analogous output from said digital unit;
   (b) a host computer having generating means for generating a testing signal comprised of a plurality of sequentially occurring different digital signal patterns and for concurrently applying said testing signal to said digital unit and to said standard unit;
   (c) analyzing means for continuously comparing the outputs of said digital unit and said standard unit and for producing a failure signal in response to the determination that a predetermined comparison failure has occurred between said outputs; and wherein said analyzing means includes;
      (c1) a skew analyzer to which the said output pairs of said digital unit and said standard unit are continuously applied, said skew analyzer being operative to produce said failure signal in response to the particular output pairs of said digital and standard units being out of skew for a time greater than a predetermined minimum time period, said skew analyzer including:
         (c1a) a plurality of skew comparison circuits providing a discrete skew comparison circuit for each pair of said output lines;
   (d) self-test generating means, initiated by a maintenance processor means, for generating pairs of digital output signls in two test modes for transmittal, via a select multiplexor means, to said analyzing means, said self-test generating means including:
      (d1) first means to generate a pair of digital first self-test output signals having a skew less than said predetermined minimum time period;
      (d2) second means to generate a pair of digital second self-test output signals having a skew greater than said predetermined minimum time period;
   (e) select multiplexor means for receiving said pairs of output lines of said digital unit and said standard unit, and for receiving said first and second self-test output signals, said select multiplexor means being controlled by said maintenance processor means to select said pairs of output lines of said digital and standard units, or said first and second self-test output signals for transmittal to said analyzing means;
   (f) said maintenance processor means for controlling said select multiplexor means and said self-test generating means, and including:
      (f1) means to receive said failure signal from said analyzing means, and to identify the particular comparison circuit of said skew analyzer which caused said failure signal.

2. In a programmable digital testing system wherein pairs of analogous digital signals from a first standard reference digital unit and from a second digital unit-being-tested are tested for coincidence or non-coincidence of transition times (skew), each said first and second digital units having analogous test points connected to provide a plurality of analogous signal pairs, each said pair being connected to a discrete skew comparison circuit, the combination comprising:
   (a) host computer means for generating signals to synchronously exercise said first and second digital units which generate digital output signals in said analogous signal pairs, said host computer means including:
      (a1) means to receive error signals from a maintenance processor means;
      (a2) means to display said error signals to identify the particular analogous signal pair which tested in error;
      (a3) means to display and identify which ones of a plurality of skew comparison circuits did not properly operate with self-test signals;
   (b) said plurality of "n" skew comparison circuits, each connected to receive the said digital output signals of a said analogous pair, wherein "n" represents the number of pairs of said analogous signals from said first and second digital units, each said skew comparison circuit including:
- (b1) logic means to generate an error signal to a maintenance processor when the outputs of said analogous signal pair are out of skew for time greater than a predetermined minimum time period;
- (c) select multiplexor means for receiving said pairs of analogous digital signals from said first and said second digital units and for receiving analogous pairs of self-test digital signals from a self-test generation circuit means, said select multiplexor means operating under control of said maintenance processor means to select either said analogous pairs of signals or said analogous pairs of self-test signals for transmission to said plurality of skew comparison circuits;
- (d) said self-test circuit generation means, initiated by said maintenance processor means, and functioning to generate said analogous pairs of self-test signals for checking each of said plurality of skew comparison circuits;
- (e) said first standard digital unit and said second digital unit-being-tested being connected to receive said exercise signals from said host computer means and to transmit said analogous pairs of digital signals to said select multiplexor means;
- (f) said maintenance processor means, initiated by said host computer means, for controlling said self-test circuit generation means and said select multiplexor means, and including:
  - (f1) means to receive an error signal from any one of said skew comparison circuits for transmittal to said host computer means.

3. The combination of claim 2, wherein said self-test generation means includes:
- (a) pass-delay circuit means for generating a pair of digital-pass signals for input to said select multiplexor means, said digital-pass signals having a skew less than said predetermined minimum time period;
- (b) fail-delay circuit means for generating a pair of digital-fail signals for input to said select multiplexor means, said digital-fail signals having a skew greater than said predetermined minimum time period.

* * * * *